United States Patent
Nakamura et al.

(10) Patent No.: US 12,089,451 B2
(45) Date of Patent: Sep. 10, 2024

(54) FUNCTIONAL PANEL, DISPLAY DEVICE, INPUT/OUTPUT DEVICE, AND DATA PROCESSING DEVICE

(71) Applicant: SEMICONDUCTOR ENERGY LABORATORY CO., LTD., Atsugi (JP)

(72) Inventors: Daiki Nakamura, Kanagawa (JP); Fumiyasu Seino, Kanagawa (JP); Tomoya Aoyama, Kanagawa (JP); Takahiro Ishisone, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 17/788,438

(22) PCT Filed: Dec. 18, 2020

(86) PCT No.: PCT/IB2020/062154
§ 371 (c)(1),
(2) Date: Jun. 23, 2022

(87) PCT Pub. No.: WO2021/130629
PCT Pub. Date: Jul. 1, 2021

(65) Prior Publication Data
US 2023/0088427 A1    Mar. 23, 2023

(30) Foreign Application Priority Data

Dec. 25, 2019  (JP) .................. 2019-234155
Mar. 27, 2020  (JP) .................. 2020-057252
Oct. 9, 2020   (JP) .................. 2020-170999

(51) Int. Cl.
G09G 5/00      (2006.01)
G06F 3/041     (2006.01)
(Continued)

(52) U.S. Cl.
CPC ......... *H10K 59/122* (2023.02); *G06F 3/0416* (2013.01); *G09G 3/3225* (2013.01);
(Continued)

(58) Field of Classification Search
CPC .... H10K 59/122; H10K 59/30; H10K 50/852; G06F 3/0416; G09G 3/3225;
(Continued)

(56) References Cited

U.S. PATENT DOCUMENTS 8,981,352 B2   3/2015  Yamada et al.
9,209,355 B2   12/2015 Senda et al.
(Continued)

FOREIGN PATENT DOCUMENTS

JP   2010-056015 A   3/2010
JP   2012-216338 A   11/2012
(Continued)

OTHER PUBLICATIONS

International Search Report (Application No. PCT/IB2020/062154) Dated Feb. 9, 2021.
(Continued)

*Primary Examiner* — Jennifer T Nguyen
(74) *Attorney, Agent, or Firm* — Fish & Richardson P.C.

(57) ABSTRACT

A novel functional panel that is highly convenient, useful, or reliable is provided. The functional panel includes a first element, a first reflective film, and an insulating film. The first element includes a first electrode, a second electrode, and a layer containing a light-emitting material; the layer containing a light-emitting material includes a region interposed between the first electrode and the second electrode; the first electrode has a light-transmitting property; and the first electrode has a first thickness. The first electrode is interposed between a region of the first reflective film and the layer containing a light-emitting material, and the first
(Continued)

reflective film has a second thickness. The insulating film includes a first opening portion, and the first opening portion overlaps with the first electrode. The insulating film has a first step-like cross-sectional shape, and the first step-like cross-sectional shape surrounds the first opening portion. The first step-like cross-sectional shape includes a first step, and the first step is larger than or equal to a thickness obtained by adding the second thickness to the first thickness.

18 Claims, 36 Drawing Sheets

(51) Int. Cl.
    *G09G 3/3225*     (2016.01)
    *H10K 59/122*     (2023.01)
    *H01L 23/00*     (2006.01)
    *H10K 50/852*     (2023.01)
    *H10K 59/30*     (2023.01)

(52) U.S. Cl.
    CPC ............ *G09G 2300/0814* (2013.01); *G09G 2300/0852* (2013.01); *G09G 2320/0209* (2013.01); *H01L 24/32* (2013.01); *H01L 2224/32225* (2013.01); *H10K 50/852* (2023.02); *H10K 59/30* (2023.02)

(58) Field of Classification Search
    CPC ... G09G 2300/0814; G09G 2300/0852; G09G 2320/0209; H01L 24/32; H01L 2224/32225
    USPC ........................................................ 345/173
    See application file for complete search history.

(56) References Cited

U.S. PATENT DOCUMENTS

| | | | |
|---|---|---|---|
| 10,304,914 | B2 | 5/2019 | Gunji |
| 10,586,838 | B2 | 3/2020 | Gunji |
| 10,636,851 | B2 | 4/2020 | Ukigaya |
| 11,127,908 | B2 | 9/2021 | Gunji |
| 11,387,299 | B2 | 7/2022 | Ukigaya |
| 2006/0214152 | A1* | 9/2006 | Seo .................. H01L 33/62 257/13 |
| 2011/0109532 | A1* | 5/2011 | Choi ................ H01L 27/1259 438/34 |
| 2012/0248475 | A1 | 10/2012 | Yamada et al. |
| 2014/0175469 | A1* | 6/2014 | Dozen ................ H10K 59/122 257/89 |
| 2014/0252383 | A1* | 9/2014 | Senda ................ H01L 33/08 257/88 |
| 2018/0012944 | A1 | 1/2018 | Gunji |
| 2019/0221779 | A1* | 7/2019 | Jang .................. H10K 59/38 |
| 2020/0219951 | A1* | 7/2020 | Ukigaya ............. H10K 50/15 |
| 2021/0217830 | A1* | 7/2021 | Huangfu ............. H10K 59/122 |
| 2021/0305532 | A1* | 9/2021 | Mochizuki .......... H10K 59/122 |
| 2021/0384451 | A1 | 12/2021 | Gunji |

FOREIGN PATENT DOCUMENTS

| | | |
|---|---|---|
| JP | 2014-175165 A | 9/2014 |
| JP | 2018-005160 A | 1/2018 |
| JP | 2019-067525 A | 4/2019 |

OTHER PUBLICATIONS

Written Opinion (Application No. PCT/IB2020/062154) Dated Feb. 9, 2021.

* cited by examiner

SCT2 SCT1

SCT2 SCT1

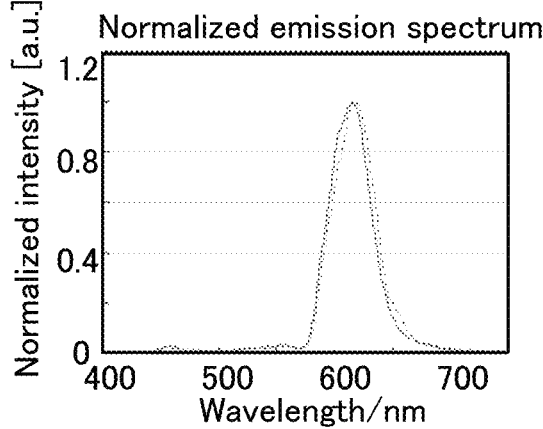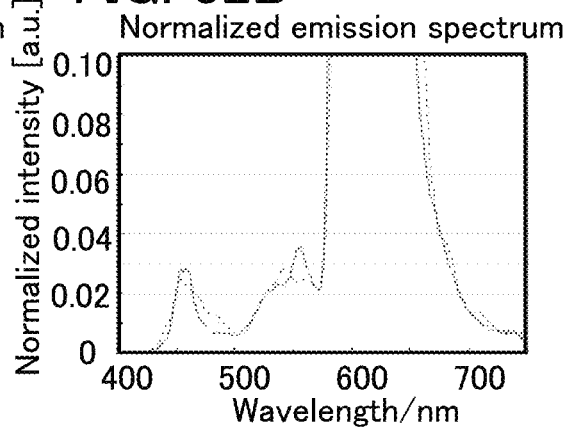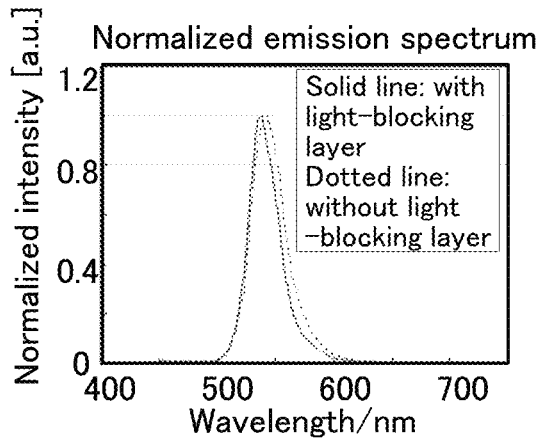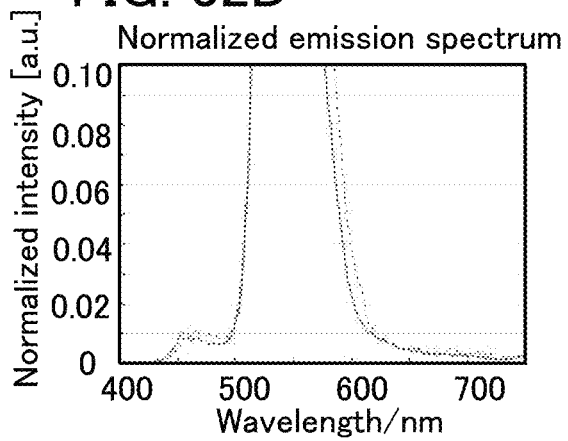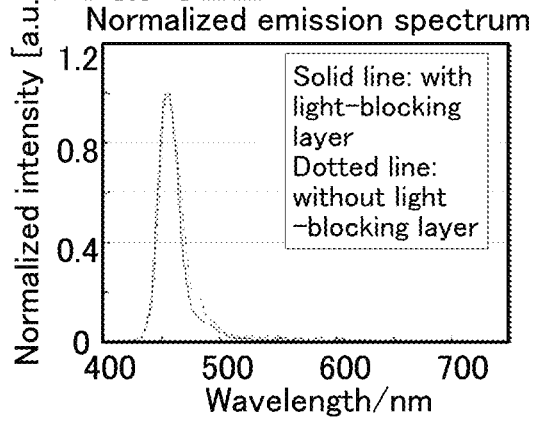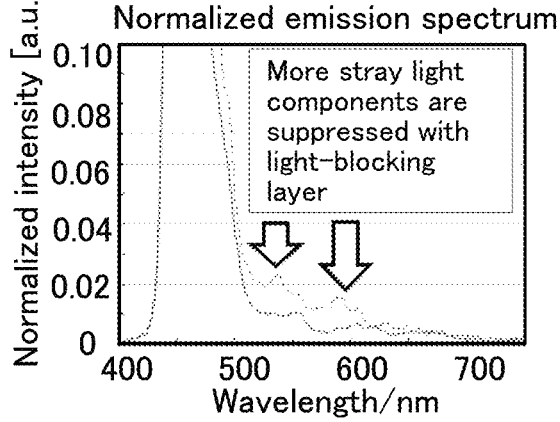

FUNCTIONAL PANEL, DISPLAY DEVICE, INPUT/OUTPUT DEVICE, AND DATA PROCESSING DEVICE

CROSS REFERENCE TO RELATED APPLICATIONS

This application is a U.S. National Phase Application under 35 U.S.C. § 371 of International Application PCT/IB2020/062154, filed on Dec. 18, 2020, which is incorporated by reference and claims the benefit of foreign priority applications filed in Japan on Dec. 25, 2019, as Application No. 2019-234155, on Mar. 27, 2020, as Application No. 2020-057252, and on Oct. 9, 2020, as Application No. 2020-170999.

TECHNICAL FIELD

One embodiment of the present invention relates to a functional panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

As an example of a structure that inhibits occurrence of a crosstalk phenomenon in a light-emitting device, a structure is known (Patent Document 1) in which an insulating layer; a first lower electrode formed over the insulating layer; a second lower electrode formed over the insulating layer; a structure body formed over the insulating layer and positioned between the first lower electrode and the second lower electrode; a first partition wall formed over the insulating layer and positioned between the structure body and the first lower electrode; a second partition wall formed over the insulating layer and positioned between the structure body and the second lower electrode; a first light-emitting unit formed over the first lower electrode, the first partition wall, the structure body, the second partition wall, and the second lower electrode; an intermediate layer formed over the first light-emitting unit; a second light-emitting unit formed over the intermediate layer; and an upper electrode formed over the second light-emitting unit are included.

REFERENCE

Patent Document

[Patent Document 1] Japanese Published Patent Application No. 2014-175165

SUMMARY OF THE INVENTION

Problems to be Solved by the Invention

An object of one embodiment of the present invention is to provide a novel functional panel that is highly convenient, useful, or reliable. Another object is to provide a novel display device that is highly convenient, useful, or reliable. Another object is to provide a novel input/output device that is highly convenient, useful, or reliable. Another object is to provide a novel data processing device that is highly convenient, useful, or reliable. Another object is to provide a novel functional panel, a novel display device, a novel input/output device, a novel data processing device, or a novel semiconductor device.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems (1) One embodiment of the present invention is a functional panel including a first element, a first reflective film, and an insulating film.

The first element includes a first electrode, a second electrode, and a layer containing a light-emitting material, and the layer containing a light-emitting material includes a region interposed between the first electrode and the second electrode.

The first electrode has a light-transmitting property, and the first electrode has a first thickness. The first electrode is interposed between a region of the first reflective film and the layer containing a light-emitting material, and the first reflective film has a second thickness.

The insulating film includes a first opening portion, the first opening portion overlaps with the first electrode, the insulating film has a first step-like cross-sectional shape, and the first step-like cross-sectional shape surrounds the first opening portion when seen from above. The first step-like cross-sectional shape includes a first step, and the first step is larger than or equal to a thickness obtained by adding the second thickness to the first thickness.

Thus, a thin portion of the layer containing a light-emitting material can be formed along the first step surrounding the first opening portion. Alternatively, a current can be inhibited from flowing to the outside of the first opening portion along the spread of the layer containing a light-emitting material. Alternatively, light-emitting regions can be concentrated in a region overlapping with the first opening portion. As a result, a novel functional panel that is highly convenient, useful, or reliable can be provided.

(2) One embodiment of the present invention is the above-described functional panel in which the first step-like cross-sectional shape includes a second step and a third step in the first step, the second step is smaller than the third step, and the second step is greater than or equal to 0.5 times and less than or equal to 1.5 times the first thickness.

Thus, the second step can be changed depending on the thickness of the first electrode. Alternatively, the third step can be constant without being affected by the thickness of the first electrode. Alternatively, along the third step surrounding the first opening portion, the layer containing a light-emitting material can be thinned. Alternatively, a current can be inhibited from flowing to the outside of the first opening portion along the spread of the layer containing a light-emitting material. Alternatively, light-emitting regions can be concentrated in a region overlapping with the first opening portion. As a result, a novel functional panel that is highly convenient, useful, or reliable can be provided.

(3) One embodiment of the present invention is the above-described functional panel including a second element.

The second element includes a third electrode, a second electrode, and a layer containing a light-emitting material, and the layer containing a light-emitting material includes a region interposed between the third electrode and the second electrode.

The insulating film includes a second opening portion, the second opening portion overlaps with the third electrode, the insulating film has a second step-like cross-sectional shape, the second step-like cross-sectional shape surrounds the second opening portion, the second step-like cross-sectional shape has a slope, and the slope is greater than or equal to 60° and less than or equal to 90° with respect to a surface of the third electrode.

Thus, a thin portion of the layer containing a light-emitting material can be formed in a region surrounding the first opening portion and a region surrounding the second opening portion. Alternatively, a current can be inhibited from flowing between the second electrode and the first electrode through the layer containing a light-emitting material in a region overlapping with the insulating film. Alternatively, a current can be inhibited from flowing between the second electrode in a region overlapping with the second opening portion and the first electrode through the layer containing a light-emitting material in a region overlapping with the insulating film. Alternatively, a current can be inhibited from flowing between the second electrode in a region overlapping with the first opening portion and the third electrode through the layer containing a light-emitting material in a region overlapping with the insulating film. Alternatively, light-emitting regions can be concentrated in the region overlapping with the first opening portion or the region overlapping with the second opening portion. Alternatively, an influence of the operation of the first element on the operation of the second element can be reduced. Alternatively, occurrence of a crosstalk phenomenon between the first element and the second element can be inhibited. As a result, a novel functional panel that is highly convenient, useful, or reliable can be provided.

(4) One embodiment of the present invention is the above-described functional panel in which the second step-like cross-sectional shape includes a fourth step, and fourth step is greater than or equal to 0.7 times and less than or equal to 1.3 times the first step.

Thus, a thin portion of the layer containing a light-emitting material can be formed along the first step surrounding the first opening portion and the second step surrounding the second opening portion. Alternatively, a current can be inhibited from flowing between the second electrode and the first electrode through the layer containing a light-emitting material in a region overlapping with the insulating film. Alternatively, a current can be inhibited from flowing between the second electrode overlapping with the second opening portion and the first electrode through the layer containing a light-emitting material in the region overlapping with the insulating film. Alternatively, a current can be inhibited from flowing between the second electrode overlapping with the first opening portion and the third electrode through the layer containing a light-emitting material in the region overlapping with the insulating film. Alternatively, light-emitting regions can be concentrated in a region overlapping with the first opening portion or a region overlapping with the second opening portion. As a result, a novel functional panel that is highly convenient, useful, or reliable can be provided.

(5) One embodiment of the present invention is the above-described functional panel in which the third electrode has a fourth thickness, and the second step-like cross-sectional shape includes a fifth step and a sixth step in the fourth step.

The fifth step is greater than or equal to 0.5 times and less than or equal to 1.5 times the fourth thickness, the fifth step is smaller than the sixth step, and the sixth step is greater than or equal to 0.7 times and less than or equal to 1.3 times the third step.

Thus, the second step can be changed depending on the thickness of the third electrode. Alternatively, the third step and the sixth step can be constant without being affected by the thickness of the first electrode and the thickness of the third electrode. Alternatively, a thin portion of the layer containing a light-emitting material can be formed along the third step surrounding the first opening portion and the sixth step surrounding the second opening portion. Alternatively, a current can be inhibited from flowing between the second electrode and the first electrode through the layer containing a light-emitting material in a region overlapping with the insulating film. Alternatively, a current can be inhibited from flowing between the second electrode overlapping with the second opening portion and the first electrode through the layer containing a light-emitting material in a region overlapping with the insulating film. Alternatively, a current can be inhibited from flowing between the second electrode overlapping with the first opening portion and the third electrode through the layer containing a light-emitting material in a region overlapping with the insulating film. Alternatively, light-emitting regions can be concentrated in a region overlapping with the first opening portion or a region overlapping with the second opening portion. As a result, a novel functional panel that is highly convenient, useful, or reliable can be provided.

(6) One embodiment of the present invention is the above-described functional panel in which the layer containing a light-emitting material includes a first light-emitting unit, a second light-emitting unit, and an intermediate layer.

The first light-emitting unit includes a region interposed between the first electrode and the intermediate layer. The intermediate layer includes a region interposed between the first light-emitting unit and the second light-emitting unit, and the intermediate layer has a higher conductivity than the second light-emitting unit.

Thus, a thin portion of the intermediate layer can be formed along the layer containing a light-emitting material in a region surrounding the first opening portion. Alternatively, a current can be inhibited from flowing to the outside of the first opening portion along the spread of the layer containing a light-emitting material. Alternatively, light-emitting regions can be concentrated in a region overlapping with the first opening portion. As a result, a novel functional panel that is highly convenient, useful, or reliable can be provided.

(7) One embodiment of the present invention is the above-described functional panel including a pixel set.

The pixel set includes a first pixel and a second pixel. The first pixel includes the first element and a pixel circuit, and the second pixel includes the second element. The first element is electrically connected to the pixel circuit.

Thus, the first element can be driven by the pixel circuit. Alternatively, display can be performed using the first pixel and the second pixel while occurrence of a crosstalk is inhibited. As a result, a novel functional panel that is highly convenient, useful, or reliable can be provided.

(8) One embodiment of the present invention is the above-described functional panel including a functional layer.

The functional layer includes the pixel circuit, and the pixel circuit includes a first transistor. The functional layer includes a driver circuit, and the driver circuit includes a second transistor.

The first transistor includes a semiconductor film, and the second transistor includes a semiconductor film that can be formed in a step of forming the semiconductor film.

Thus, the pixel circuit can be formed in the functional layer. As a result, a novel functional panel that is highly convenient, useful, or reliable can be provided.

(9) One embodiment of the present invention is the above-described functional panel including a region, and the region includes a group of pixel sets, a different group of pixel sets, a first conductive film, and a second conductive film.

The group of pixel sets is arranged in a row direction, the group of pixel sets includes the pixel set, and the group of pixel sets is electrically connected to the first conductive film.

The different group of pixel sets is arranged in a column direction intersecting the row direction, the different group of pixel sets includes the pixel set, and the different group of pixel sets is electrically connected to the second conductive film.

Thus, image data can be supplied to a plurality of pixels. As a result, a novel functional panel that is highly convenient, useful, or reliable can be provided.

(10) One embodiment of a present invention is a display device including a control portion and the above-described functional panel.

The control portion is supplied with image data and control data, the control portion generates data on the basis of the image data, the control portion generates a control signal on the basis of the control data, and the control portion supplies the data and the control signal.

The functional panel is supplied with the data and the control signal, and the pixel set performs display on the basis of the data.

Thus, the image data can be displayed using the first element. As a result, a novel display device that is highly convenient, useful, or reliable can be provided.

(11) One embodiment of the present invention is an input/output device including an input portion and a display portion.

The display portion includes the above-described functional panel, the input portion includes a sensing region, the input portion senses an object approaching the sensing region, and the sensing region includes a region overlapping with the first pixel.

Thus, the object approaching the region overlapping with the display portion can be sensed while image data is displayed using the display portion. A finger or the like approaching the display portion can be used as a pointer to input position data. Position data can be associated with image data displayed on the display portion. As a result, a novel input/output device that is highly convenient, useful, or reliable can be provided.

(12) One embodiment of the present invention is a data processing device including an arithmetic device and an input/output device.

The arithmetic device is supplied with input data or sensing data, and the arithmetic device generates control data and image data on the basis of the input data or the sensing data. The arithmetic device supplies the control data and the image data.

The input/output device supplies the input data and the sensing data, the input/output device is supplied with the control data and the image data, and the input/output device includes a display portion, an input portion, and a sensing portion. The display portion includes the above-described functional panel, and the display portion displays the image data on the basis of the control data. The input portion generates the input data, and the sensing portion generates the sensing data.

Thus, the control data can be generated on the basis of the input data or the sensing data. The image data can be displayed on the basis of the input data or the sensing data. Thus, a novel data processing device that is highly convenient, useful, or reliable can be provided.

(13) One embodiment of the present invention is a data processing device including one or more of a keyboard, a hardware button, a pointing device, a touch sensor, an illuminance sensor, an imaging device, an audio input device, an eye-gaze input device, and an attitude detection device, and the above-described functional panel.

Thus, the arithmetic device can generate the image data or the control data on the basis of the data supplied using a variety of input devices. Thus, a novel data processing device that is highly convenient or reliable can be provided.

Although a block diagram in which components are classified by their functions and shown as independent blocks is shown in the drawing attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relationship of a transistor is sometimes described assuming that the source and the drain are fixed; in reality, the names of the source and the drain interchange with each other according to the above relationship of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel functional panel that is highly convenient, useful, or reliable can be provided. A novel display device that is highly convenient, useful, or reliable can be provided. A novel input/output device that is highly convenient, useful, or reliable can be provided. A novel data processing device that is highly convenient, useful, or reliable can be provided. A novel functional panel, a novel display device, a novel input/output device, a novel data processing device, or a novel semiconductor device can be provided.

Note that the descriptions of these effects do not preclude the existence of other effects. One embodiment of the present invention does not have to have all of these effects. Other effects are apparent from the descriptions of the specification, the drawings, the claims, and the like, and other effects can be derived from the descriptions of the specification, the drawings, the claims, and the like.

BRIEF DESCRIPTION OF THE DRAWINGS

FIG. 32A to FIG. 32F are graphs showing characteristics of a functional panel in Example.

MODE FOR CARRYING OUT THE INVENTION

Figure 1A:
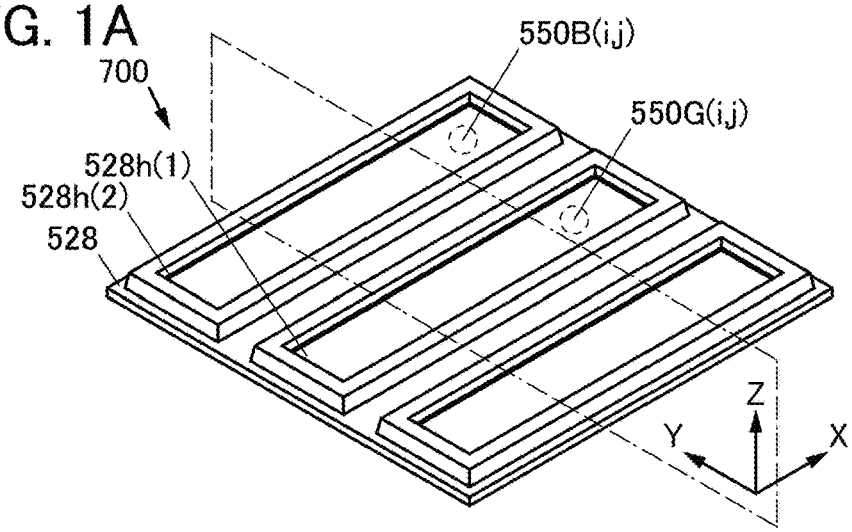
FIG. 1A to FIG. 1D are diagrams illustrating a structure of a functional panel of an embodiment.

A functional panel of one embodiment of the present invention includes a first element, a first reflective film, and an insulating film. The first element includes a first electrode, a second electrode, and a layer containing a light-emitting material; the layer containing a light-emitting material includes a region interposed between the first electrode and the second electrode; the first electrode has a light-transmitting property; and the first electrode has a first thickness. The first electrode is interposed between a region of the first reflective film and the layer containing a light-emitting material, and the first reflective film has a second thickness. The insulating film includes a first opening portion, and the first opening portion overlaps with the first electrode. The insulating film has a first step-like cross-sectional shape. The first step-like cross-sectional shape includes a first step, and the first step is larger than or equal to the thickness obtained by adding the second thickness to the first thickness.

Thus, a thin portion of a layer 553 containing a light-emitting material can be formed in a region surrounding a first opening portion 528h(1). Alternatively, a current can be inhibited from flowing to the outside of the first opening portion 528h(1) along the spread of the layer 553 containing a light-emitting material. Alternatively, light-emitting regions can be concentrated in a region overlapping with the first opening portion 528h(1). As a result, a novel functional panel that is highly convenient, useful, or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in structures of the invention described below, the same portions or portions having similar functions are denoted by the same reference numerals in different drawings, and a description thereof is not repeated.

Embodiment 1

In this embodiment, structures of a functional panel of one embodiment of the present invention are described with reference to drawings.

Figure 1B:
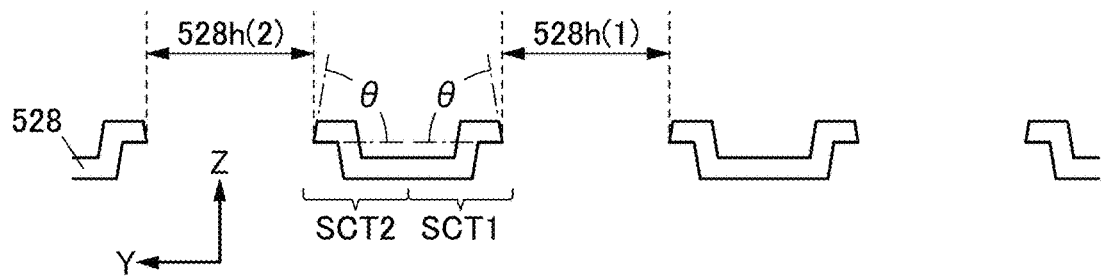
Figure 1C:
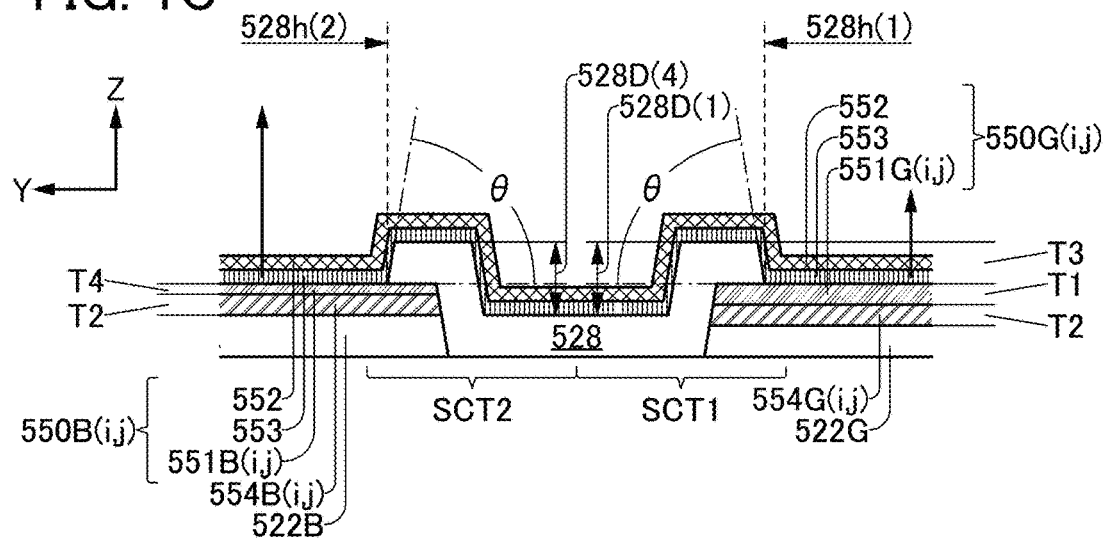
Figure 1D:
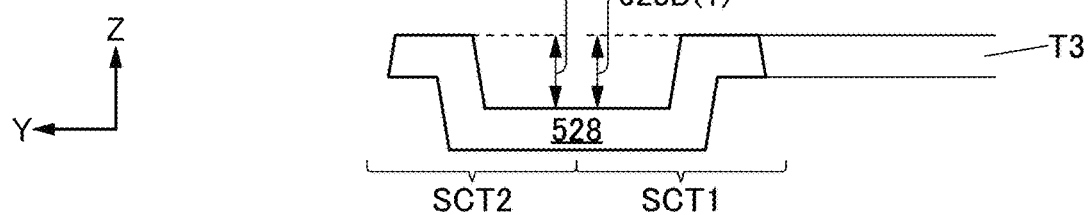

FIG. 1A is a perspective view of the functional panel of one embodiment of the present invention, and FIG. 1B is a cross-sectional view of a cutting plane Y-Z in FIG. 1A. FIG. 1C and FIG. 1D are each a diagram illustrating part of FIG. 1B.

Figure 2A:
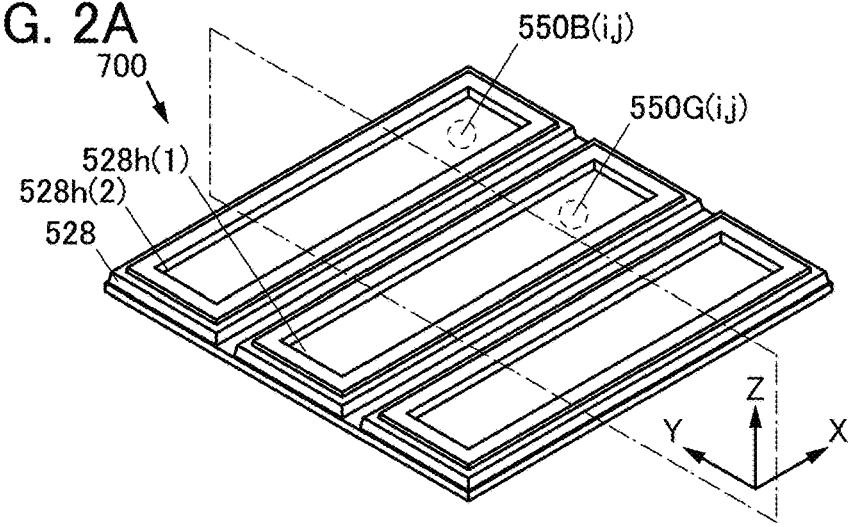
FIG. 2A to FIG. 2D are diagrams illustrating a structure of a functional panel of an embodiment.
Figure 2B:
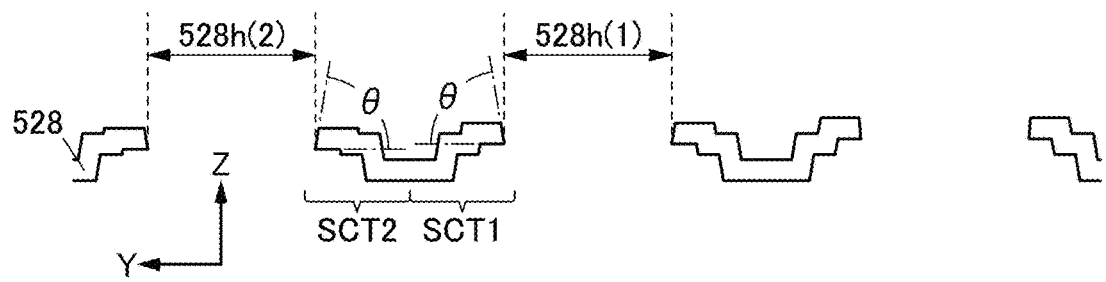
Figure 2C:
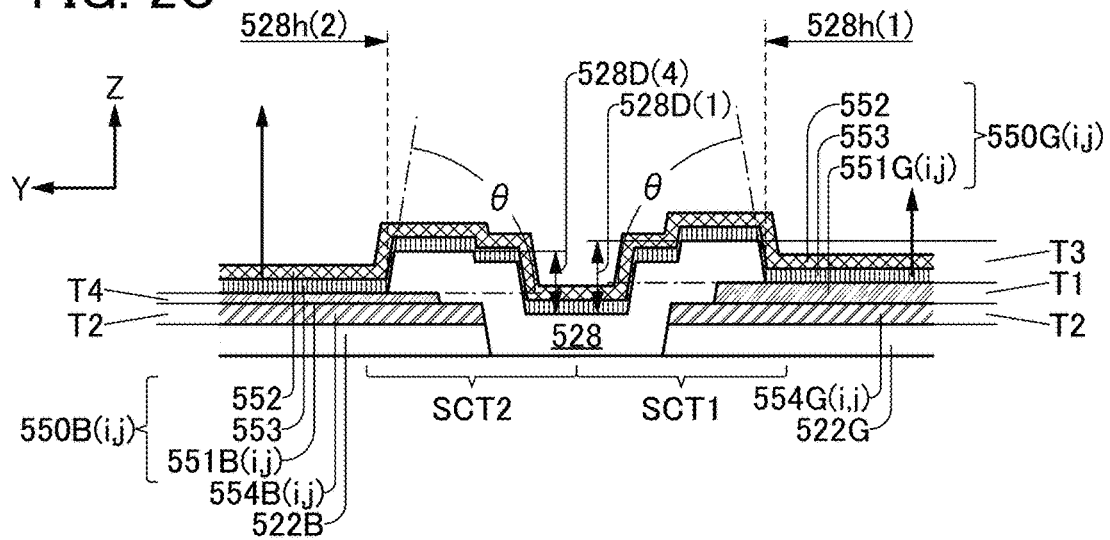
Figure 2D:
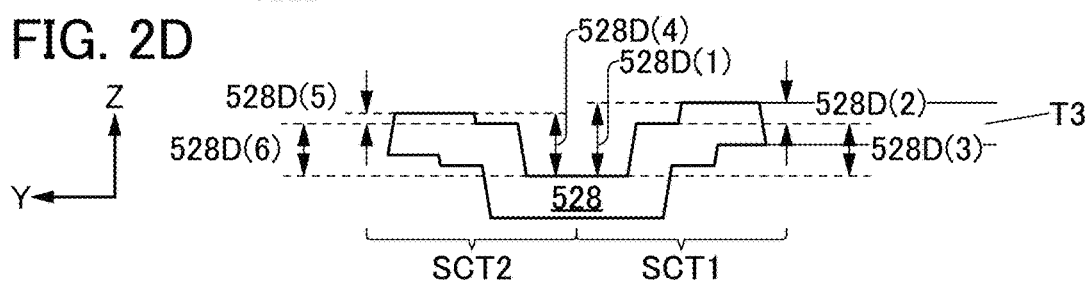

FIG. 2A is a perspective view of the functional panel of one embodiment of the present invention, and FIG. 2B is a cross-sectional view of a cutting plane Y-Z in FIG. 2A. FIG. 2C and FIG. 2D are each a diagram illustrating part of FIG. 2B.

Figure 3:
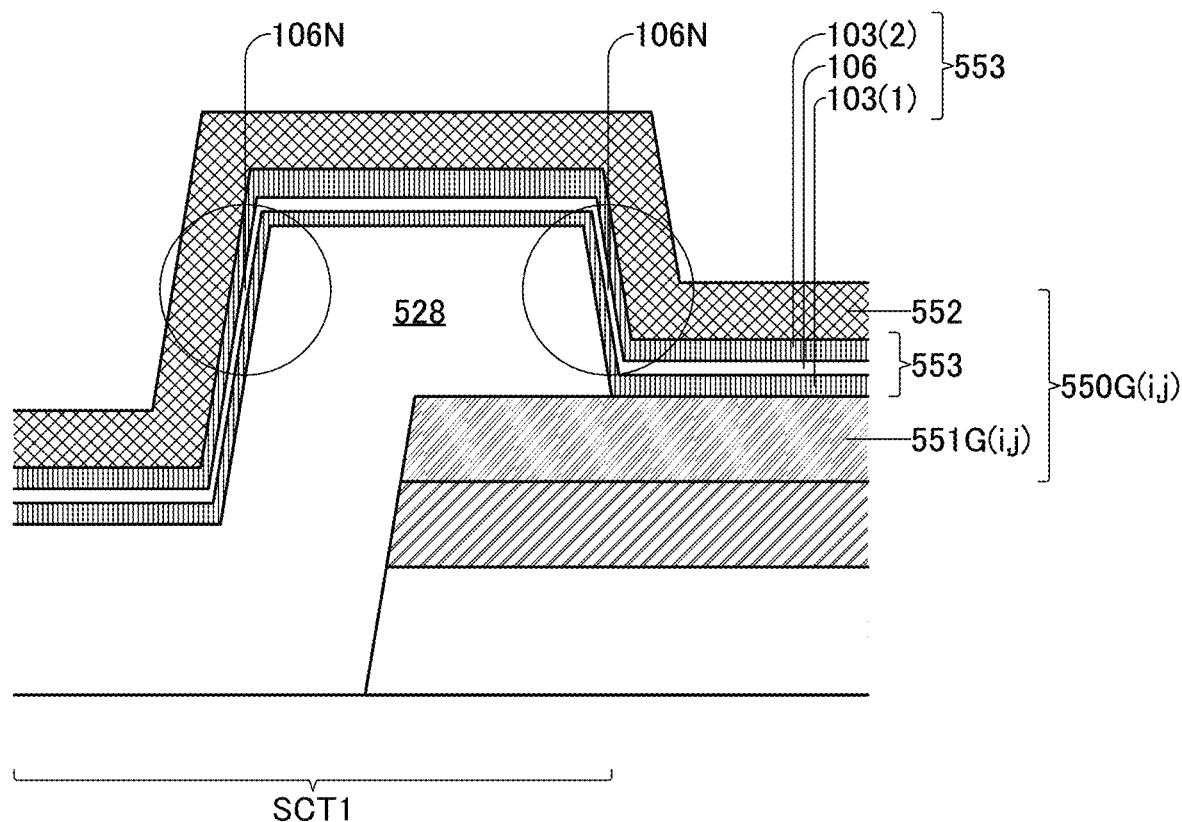
FIG. 3 is a diagram illustrating a structure of a functional panel of an embodiment.

FIG. 3 is a diagram illustrating part of FIG. 1C.

Note that in this specification, an integer variable of 1 or more is sometimes used in reference numerals. For example, (p) where p is an integer variable of 1 or more is sometimes used in part of a reference numeral that specifies any of p components at a maximum. As another example, (m,n) where m and n are each an integer variable of 1 or more is sometimes used in part of a reference numeral that specifies any of m×n components at a maximum.

Structure Example 1 of Functional Panel 700

A functional panel described in this embodiment includes an element 550G(i,j), a reflective film 554G(i,j), and an insulating film 528 (see FIG. 1C).

<<Structure Example of Element 550G(i,j)>>

The element 550G(i,j) includes an electrode 551G(i,j), an electrode 552, and a layer 553 containing a light-emitting material.

The layer 553 containing a light-emitting material includes a region interposed between the electrode 551G(i,j) and the electrode 552.

The electrode 551G(i,j) has a light-transmitting property, and the electrode 551G(i,j) has a thickness T1. Note that by controlling the thickness T1, the distance between the layer 553 containing a light-emitting material and the reflective film 554G(i,j) can be adjusted. This enables a microcavity structure to be formed in a functional panel 700. Light with a specific wavelength can be efficiently extracted from the element 550G(i,j).

<<Structure Example of Reflective Film 554G(i,j)>>

The electrode 551G(i,j) is interposed between a region of the reflective film 554G(i,j) and the layer 553 containing a light-emitting material, and the reflective film 554G(i,j) has a thickness T2. For example, a material having conductivity can be used for the reflective film 554G(if). Specifically, a wiring or the like can be used for the electrode 554G(i,j).

Structure Example 1 of Insulating Film 528

The insulating film 528 has a thickness T3, and the thickness T3 is larger than or equal to a thickness obtained by adding the thickness T2 to the thickness T1. The insulating film 528 includes an opening portion 528h(1) (see FIG. 1A to FIG. 1C).

The opening portion 528h(1) overlaps with the electrode 551G(i,j), and the insulating film 528 has a step-like cross-sectional shape SCT1 (see FIG. 1C and FIG. 1D).

The step-like cross-sectional shape SCT1 surrounds the opening portion 528h(1), and the step-like cross-sectional shape SCT1 has a slope θ (see FIG. 1A and FIG. 1B).

The slope θ is greater than or equal to 60° and less than or equal to 90° with respect to a surface of the electrode 551G(i,j) (see FIG. 1C). Specifically, the slope θ is an angle with respect to the surface of the electrode 551G(i,j) which is in contact with the layer 553 containing a light-emitting material. Alternatively, the slope θ is an angle of a side surface of the insulating film 528 with respect to a bottom surface thereof. Note that the thickness of the layer 553 containing a light-emitting material is smaller in a region in contact with the side surface having the slope of the insulating film 528 than in a region in contact with the electrode 551G(i,j).

Thus, a thin portion of the layer 553 containing a light-emitting material can be formed in a region surrounding the opening portion 528h(1). Alternatively, a current can be inhibited from flowing to the outside of the opening portion 528h(1) along the spread of the layer 553 containing a light-emitting material. Alternatively, light-emitting regions can be concentrated in a region overlapping with the opening portion 528h(1). As a result, a novel functional panel that is highly convenient, useful, or reliable can be provided.

Structure Example 2 of Insulating Film 528

The step-like cross-sectional shape SCT1 includes a step 528D(1) (see FIG. 1C and FIG. 1D). The step 528D(1) is larger than or equal to the thickness obtained by adding the thickness T2 to the thickness T1. For example, the step 528D(1) can be formed in the insulating film 528 by a method in which the insulating film 528 is formed over a process member where the reflective film 554G(i,j) with the thickness T2 and the electrode 551G(i,j) with the thickness T1 are stacked. Accordingly, the step 528D(1) having a thickness approximately the same as the thickness obtained by adding the thickness T2 to the thickness T1 can be formed. Alternatively, for example, the insulating film 528 can be formed in a process member where an insulating film 522G, the reflective film 554G(i,j) with the thickness T2, and the electrode 551G(i,j) with the thickness T1 are stacked. Thus, a larger step can be formed.

Thus, a thin portion of the layer 553 containing a light-emitting material can be formed along the step 528D(1) surrounding the opening portion 528h(1). Alternatively, a current can be inhibited from flowing to the outside of the opening portion 528h(1) along the spread of the layer 553 containing a light-emitting material. Alternatively, light-emitting regions can be concentrated in a region overlapping with the opening portion 528h(1). As a result, a novel functional panel that is highly convenient, useful, or reliable can be provided.

Structure Example 3 of Insulating Film 528

The step-like cross-sectional shape SCT1 includes a step 528D(2) and a step 528D(3) in the step 528D(1) (see FIG. 2C and FIG. 2D).

The step 528D(2) is smaller than the step 528D(3), and the step 528D(2) is greater than or equal to 0.5 times and less than or equal to 1.5 times the thickness T1. For example, the step 528D(2) is provided with a step having a thickness approximately the same as the thickness T1. The step 528D(3) is not affected by the thickness T1 of the electrode 551G(i,j).

Thus, the step 528D(2) can be changed depending on the thickness T1 of the electrode 551G(i,j). Alternatively, the step 528D(3) can be constant without being affected by the thickness T1 of the electrode 551G(i,j). Alternatively, along the step 528D(3) surrounding the opening portion 528h(1), the layer 553 containing a light-emitting material can be thinned. Alternatively, a current can be inhibited from flowing to the outside of the opening portion 528h(1) along the spread of the layer 553 containing a light-emitting material. Alternatively, light-emitting regions can be concentrated in a region overlapping with the opening portion 528h(1). As a result, a novel functional panel that is highly convenient, useful, or reliable can be provided.

Structure Example 2 of Functional Panel 700

The functional panel described in this embodiment includes an element 550B(i,j) (see FIG. 1A, FIG. 1C, FIG. 2A, and FIG. 2C).
<<Structure Example of Element 550G(i,j)>>

The electrode 550B(i,j) includes an electrode 551B(i,j), the electrode 552, and the layer 553 containing a light-emitting material (see FIG. 1C and FIG. 2C).

The layer 553 containing a light-emitting material includes a region interposed between the electrode 551B(i,j) and the electrode 552.

Structure Example 4 of Insulating Film 528

The insulating film 528 includes an opening portion 528h(2) (see FIG. 1A, FIG. 1B, FIG. 2A, and FIG. 2B). The opening portion 528h(2) overlaps with the electrode 551B (i,j), and the insulating film 528 has a step-like cross-sectional shape SCT2.

The step-like cross-sectional shape SCT2 surrounds the opening portion 528h(2), and the step-like cross-sectional shape SCT2 has a slope θ (see FIG. 1A and FIG. 2C).

The slope θ is greater than or equal to 60° and less than or equal to 90° with respect to a surface of the electrode 551B(i,j).

Thus, a thin portion of the layer 553 containing a light-emitting material can be formed in a region surrounding the opening portion 528h(1) and a region surrounding the opening portion 528h(2). Alternatively, a current can be inhibited from flowing between the electrode 552 in a region overlapping with the opening portion 528h(2) and the electrode 551G(i,j) through the layer 553 containing a light-emitting material in a region overlapping with the insulating film 528. Alternatively, a current can be inhibited from flowing between the electrode 552 in a region overlapping with the opening portion 528h(1) and the electrode 551B(i,j) through the layer 553 containing a light-emitting material in the region overlapping with the insulating film 528. Alternatively, light-emitting regions can be concentrated in the region overlapping with the opening portion 528h(1) or the region overlapping with the opening portion 528h(2). Alternatively, an influence of the operation of the element 550G (i,j) on the operation of the element 550B(i,j) can be reduced. Alternatively, occurrence of a crosstalk phenomenon between the element 550G(i,j) and the element 550B (i,j) can be inhibited. As a result, a novel functional panel that is highly convenient, useful, or reliable can be provided.

Structure Example 5 of Insulating Film 528

The step-like cross-sectional shape SCT2 includes a step 528D(4), and the step 528D(4) is greater than or equal to 0.7 times and less than or equal to 1.3 times, preferably greater than or equal to 0.9 times and less than or equal to 1.1 times the step 528D(1) (see FIG. 1D and FIG. 2D). For example, the insulating film 528 can be formed in a process member where an insulating film 522B, the reflective film 554B(i,j) with the thickness T2, and the electrode 551B(i,j) with a thickness T4 are stacked. Thus, the step 528D(4) can be substantially the same as the step 528D(1). Alternatively, the thickness of the insulating film 522B can be adjusted so that the step 528D(4) is substantially the same as the step 528D(1).

Thus, a thin portion of the layer 553 containing a light-emitting material can be formed along the step 528D(1) surrounding the opening portion 528h(1) and the step 528D (4) surrounding the opening portion 528h(2). Alternatively, a current can be inhibited from flowing between the electrode 552 in a region overlapping with the opening portion 528h(2) and the electrode 551G(i,j) through the layer 553 containing a light-emitting material in a region overlapping with the insulating film 528. Alternatively, a current can be inhibited from flowing between the electrode 552 in a region overlapping with the opening portion 528h(1) and the electrode 551B(i,j) through the layer 553 containing a light-emitting material in the region overlapping with the insulating film 528. Alternatively, light-emitting regions can be concentrated in a region overlapping with the opening portion 528h(1) or a region overlapping with the opening portion 528h(2). As a result, a novel functional panel that is highly convenient, useful, or reliable can be provided.

Structure Example 6 of Insulating Film 528

The electrode 551B(i,j) has the thickness T4 (see FIG. 2C).

The step-like cross-sectional shape SCT2 includes a step 528D(5) and a step 528D(6) in the step 528D(4) (see FIG. 2C and FIG. 2D).

The step 528D(5) is greater than or equal to 0.5 times and less than or equal to 1.5 times the thickness T4, and the step 528D(5) is smaller than the step 528D(6). Furthermore, the step 528D(6) is greater than or equal to 0.7 times and less than or equal to 1.3 times, preferably greater than or equal to 0.9 times and less than or equal to 1.1 times the step 528D(3). For example, the step 528D(5) is provided with a step having a thickens approximately the same as the thickness T4. The step 528D(6) is not affected by the thickness T4 of the electrode 551B(i,j).

Thus, the step 528D(5) can be changed depending on the thickness T4 of the electrode 551B(i,j). Alternatively, the step 528D(3) and the step 528D(6) can be constant without being affected by the thickness T1 of the electrode 551G(i,j) and the thickness T4 of the electrode 551B(i,j). Alternatively, a thin portion of the layer 553 containing a light-emitting material can be formed along the step 528D(3) surrounding the opening portion 528h(1) and the step 528D(6) surrounding the opening portion 528h(2). Alternatively, a current can be inhibited from flowing between the electrode 552 overlapping with the opening portion 528h(2) and the electrode 551G(i,j) through the layer 553 containing a light-emitting material in a region of overlapping with the insulating film 528. Alternatively, a current can be inhibited from flowing between the electrode 552 overlapping with the opening portion 528h(1) and the electrode 551B(i,j) through the layer 553 containing a light-emitting material in the region overlapping with the insulating film 528. Alternatively, light-emitting regions can be concentrated in a region overlapping with the opening portion 528h(1) or a region overlapping with the opening portion 528h(2). As a result, a novel functional panel that is highly convenient, useful, or reliable can be provided.

<<Structure Example of Layer 553 Containing Light-Emitting Material>>

The layer 553 containing a light-emitting material includes a light-emitting unit 103(1), a light-emitting unit 103(2), and an intermediate layer 106 (see FIG. 3).

The light-emitting unit 103(1) is interposed between the electrode 551G(i,j) and the intermediate layer 106. The light-emitting unit includes one region where electrons injected from one side are recombined with holes injected from the other side. The light-emitting unit contains a light-emitting material, and the light-emitting material releases energy generated by recombination of electrons and holes as light. For example, the light-emitting unit 103(1) can have a structure of emitting blue light, and the light-emitting unit 103(2) can have a structure of emitting yellow light. Accordingly, the layer 553 containing a light-emitting material can have a structure of emitting white light.

The intermediate layer 106 includes a region interposed between the light-emitting unit 103(1) and the light-emitting unit 103(2), and the intermediate layer 106 has higher conductivity than the light-emitting unit 103(2). An intermediate layer includes a region interposed between two light-emitting units. The intermediate layer includes a charge-generation region, and the intermediate layer has functions of supplying holes to the light-emitting unit placed on the cathode side and supplying electrons to the light-emitting unit placed on the anode side. Furthermore, a structure including a plurality of light-emitting units and an intermediate layer is referred to as a tandem light-emitting element in some cases.

Thus, a thin portion 106N of the intermediate layer 106 can be formed in a region surrounding the opening portion 528h(1) of the layer 553 containing a light-emitting material. Alternatively, a current can be inhibited from flowing to the outside of the opening portion 528h(1) along the spread of the layer 553 containing a light-emitting material. Alternatively, light-emitting regions can be concentrated in a region overlapping with the opening portion 528h(1). As a result, a novel functional panel that is highly convenient, useful, or reliable can be provided.

Note that this embodiment can be combined with any of the other embodiments in this specification as appropriate.

Embodiment 2

In this embodiment, structures of a functional panel of one embodiment of the present invention are described with reference to drawings.

Figure 4A:
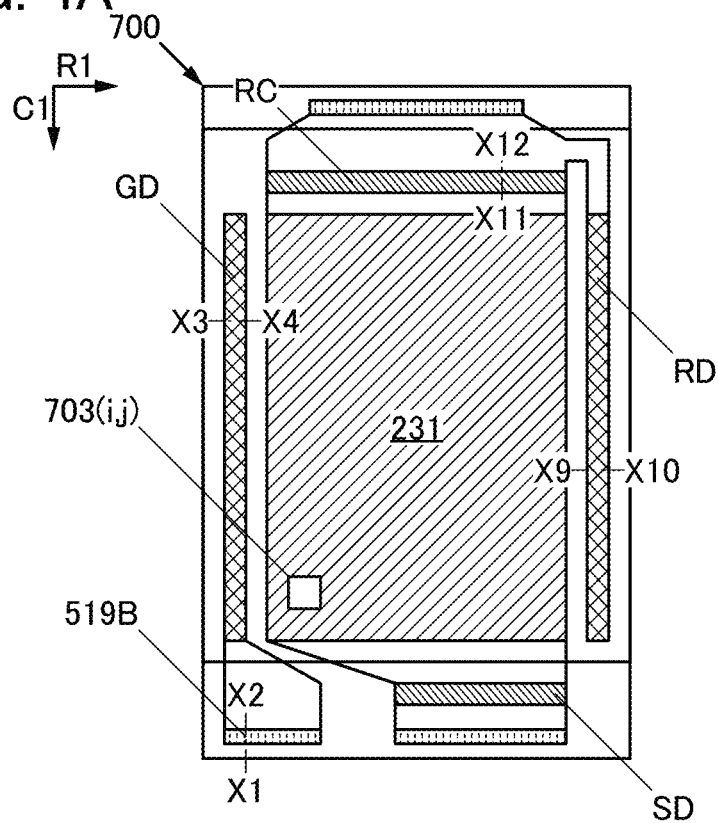
FIG. 4A and FIG. 4B are diagrams illustrating a structure of a functional panel of an embodiment.
Figure 4B:
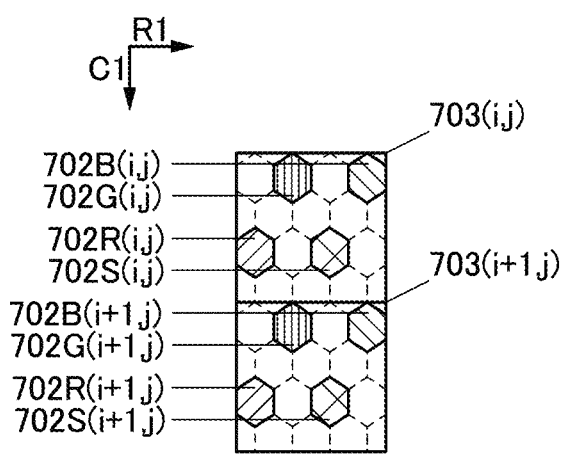

FIG. 4A is a top view illustrating the structure of the functional panel of one embodiment of the present invention, and FIG. 4B is a diagram illustrating part of FIG. 4A.

Figure 5A:
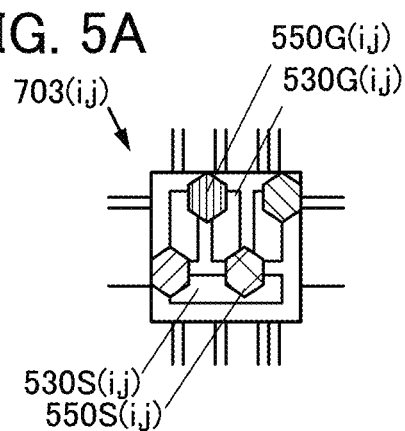
FIG. 5A to FIG. 5C are diagrams illustrating a structure of a functional panel of an embodiment.
Figure 5B:
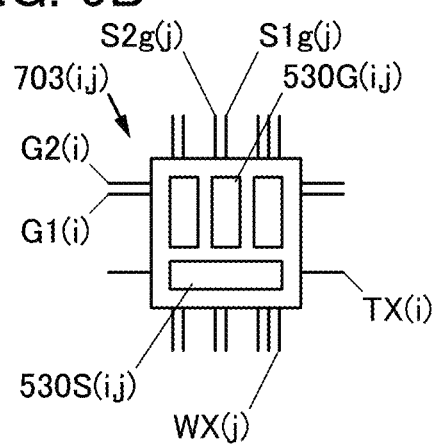
Figure 5C:
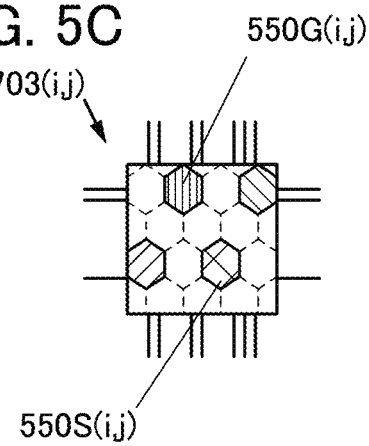

FIG. 5A is a diagram illustrating part of FIG. 4A, FIG. 5B is a diagram illustrating part of FIG. 5A, and FIG. 5C is a diagram illustrating another part of FIG. 5A.

Figure 6:
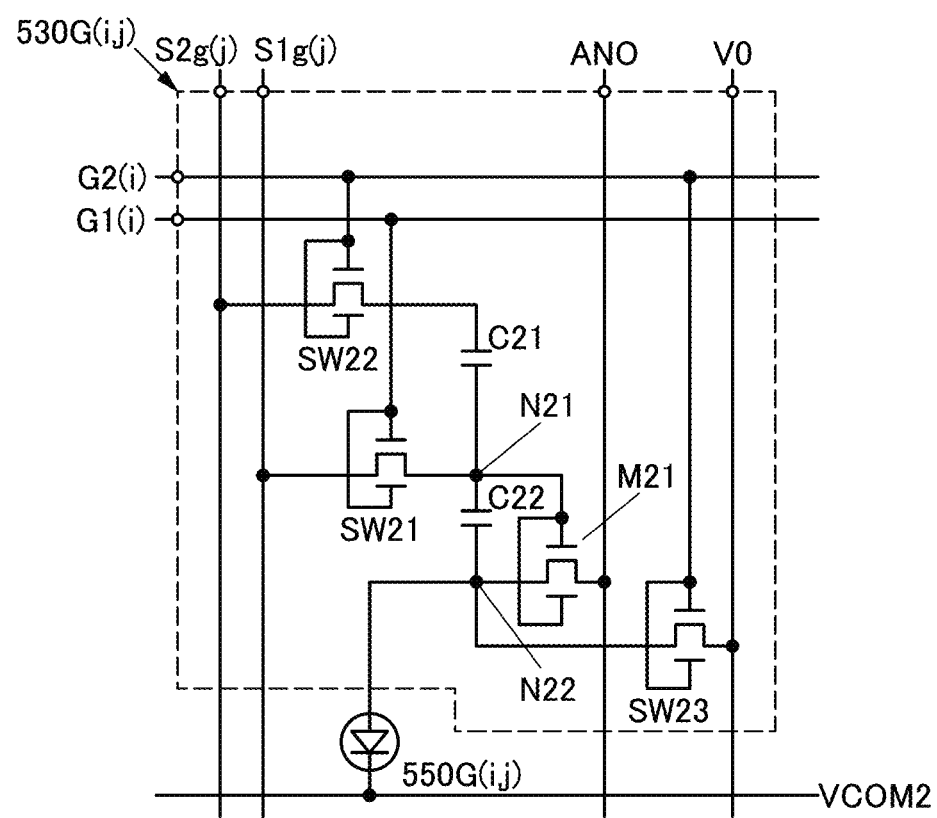
FIG. 6 is a circuit diagram illustrating a structure of a functional panel of an embodiment.

FIG. 6 is a circuit diagram illustrating a structure of a pixel circuit that can be used for the functional panel of one embodiment of the present invention.

Figure 7:
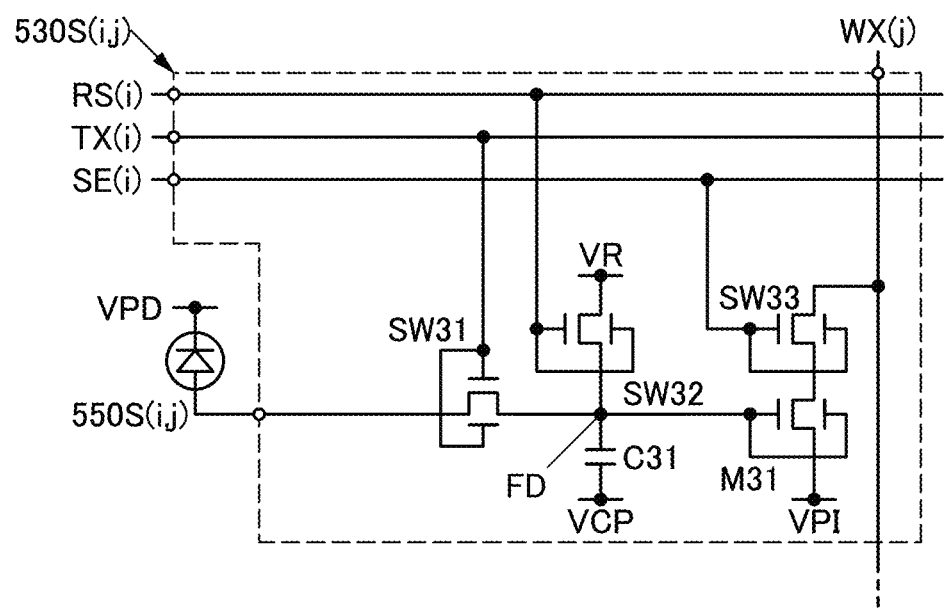
FIG. 7 is a circuit diagram illustrating a structure of a functional panel of an embodiment.

FIG. 7 is a circuit diagram illustrating a structure of a pixel circuit that can be used for the functional panel of one embodiment of the present invention.

Figure 8A:
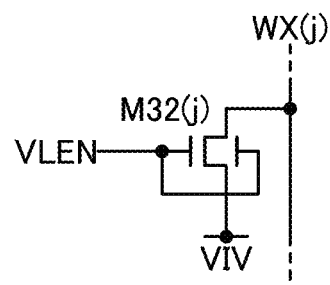
FIG. 8A and FIG. 8B are circuit diagrams illustrating a structure of a functional panel of an embodiment.
Figure 8B:
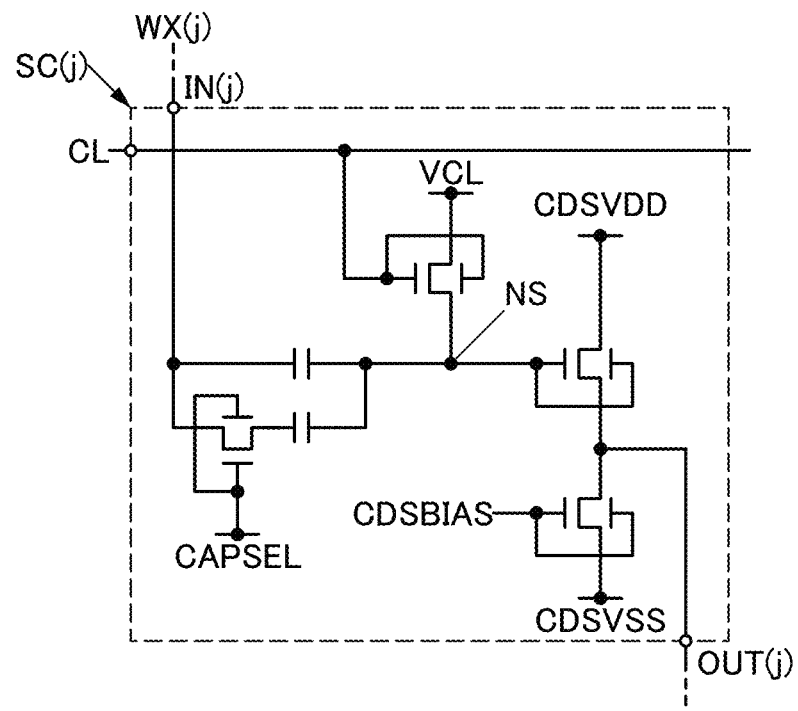

FIG. 8A is a circuit diagram illustrating part of an amplifier circuit that can be used in the functional panel of one embodiment of the present invention, and FIG. 8B is a circuit diagram of a sampling circuit that can be used in the functional panel of one embodiment of the present invention.

Structure Example 1 of Functional Panel 700

The functional panel 700 includes a pixel set 703(i,j) (see FIG. 4A).

The functional panel 700 includes a conductive film G1(i), a conductive film G2(i), a conductive film S1g(j), a conductive film S2g(j), a conductive film ANO, a conductive film VCOM2, and a conductive film V0 (see FIG. 6).

For example, the conductive film G1(i) is supplied with a first selection signal, the conductive film G2(i) is supplied with a second selection signal, the conductive film S1g(j) is supplied with an image signal, and the conductive film S2g(j) is supplied with a control signal.

Structure Example 1 of Pixel 703(i,j)

The pixel set 703(i,j) includes a pixel 702G(i,j) (see FIG. 4B). The pixel 702G(i,j) includes a pixel circuit 530G(i,j) and the element 550G(i,j) (see FIG. 5A).

Structure Example 1 of Pixel Circuit 530G(i,j)

The pixel circuit 530G(i,j) is supplied with the first selection signal, and the pixel circuit 530G(i,j) obtains an image signal on the basis of the first selection signal.

For example, the first selection signal can be supplied using the conductive film G1(i) (see FIG. 5B). The image signal can be supplied using the conductive film S1g(j). Note that the operation of supplying the first selection signal and making the pixel circuit 530G(i,j) obtain the image signal can be referred to as "writing" (see FIG. 15).

Structure Example 2 of Pixel Circuit 530G(i,j)

The pixel circuit 530G(i,j) includes a switch SW21, a switch SW22, a transistor M21, a capacitor C21, and a node N21 (see FIG. 6). In addition, the pixel circuit 530G(i,j) includes a node N22, a capacitor C22, and a switch SW23.

The transistor M21 includes a gate electrode electrically connected to the node N21, a first electrode electrically connected to the element 550G(i,j), and a second electrode electrically connected to the conductive film ANO.

The switch SW21 includes a first terminal electrically connected to the node N21 and a second terminal electrically connected to the conductive film S1g(j), and has a function of controlling the conduction state or the non-conduction state on the basis of a potential of the conductive film G1(i).

The switch SW22 includes a first terminal electrically connected to the conductive film S2g(j), and has a function of controlling the conduction state or the non-conduction state on the basis of a potential of the conductive film G2(i).

The capacitor C21 includes a conductive film electrically connected to the node N21 and a conductive film electrically connected to a second electrode of the switch SW22.

Thus, an image signal can be stored in the node N21. A potential of the node N21 can be changed using the switch SW22. The intensity of light emitted from the element 550G(i,j) can be controlled with the potential of the node N21. As a result, a novel functional panel that is highly convenient or reliable can be provided.

Structure Example 1 of Element 550G(i,j)

The element 550G(i,j) is electrically connected to the pixel circuit 530G(i,j) (see FIG. 5A). The element 550G(i,j) includes the electrode 551G(i,j) electrically connected to the pixel circuit 530G(i,j), and the electrode 552 electrically connected to the conductive film VCOM2 (see FIG. 6 and FIG. 10A). Note that the element 550G(i,j) has a function of operating on the basis of the potential of the node N21.

For example, an organic electroluminescence element, an inorganic electroluminescence element, a light-emitting diode, a QDLED (Quantum Dot LED), or the like can be used as the element 550G(i,j).

Structure Example 2 of Functional Panel 700

The functional panel described in this embodiment includes a conductive film RS(i), a conductive film TX(i), a conductive film SE(i), a conductive film VR, a conductive film VCP, a conductive film VPI, and a conductive film WX(j) (see FIG. 7).

For example, the conductive film RS(i) is supplied with a third selection signal, the conductive film TX(i) is supplied with a fourth selection signal, and the conductive film SE(i) is supplied with a fifth selection signal.

Structure Example 2 of Pixel 703(i,j)

The pixel set 703(i,j) includes a pixel 702S(i,j) (see FIG. 4B). The pixel 702S(i,j) includes a pixel circuit 530S(i,j) and an element 550S(i,j) (see FIG. 5A).

Structure Example 1 of the Pixel Circuit 530S(i,j)

The pixel circuit 530S(i,j) includes a switch SW31, a switch SW32, a switch SW33, a transistor M31, a capacitor C31, and a node FD (see FIG. 7).

The switch SW31 includes a first terminal electrically connected to the element 550S(i,j) and a second terminal electrically connected to the node FD, and has a function of controlling the conduction state or the non-conduction state on the basis of a potential of the conductive film TX(i).

The switch SW32 includes a first terminal electrically connected to the node FD and a second terminal electrically connected to the conductive film VR, and has a function of controlling the conduction state or the non-conduction state on the basis of a potential of the conductive film RS(i).

The capacitor C31 includes a conductive film electrically connected to the node FD and a conductive film electrically connected to the conductive film VCP.

The transistor M31 includes a gate electrode electrically connected to the node FD and a first electrode electrically connected to the conductive film VPI.

The switch SW33 includes a first terminal electrically connected to a second electrode of the transistor M31 and a second terminal electrically connected to the conductive film WX(j), and has a function of controlling the conduction state or the non-conduction state on the basis of a potential of the conductive film SE(i).

Thus, an imaging signal generated by the element 550S(i,j) can be transferred to the node FD using the switch SW31. The imaging signal generated by the element 550S(i,j) can be stored in the node FD using the switch SW31. Electrical continuity between the pixel circuit 530S(i,j) and the element 550S(i,j) can be broken by the switch SW31. A correlated double sampling method can be employed. Noise included in the imaging signal can be reduced. Thus, a novel functional panel that is highly convenient or reliable can be provided.

Structure Example 1 of Element 550S(i,j)

The element 550S(i,j) is electrically connected to the pixel circuit 530S(i,j) (see FIG. 5A). The element 550S(i,j) has a function of generating an imaging signal. For example, a heterojunction photoelectric conversion element, a bulk heterojunction photoelectric conversion element, or the like can be used as the element 550S(i,j).

Structure Example 3 of Pixel 703(i,j)

A plurality of pixels can be used in the pixel 703(i,j). For example, a plurality of pixels capable of displaying colors with different hues can be used. Note that the plurality of pixels can be referred to as subpixels. A set of subpixels can be referred to as a pixel.

This enables additive mixture or subtractive mixture of colors displayed by the plurality of pixels. It is possible to display a color of a hue that an individual pixel cannot display.

Specifically, a pixel 702B(i,j) displaying blue, the pixel 702G(i,j) displaying green, and a pixel 702R(i,j) displaying red can be used in the pixel 703(i,j). The pixel 702B(i,j), the pixel 702G(i,j), and the pixel 702R(i,j) can each be referred to as a subpixel (see FIG. 4B).

A pixel displaying white or the like can be used in addition to the above set in the pixel 703(i,j), for example. A pixel displaying cyan, a pixel displaying magenta, and a pixel displaying yellow can be used in the pixel 703(i,j).

A pixel emitting infrared rays can be used in addition to the above set in the pixel 703(i,j), for example. Specifically, a pixel that emits light including light with a wavelength of greater than or equal to 650 nm and less than or equal to 1000 nm can be used in the pixel 703(i,j).

Structure Example 3 of Functional Panel 700

The functional panel described in this embodiment includes a driver circuit GD, a driver circuit SD, and a driver circuit RD (see FIG. 4A).

<<Structure Example of Driver Circuit GD>>

The driver circuit GD has a function of supplying the first selection signal and the second selection signal. For example, the driver circuit GD is electrically connected to a conductive film G1(i) to supply the first selection signal, and is electrically connected to a conductive film G2(i) to supply the second selection signal.

<<Structure Example of Driver Circuit SD>>

The driver circuit SD has a function of supplying an image signal and a control signal, and the control signal includes a first level and a second level. The driver circuit SD is electrically connected to the conductive film S1g(j) to supply the image signal, and is electrically connected to the conductive film S2g(j) to supply the control signal, for example.

<<Structure Example of Driver Circuit RD>>

The driver circuit RD has a function of supplying the third selection signal to the fifth selection signal. For example, the driver circuit RD is electrically connected to the conductive film RS(i), supplies the third selection signal, is electrically connected to the conductive film TX(i), supplies the fourth selection signal, is electrically connected to the conductive film SE(i), and supplies the fifth selection signal.

Structure Example 4 of Functional Panel 700

The functional panel described in this embodiment includes a conductive film VLEN, a conductive film VIV, and a reading circuit RC (see FIG. 8A, FIG. 8B, and FIG. 4A). Note that the reading circuit RC includes a reading circuit RC(j). The functional panel includes a conductive film CDSVDD, a conductive film CDSVSS, a conductive film CDSBIAS, a conductive film CAPSEL, and a conductive film VCL.

<<Structure Example of Reading Circuit RC(j)>>

The reading circuit RC(j) includes an amplifier circuit and a sampling circuit SC(i) (see FIG. 8A and FIG. 8B).

<<Structure Example of Amplifier Circuit>>

The amplifier circuit includes a transistor M32(j) (see FIG. 8A). The transistor M32(j) includes a gate electrode electrically connected to the conductive film VLEN, a first electrode electrically connected to the conductive film WX(j), and a second electrode electrically connected to the conductive film VIV.

Note that the conductive film WX(j) connects the transistor M31 and the transistor M32 when the switch SW33 is in a conduction state (see FIG. 7 and FIG. 8A). Thus, a source follower circuit can be configured with the transistor M31 and the transistor M32. A potential of the conductive film WX(j) can be changed on the basis of a potential of the node FD.

<<Structure Example of Sampling Circuit SC(j)>>

The sampling circuit SC(j) includes a first terminal IN(j), a second terminal, and a third terminal OUT(j) (see FIG. 8B). In addition, a node NS is included.

The first terminal IN(j) is electrically connected to the conductive film WX(j), the second terminal is electrically connected to a conductive film CL, and the third terminal OUT(j) has a function of supplying a signal that changes on the basis of a potential of the first terminal IN(j).

Thus, an imaging signal can be obtained from the pixel circuit 530S(i,j). A correlated double sampling method can be employed, for example. A differential signal of the pixel circuit 530S(i,j) can be obtained by the corresponding conductive film WX(j). Noise can be reduced. Thus, a novel functional panel that is highly convenient, useful, or reliable can be provided.

Note that this embodiment can be combined with any of the other embodiments in this specification as appropriate.

Embodiment 3

In this embodiment, structures of a functional panel of one embodiment of the present invention are described with reference to drawings.

Figure 9:
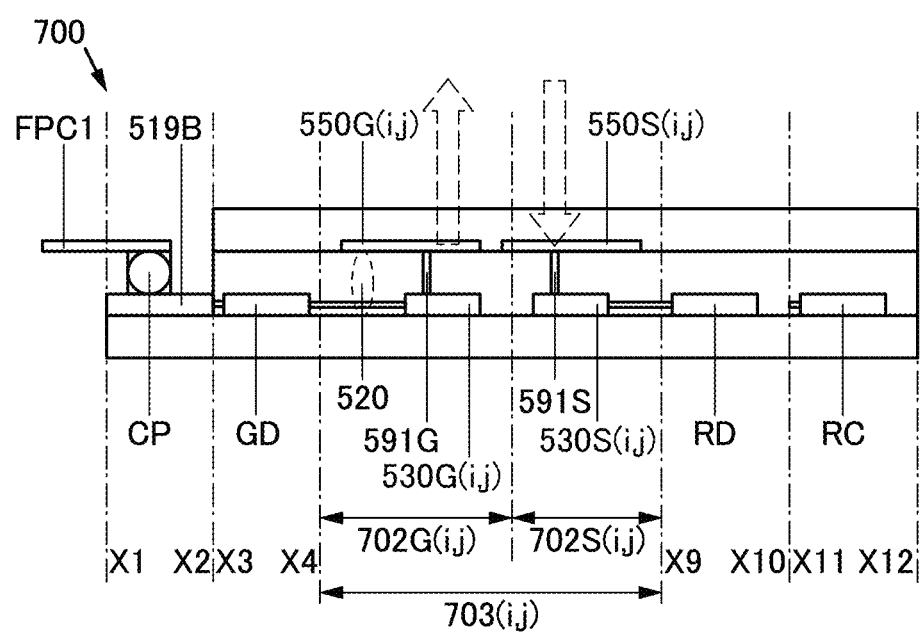
FIG. 9 is a cross-sectional view illustrating a structure of a functional panel of an embodiment.

FIG. 9 is a diagram illustrating a structure of the functional panel of one embodiment of the present invention and is a cross-sectional view taken along cutting lines X1-X2, X3-X4, X9-X10, and X11-X12 in FIG. 4A and in the pixel set 703(i,j).

Figure 10A:
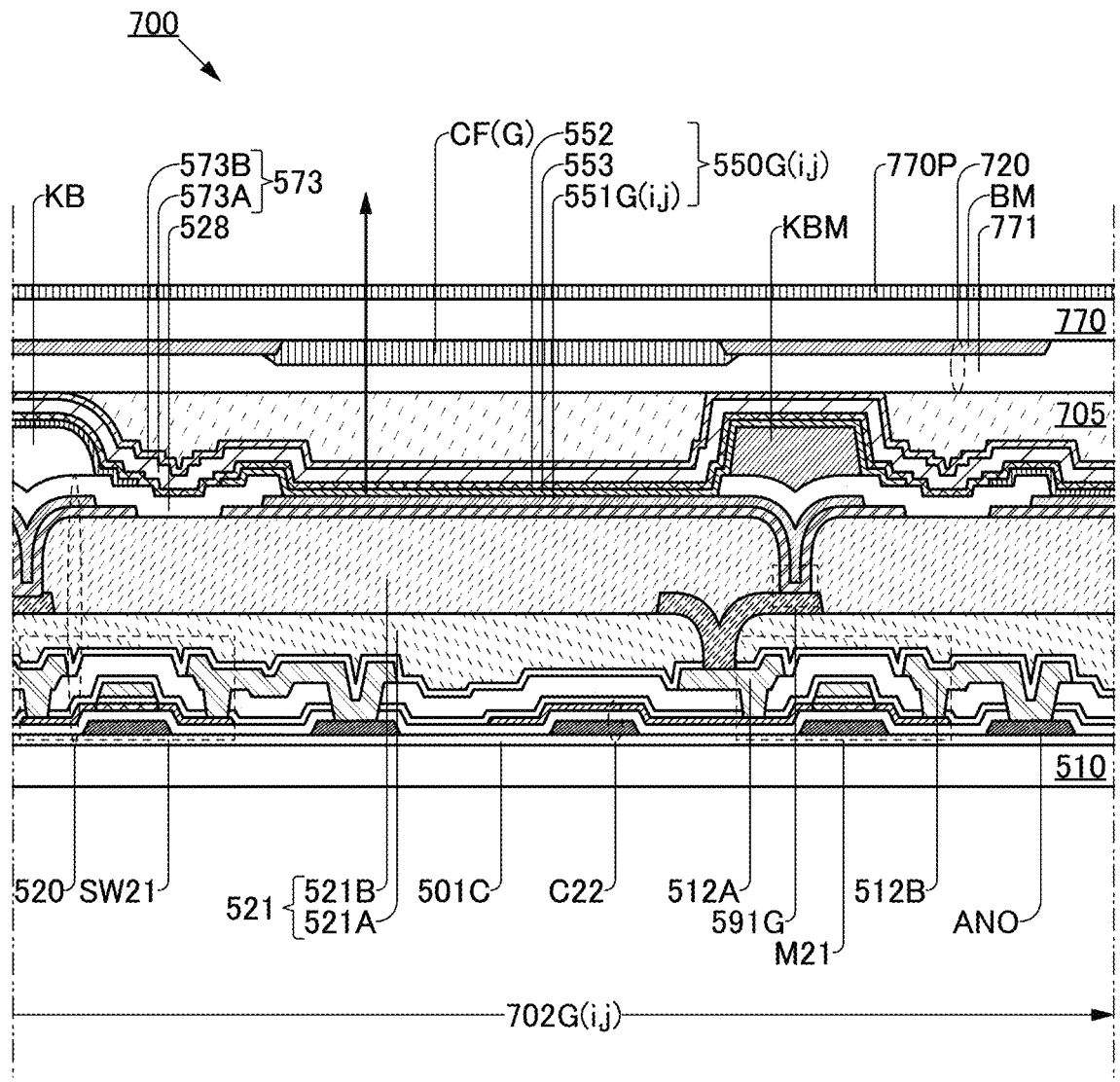
FIG. 10A and FIG. 10B are cross-sectional views illustrating a structure of a functional panel of an embodiment.
Figure 10B:
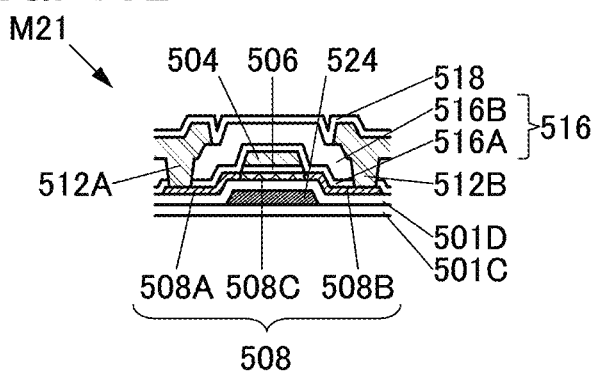

FIG. 10A is a diagram illustrating a structure of the functional panel of one embodiment of the present invention and is a cross-sectional view of the pixel 702G(i,j) illustrated in FIG. 4B. FIG. 10B is a cross-sectional view illustrating part of FIG. 10A.

Figure 11A:
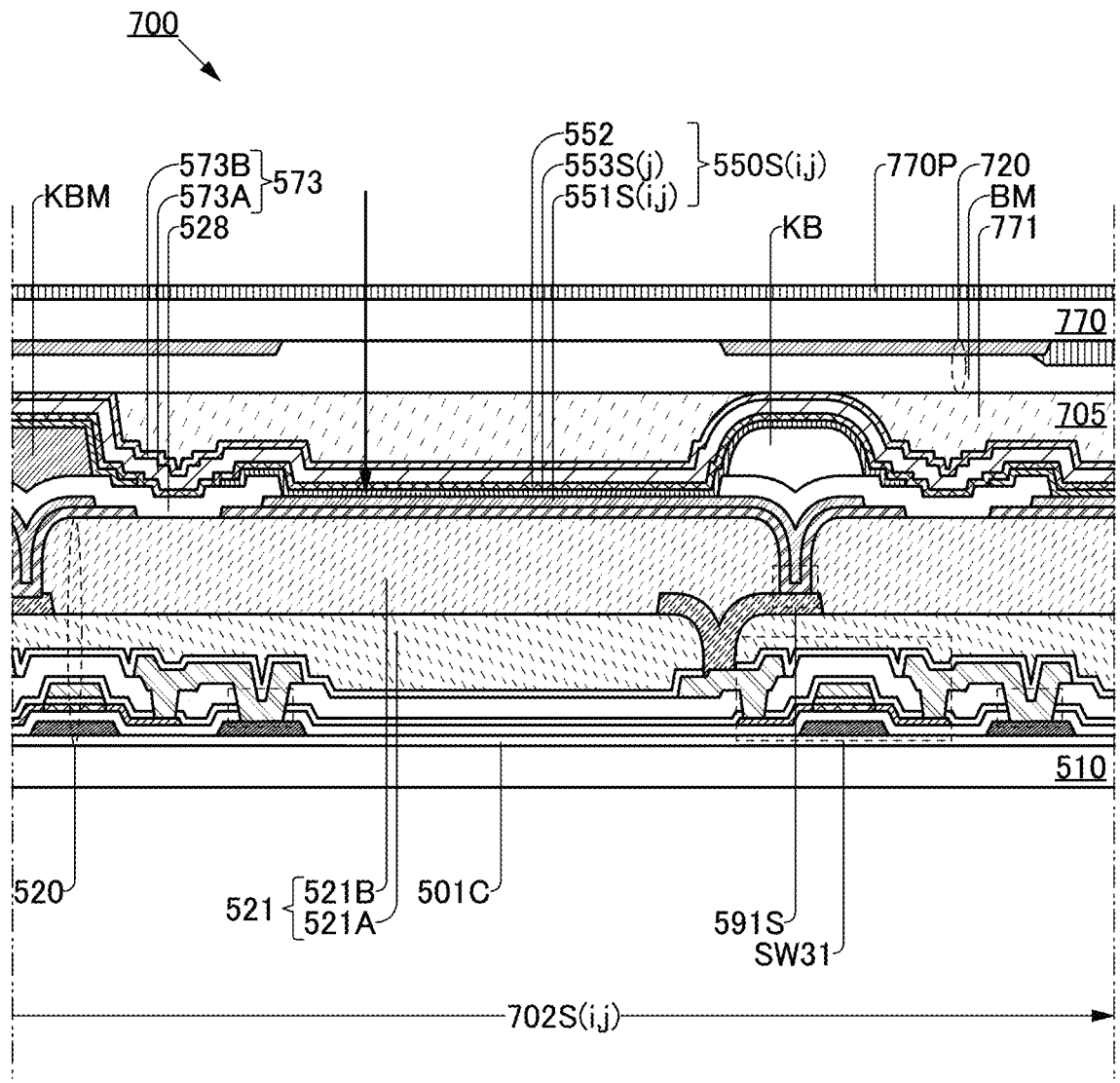
FIG. 11A and FIG. 11B are cross-sectional views illustrating a structure of a functional panel of an embodiment.
Figure 11B:
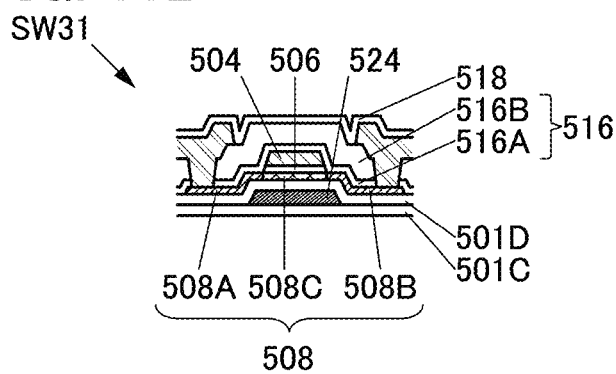

FIG. 11A is a diagram illustrating a structure of the functional panel of one embodiment of the present invention and is a cross-sectional view of the pixel 702S(i,j) illustrated in FIG. 4B. FIG. 11B is a cross-sectional view illustrating part of FIG. 11A.

Figure 12A:
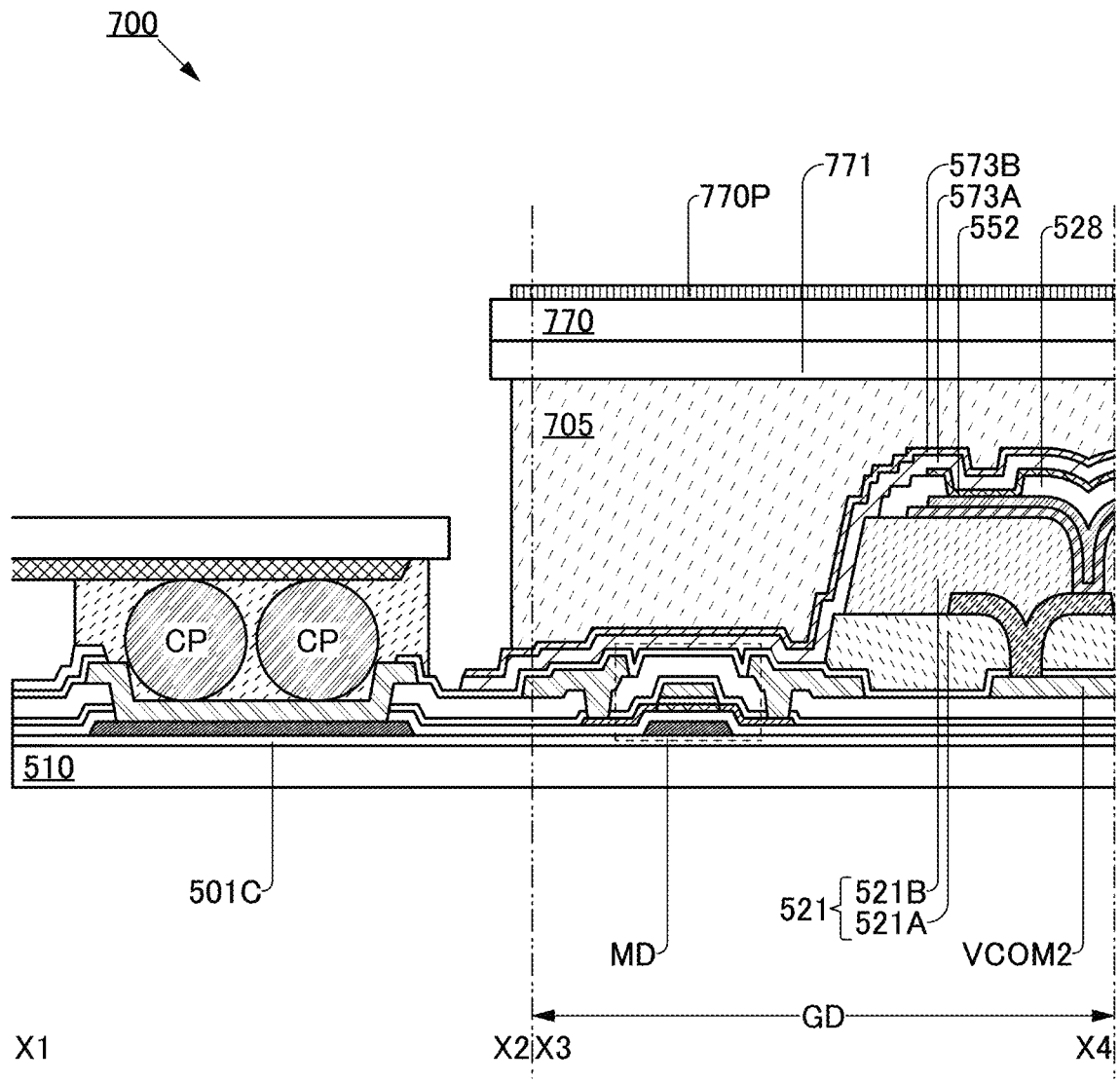
FIG. 12A and FIG. 12B are cross-sectional views illustrating a structure of a functional panel of an embodiment.
Figure 12B:
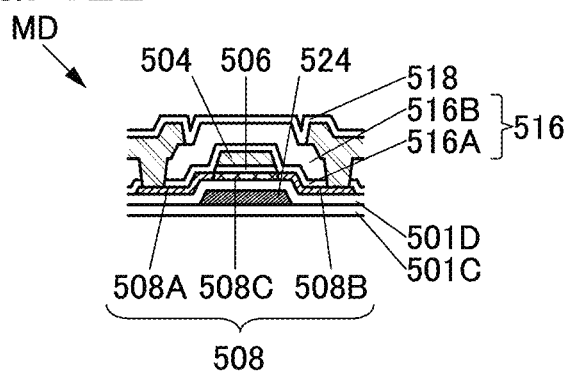

FIG. 12A is a diagram illustrating a structure of the functional panel of one embodiment of the present invention and is a cross-sectional view taken along the cutting line X1-X2 and the cutting line X3-X4 in FIG. 4A. FIG. 12B is a diagram illustrating part of FIG. 12A.

Structure Example 1 of Functional Panel 700

The functional panel described in this embodiment includes a functional layer 520 (see FIG. 9).

Structure Example 1 of Functional Layer 520

The functional layer 520 includes the pixel circuit 530G (i,j) (see FIG. 9). The functional layer 520 includes, for example, the transistor M21 used in the pixel circuit 530G (i,j) (see FIG. 4 and FIG. 10A).

The functional layer 520 includes an opening portion 591G. The pixel circuit 530G(i,j) is electrically connected to the element 550G(i,j) through the opening portion 591G (see FIG. 9 and FIG. 10A).

Structure Example 2 of Functional Layer 520

The functional layer 520 includes the pixel circuit 530S (i,j) (see FIG. 9). The functional layer 520 includes, for example, the transistor used as the switch SW31 in the pixel circuit 530S(i,j) (see FIG. 9 and FIG. 11A).

The functional layer 520 includes an opening portion 591S, and the pixel circuit 530S(i,j) is electrically connected to the element 550S(i,j) through the opening portion 591S (see FIG. 9 and FIG. 11A).

Thus, the pixel circuit 530G(i,j) can be formed in the functional layer 520. The pixel circuit 530S(i,j) can be formed in the functional layer 520. A semiconductor film used in the pixel circuit 530S(i,j) can be formed in a step of forming a semiconductor film used in the pixel circuit 530G(i,j), for example. The manufacturing process can be simplified. Thus, a novel functional panel that is highly convenient, useful, or reliable can be provided.

Structure Example 3 of Functional Layer 520

The functional layer 520 includes the driver circuit GD (see FIG. 4A and FIG. 9). The functional layer 520 includes, for example, a transistor MD used in the driver circuit GD (see FIG. 9 and FIG. 12A).

The functional layer 520 includes the driver circuit RD and the reading circuit RC (see FIG. 9).

Thus, the semiconductor film used in the driver circuit GD can be formed in the step of forming the semiconductor film used in the pixel circuit 530G(i,j), for example. Semiconductor films used in the driver circuit RD and the reading circuit RC can be formed in the step of forming the semiconductor film used in the pixel circuit 530G(i,j), for example. The manufacturing process of the functional panel can be simplified. Thus, a novel functional panel that is highly convenient, useful, or reliable can be provided.

<<Structure Example of Transistor>>

A bottom-gate transistor, a top-gate transistor, or the like can be used in the functional layer 520. Specifically, a transistor can be used as a switch.

The transistor includes a semiconductor film 508, a conductive film 504, a conductive film 512A, and a conductive film 512B (see FIG. 10B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region interposed between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The semiconductor film 508 is interposed between a region of the conductive film 524 and the conductive film 504. The conductive film 524 has a function of a second gate electrode.

Note that the semiconductor film used in the transistor of the driver circuit can be formed in the step of forming the semiconductor film used in the transistor of the pixel circuit. A semiconductor film having the same composition as the semiconductor film used in the transistor of the pixel circuit can be used in the driver circuit, for example.

Structure Example 1 of Semiconductor Film 508

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a functional panel having less display unevenness than a functional panel using polysilicon for the semiconductor film 508, for example, can be provided. The size of the functional panel can be easily increased.

[Polysilicon]

For example, polysilicon can be used for the semiconductor film 508. In this case, the field-effect mobility of the transistor can be higher than that of a transistor using hydrogenated amorphous silicon for the semiconductor film 508, for example. The driving capability can be higher than that of a transistor using hydrogenated amorphous silicon for the semiconductor film 508, for example. The aperture ratio of the pixel can be higher than that in the case of using a transistor that uses hydrogenated amorphous silicon for the semiconductor film 508, for example.

The reliability of the transistor can be higher than that of a transistor using hydrogenated amorphous silicon for the semiconductor film 508, for example.

The temperature required for manufacture of the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over the same substrate where the pixel circuit is formed. The number of components included in an electronic device can be reduced.

[Single Crystal Silicon]

For example, single crystal silicon can be used for the semiconductor film 508. In this case, a functional panel can have higher resolution than a functional panel using hydrogenated amorphous silicon for the semiconductor film 508, for example. A functional panel having less display unevenness than a functional panel using polysilicon for the semiconductor film 508, for example, can be provided. Smart glasses or a head-mounted display can be provided, for example.

Structure Example 2 of Semiconductor Film 508

For example, a metal oxide can be used for the semiconductor film 508. In this case, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

The pixel circuit can hold the imaging signal for a longer time than a pixel circuit utilizing a transistor using amorphous silicon for a semiconductor film. Specifically, the second selection signal can be supplied at a frequency lower than 30 Hz, preferably lower than 1 Hz, further preferably less than once per minute. Accordingly, an image can be taken by a global shutter method. An image of a moving object can be taken while distortion is inhibited.

A transistor using an oxide semiconductor can be used, for example. Specifically, an oxide semiconductor containing indium, an oxide semiconductor containing indium, gallium, and zinc, an oxide semiconductor containing indium, gallium, zinc, and tin can be used for the semiconductor film.

A transistor having a lower leakage current in an off state than a transistor using amorphous silicon for a semiconductor film can be used, for example. Specifically, a transistor using an oxide semiconductor for a semiconductor film can be used as a switch or the like. In that case, a potential of a floating node can be held for a longer time than in a circuit in which a transistor using amorphous silicon is used as a switch.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing tantalum and nitrogen is interposed between a region of the film containing copper and the insulating film 506.

A stacked film in which a 400-nm-thick film containing silicon and nitrogen and a 200-nm-thick film containing silicon, oxygen, and nitrogen are stacked can be used as the insulating film 506, for example. Note that the film containing silicon, oxygen, and nitrogen is interposed between a region of the film containing silicon and nitrogen and the semiconductor film 508.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon for a semiconductor can be easily remodeled into a manufacturing line for a bottom-gate transistor using an oxide semiconductor for a semiconductor, for example. Furthermore, a manufacturing line for a top-gate transistor using polysilicon for a semiconductor can be easily remodeled into a manufacturing line for a top-gate transistor using an oxide semiconductor for a semiconductor, for example. In either remodeling, an existing manufacturing line can be effectively utilized.

Accordingly, flickering of a display can be inhibited. Power consumption can be reduced. A moving image with quick movements can be smoothly displayed. A photograph and the like can be displayed with a wide range of grayscale. Thus, a novel functional panel that is highly convenient, useful, or reliable can be provided.

Structure Example 3 of Semiconductor Film 508

For example, a compound semiconductor can be used for the semiconductor of the transistor. Specifically, a semiconductor containing gallium arsenide can be used.

For example, an organic semiconductor can be used for the semiconductor of the transistor. Specifically, an organic semiconductor containing any of polyacenes or graphene can be used for the semiconductor film.

<<Structure Example of Capacitor>>

A capacitor includes one conductive film, a different conductive film, and an insulating film. The insulating film includes a region interposed between the one conductive film and the different conductive film.

For example, a conductive film used as the source electrode or the drain electrode of the transistor, a conductive film used as the gate electrode, and an insulating film used as the gate insulating film can be used for the capacitor.

Structure Example 2 of Functional Layer 520

The functional layer 520 includes an insulating film 521, an insulating film 518, an insulating film 516, the insulating film 506, an insulating film 501C, and the like (see FIG. 10A and FIG. 10B).

The insulating film 521 includes a region interposed between the pixel circuit 530G$(i,j)$ and the element 550G$(i, j)$.

The insulating film 518 includes a region interposed between the insulating film 521 and the insulating film 501C.

The insulating film 516 includes a region interposed between the insulating film 518 and the insulating film 501C.

The insulating film 506 includes a region interposed between the insulating film 516 and the insulating film 501C.

[Insulating Film 521]

A film in which an insulating film 521A and an insulating film 521B are stacked can be used as the insulating film 521. An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

The insulating film 521 may be formed using a photosensitive material. Specifically, a film formed using photosensitive polyimide, a photosensitive acrylic resin, or the like can be used as the insulating film 521.

Thus, the insulating film 521 can eliminate a step due to various components overlapping with the insulating film 521, for example.

[Insulating Film 518]

The material that can be used for the insulating film 521, for example, can be used for the insulating film 518.

For example, a material having a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

A film in which an insulating film 516A and an insulating film 516B are stacked can be used as the insulating film 516. The material that can be used for the insulating film 521, for example, can be used for the insulating film 516.

Specifically, a film formed by a manufacturing method different from that of the insulating film 518 can be used as the insulating film 516.

[Insulating Film 506]

The material that can be used for the insulating film 521, for example, can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region interposed between the insulating film 501C and the insulating film 516.

The material that can be used for the insulating film 506, for example, can be used for the insulating film 501D.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the element 550G($i,j$), the element 550S($i,j$), or the like can be inhibited.

Structure Example 3 of Functional Layer 520

The functional layer 520 includes a conductive film, a wiring, and a terminal. A material having conductivity can be used for the wiring, an electrode, the terminal, the conductive film, and the like.

[Wiring and the Like]

For example, an inorganic conductive material, an organic conductive material, a metal, a conductive ceramic, or the like can be used for the wiring and the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring and the like. Alternatively, an alloy containing the above-described metal element, or the like can be used for the wiring and the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring and the like.

Specifically, a conductive oxide such as indium oxide, indium tin oxide, indium zinc oxide, zinc oxide, or zinc oxide to which gallium is added can be used for the wiring and the like.

Specifically, a film containing graphene or graphite can be used for the wiring and the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring and the like. Specifically, a nanowire containing silver can be used.

Specifically, a conductive polymer can be used for the wiring and the like.

Note that a terminal 519B can be electrically connected to a flexible printed circuit FPC1 using a conductive material, for example (see FIG. 9). Specifically, the terminal 519B can be electrically connected to the flexible printed circuit FPC1 using a conductive material CP.

Structure Example 2 of Functional Panel 700

The functional panel 700 includes a base material 510, a base material 770, and a sealant 705 (see FIG. 10A). In addition, the functional panel 700 includes a structure body KB.

<<Base Material 510 and Base Material 770>>

A material having a light-transmitting property can be used for the base material 510 or the base material 770.

For example, a flexible material can be used for the base material 510 or the base material 770. Thus, a flexible functional panel can be provided.

For example, a material with a thickness smaller than or equal to 0.7 mm and larger than or equal to 0.1 mm can be used. Specifically, a material polished to a thickness of approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be manufactured.

For the base material 510 or the base material 770, an organic material, an inorganic material, a composite material of an organic material and an inorganic material, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Aluminosilicate glass, tempered glass, chemically tempered glass, sapphire, or the like can be suitably used for the base material 510 or the base material 770 that is provided on the side close to a user of the functional panel. Thus, the functional panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate or a polycrystalline semiconductor substrate of silicon or silicon carbide, a compound semiconductor substrate of silicon germanium or the like, an SOI substrate, or the like can be used as the base material 510 or the base material 770. Thus, a semiconductor element can be formed on the base material 510 or the base material 770.

For example, an organic material such as a resin, a resin film, or plastic can be used for the base material 510 or the base material 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base material 510 or the base material 770. For example, a resin film, a resin plate, a stacked-layer material, or the like containing any of these materials can be used. Thus, the weight can be reduced. The frequency of occurrence of breakage or the like due to dropping can be reduced, for example.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into a resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Diffusion of impurities contained in glass or a resin can be prevented. Diffusion of impurities that pass through a resin can be prevented.

Furthermore, paper, wood, or the like can be used for the base material 510 or the base material 770.

For example, a material having heat resistance high enough to withstand heat treatment in the manufacturing process can be used for the base material 510 or the base material 770. Specifically, a material having heat resistance to heat applied in the formation process of directly forming the transistor, the capacitor, or the like can be used for the base material 510 or the base material 770.

For example, a method in which an insulating film, a transistor, a capacitor, or the like is formed on a process substrate having heat resistance to heat applied in the manufacturing process, and the formed insulating film, transistor, capacitor, or the like is transferred to the base material 510 or the base material 770 can be used. Accordingly, an insulating film, a transistor, a capacitor, or the like can be formed on a flexible substrate, for example.

<<Sealant 705>>

The sealant 705 includes a region interposed between the functional layer 520 and the base material 770 and has a function of bonding the functional layer 520 and the base material 770 together (see FIG. 10A).

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<<Structure Body KB>>

The structure body KB includes a region interposed between the functional layer 520 and the base material 770. The structure body KB has a function of providing a predetermined space between the functional layer 520 and the base material 770.

Structure Example 2 of Functional Panel 700

Figure 13A:
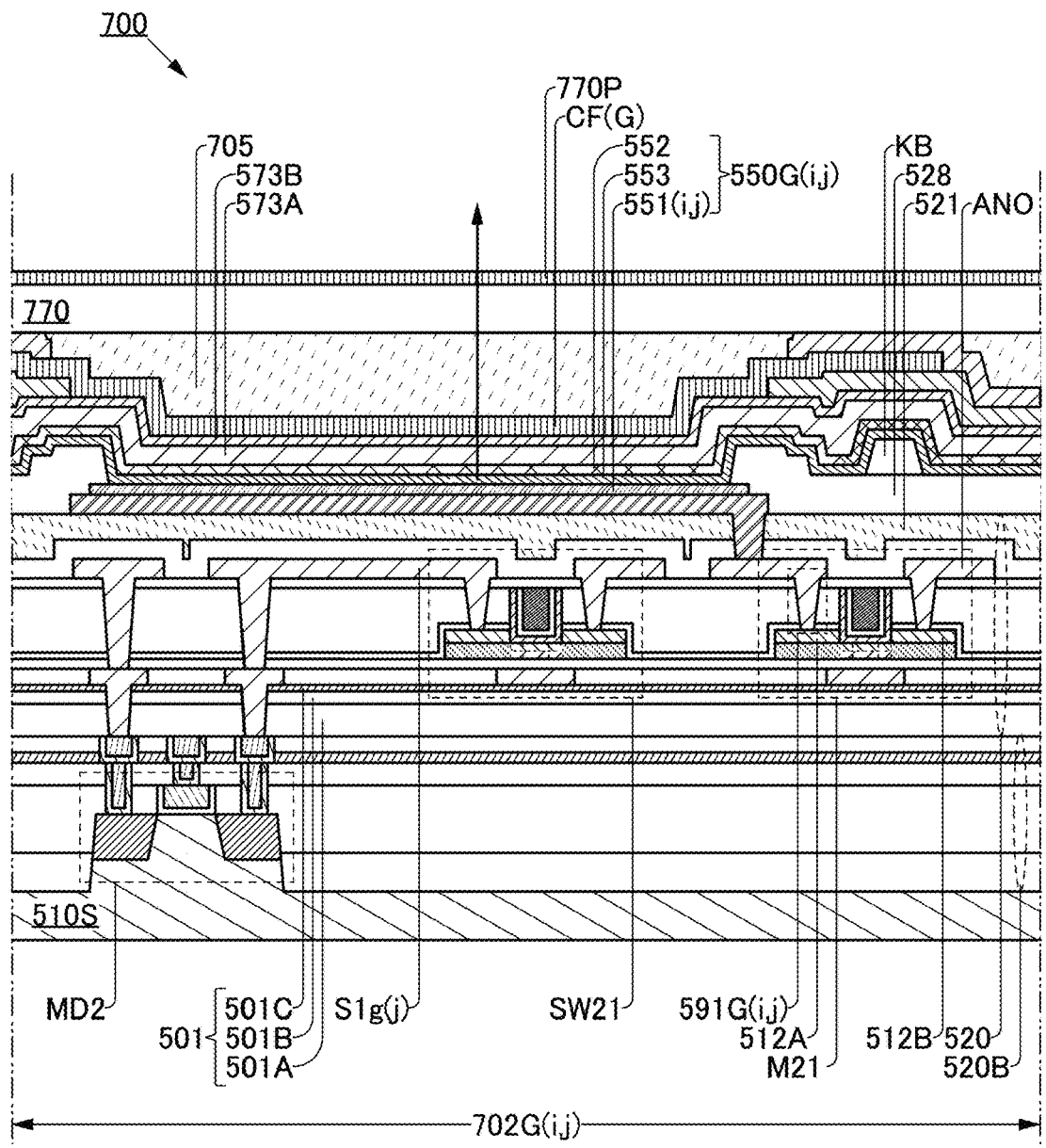
FIG. 13A and FIG. 13C are cross-sectional views illustrating a structure of a functional panel of an embodiment.
Figure 13B:
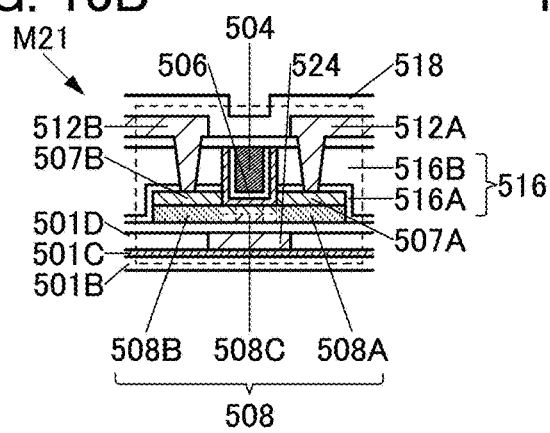

The functional panel described in this embodiment includes the functional layer 520 and a functional layer 520B (see FIG. 13A). The functional layer 520 includes the transistor M21, and the transistor M21 includes a conductive film 507A and a conductive film 507B (see FIG. 13B). The functional layer 520B includes the driver circuit SD (see FIG. 13A).

An insulating film 501 can be used for the functional layer 520. The insulating film 501 includes the insulating film 501C, an insulating film 501B, and an insulating film 501A. The insulating film 501B includes a region interposed between the insulating film 501C and the insulating film 501A. For example, a film containing silicon and nitrogen can be used as the insulating film 501C. Thus, diffusion of impurities into the driver circuit SD can be inhibited. Note that the impurities might cause a malfunction.

<<Structure Example of Functional Layer 520B>>

The functional layer 520B includes the driver circuit SD, the driver circuit SD includes a transistor MD2, and the transistor MD2 includes a semiconductor containing a Group 14 element. As the transistor MD2, a transistor formed using a single crystal silicon substrate can be used, for example.

Figure 13C:
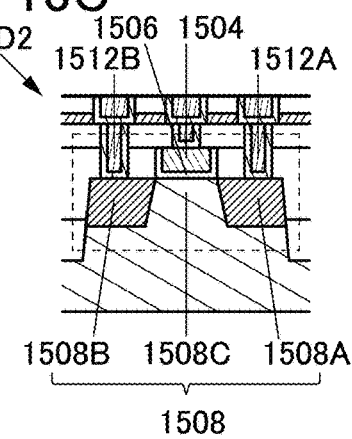

The transistor MD2 includes a semiconductor 1508, a conductive film 1504, a conductive film 1512A, and a conductive film 1512B (see FIG. 13C).

The semiconductor 1508 includes a region 1508A electrically connected to the conductive film 1512A and a region 1508B electrically connected to the conductive film 1512B. The semiconductor 1508 includes a region 1508C between the region 1508A and the region 1508B.

The conductive film 1504 includes a region overlapping with the region 1508C, and the conductive film 1504 has a function of a gate electrode.

An insulating film 1506 includes a region interposed between the semiconductor 1508 and the conductive film 1504. The insulating film 1506 has a function of a gate insulating film.

The conductive film 1512A has one of a function of a source electrode and a function of a drain electrode, and the conductive film 1512B has the other of the function of the source electrode and the function of the drain electrode.

Note that this embodiment can be combined with any of the other embodiments in this specification as appropriate.

Embodiment 4

In this embodiment, a structure of a transistor that can be used in a functional panel of one embodiment of the present invention will be described with reference to FIG. 26. For example, the structure can be used for the transistor M21, the transistor MD, or the like of the functional panel of one embodiment of the present invention, which is described in Embodiment 2 or Embodiment 3.

<Structure Example of Semiconductor Device>

Figure 26A:
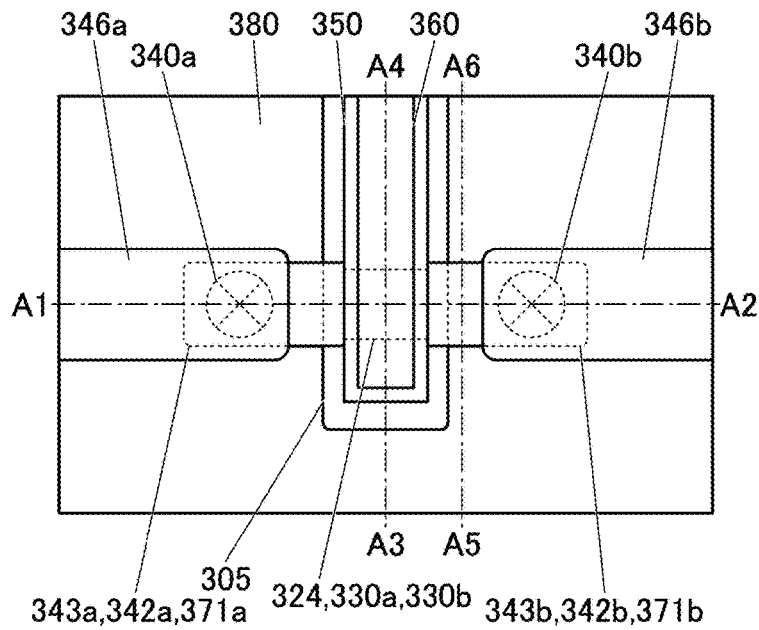
FIG. 26A is a top view of a semiconductor device of one embodiment of the present invention.
Figure 26C:
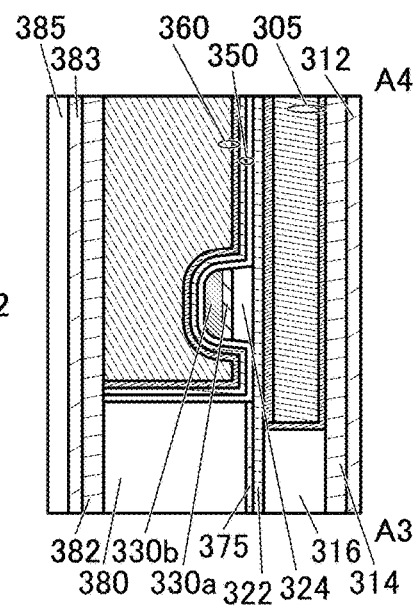
FIG. 26B to FIG. 26D are cross-sectional views of the semiconductor device of one embodiment of the present invention.
Figure 26B:
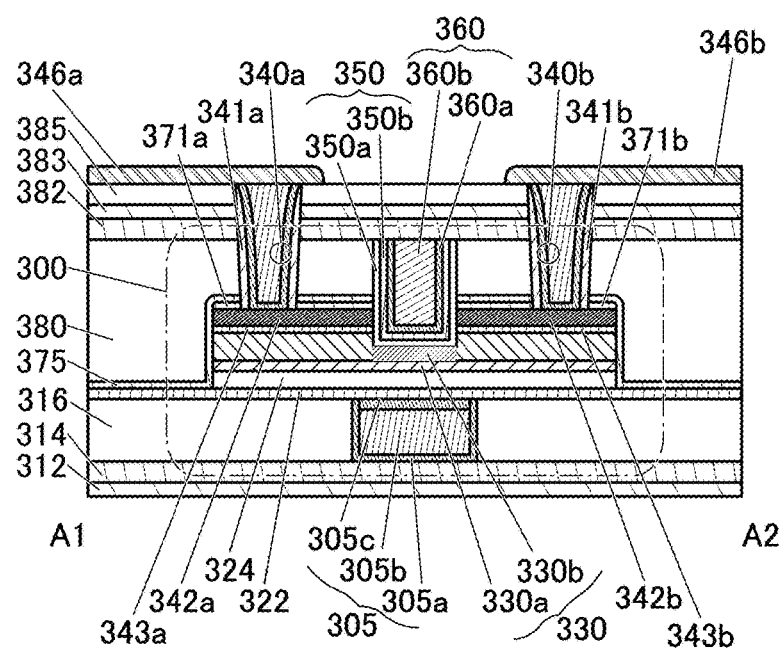
Figure 26D:
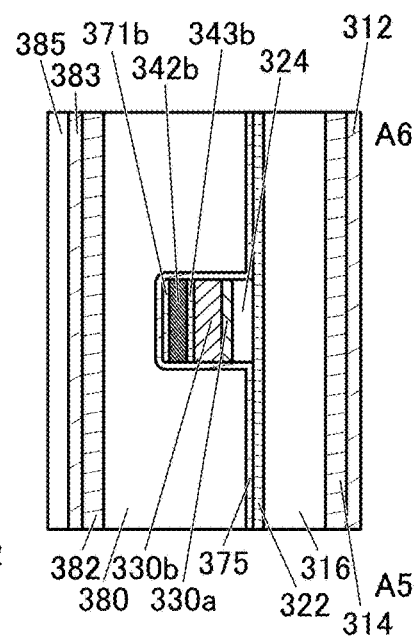

A structure of a semiconductor device including a transistor 300 is described with reference to FIG. 26. FIG. 26A to FIG. 26D are a top view and cross-sectional views of the semiconductor device including the transistor 300. FIG. 26A is a top view of the semiconductor device. FIG. 26B to FIG. 26D are cross-sectional views of the semiconductor device. Here, FIG. 26B is a cross-sectional view of a portion indicated by a dashed-dotted line A1-A2 in FIG. 26A and is a cross-sectional view in the channel length direction of the transistor 300. FIG. 26C is a cross-sectional view of a portion indicated by a dashed-dotted line A3-A4 in FIG. 26A and is a cross-sectional view in the channel width direction of the transistor 300. FIG. 26D is a cross-sectional view of a portion indicated by a dashed-dotted line A5-A6 in FIG. 26A. Note that for clarity of the drawing, some components are not illustrated in the top view of FIG. 26A.

An insulator, a conductor, an oxide, or a semiconductor described below can be deposited by a sputtering method, a chemical vapor deposition (CVD) method, a molecular beam epitaxy (MBE) method, a pulsed laser deposition (PLD) method, an atomic layer deposition (ALD) method, or the like. In this specification and the like, the term "insulator" can be replaced with an insulating film or an insulating layer. Furthermore, the term "conductor" can be replaced with a conductive film or a conductive layer. The term "oxide" can be replaced with an oxide film or an oxide layer. Moreover, the term "semiconductor" can be replaced with a semiconductor film or a semiconductor layer.

The semiconductor device of one embodiment of the present invention includes an insulator 312 over a substrate (not illustrated), an insulator 314 over the insulator 312, the transistor 300 over the insulator 314, an insulator 380 over the transistor 300, an insulator 382 over the insulator 380, an insulator 383 over the insulator 382, and an insulator 385 over the insulator 383. The insulator 312, the insulator 314, the insulator 380, the insulator 382, the insulator 383, and the insulator 385 function as interlayer insulating films. A conductor 340 (a conductor 340a and a conductor 340b) that is electrically connected to the transistor 300 and functions as a plug is also included. Note that an insulator 341 (an insulator 341a and an insulator 341b) is provided in contact with a side surface of the conductor 340 functioning as a plug. A conductor 346 (a conductor 346a and a conductor 346b) that is electrically connected to the conductor 340 and functions as a wiring is provided over the insulator 385 and the conductor 340.

The insulator 341a is provided in contact with an inner wall of an opening in the insulator 380, the insulator 382, the insulator 383, and the insulator 385, a first conductor of the conductor 340a is provided in contact with a side surface of the insulator 341a, and a second conductor of the conductor 340a is provided on the inner side of the first conductor. The insulator 341b is provided in contact with an inner wall of an opening in the insulator 380, the insulator 382, the insulator 383, and the insulator 385, a first conductor of the conductor 340b is provided in contact with a side surface of the insulator 341b, and a second conductor of the conductor 340b is provided on the inner side of the first conductor. A top surface of the conductor 340 can be substantially level with a top surface of the insulator 385 in a region overlapping with the conductor 346. Although the first conductor of the conductor 340 and the second conductor of the conductor 340 are stacked in the transistor 300, the present invention is not limited thereto. For example, the conductor 340 may be provided as a single layer or to have a stacked-layer structure of three or more layers. In the case where a structure body has a stacked-layer structure, layers may be distinguished by ordinal numbers corresponding to the formation order.

[Transistor 300]

As illustrated in FIG. 26A to FIG. 26D, the transistor 300 includes an insulator 316 over the insulator 314; a conductor 305 (a conductor 305a, a conductor 305b, and a conductor 305c) placed to be embedded in the insulator 316; an insulator 322 over the insulator 316 and the conductor 305; an insulator 324 over the insulator 322; an oxide 330a over the insulator 324; an oxide 330b over the oxide 330a; an oxide 343 (an oxide 343a and an oxide 343b) over the oxide 330b; a conductor 342a over the oxide 343a; an insulator 371a over the conductor 342a; a conductor 342b over the oxide 343b; an insulator 371b over the conductor 342b; an insulator 350 (an insulator 350a and an insulator 350b) over the oxide 330b; a conductor 360 (a conductor 360a and a conductor 360b) positioned over the insulator 350 and overlaps with part of the oxide 330b; and an insulator 375 placed to cover the insulator 322, the insulator 324, the oxide 330a, the oxide 330b, the oxide 343a, the oxide 343b, the conductor 342a, the conductor 342b, the insulator 371a, and the insulator 371b.

Hereinafter, the oxide 330a and the oxide 330b are collectively referred to as an oxide 330 in some cases. The conductor 342a and the conductor 342b are collectively referred to as a conductor 342 in some cases. The insulator 371a and the insulator 371b are collectively referred to as an insulator 371 in some cases.

An opening reaching the oxide 330b is provided in the insulator 380 and the insulator 375. The insulator 350 and the conductor 360 are placed in the opening. In the channel length direction of the transistor 300, the conductor 360 and the insulator 350 are provided between the insulator 371a, the conductor 342a, and the oxide 343a, and the insulator 371b, the conductor 342b, and the oxide 343b. The insulator 350 includes a region in contact with a side surface of the conductor 360 and a region in contact with a bottom surface of the conductor 360.

The oxide 330 preferably includes the oxide 330a placed over the insulator 324 and the oxide 330b placed over the oxide 330a. When the oxide 330a is provided under the oxide 330b, diffusion of impurities into the oxide 330b from the components formed below the oxide 330a can be inhibited.

Although the oxide 330 in the transistor 300 has a structure in which two layers of the oxide 330a and the oxide 330b are stacked, the present invention is not limited thereto. For example, the oxide 330 may have a single-layer structure of the oxide 330b or a stacked-layer structure of three or more layers, or the oxide 330a and the oxide 330b may each have a stacked-layer structure.

The conductor 360 functions as a first gate (also referred to as a top gate) electrode and the conductor 305 functions as a second gate (also referred to as a back gate) electrode.

In addition, the insulator 350 functions as a first gate insulating film, and the insulator 324 and the insulator 322 each function as a second gate insulating film. The conductor 342a functions as one of a source electrode and a drain electrode, and the conductor 342b functions as the other of the source electrode and the drain electrode. At least part of a region of the oxide 330 which overlaps with the conductor 360 functions as a channel formation region.

The oxide 330b includes one of a source region and a drain region in a region overlapping with the conductor 342a, and the other of the source region and the drain region in a region overlapping with the conductor 342b. The oxide 330b includes a channel formation region (a region indicated by a shaded portion in FIG. 26B) in a region interposed between the source region and the drain region.

The channel formation region has fewer oxygen vacancies or lower impurity concentration than the source region and the drain region, and thus is a high-resistance region with a low carrier concentration. Here, the carrier concentration of the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration of the channel formation region is not particularly limited and can be, for example, $1 \times 10^{-9}$ cm$^3$.

Although the channel formation region, the source region, and the drain region are formed in the oxide 330b in the above example, the present invention is not limited thereto. For example, the channel formation region, the source region, and the drain region are formed also in the oxide 330a in some cases.

In the transistor 300, a metal oxide functioning as a semiconductor (such a metal oxide is hereinafter also referred to as an oxide semiconductor) is preferably used for the oxide 330 (the oxide 330a and the oxide 330b) including the channel formation region.

The metal oxide functioning as a semiconductor has a band gap of preferably 2 eV or higher, further preferably 2.5 eV or higher. With the use of a metal oxide having such a wide band gap, the off-state current of the transistor can be reduced.

For the oxide 330, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. Alternatively, an In—Ga oxide, an In—Zn oxide, or indium oxide may be used as the oxide 330.

Here, the atomic ratio of In to the element M in the metal oxide used for the oxide 330b is preferably greater than the atomic ratio of In to the element M in the metal oxide used for the oxide 330a.

Specifically, as the oxide 330a, a metal oxide with In:M:Zn=1:3:4 [atomic ratio] or a composition in the vicinity thereof, or In:M:Zn=1:1:0.5 [atomic ratio] or a composition in the vicinity thereof is used. As the oxide 330b, a metal oxide with In:M:Zn=1:1:1 [atomic ratio] or a composition in the vicinity thereof, or In:M:Zn=4:2:3 [atomic ratio] or a composition in the vicinity thereof is used. Note that a composition in the vicinity includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

The oxide 330a is placed under the oxide 330b, whereby impurities and oxygen can be inhibited from being diffused into the oxide 330b from structure bodies formed below the oxide 330a.

When the oxide 330a and the oxide 330b contain a common element (as the main component) besides oxygen, the density of defect states at an interface between the oxide 330a and the oxide 330b can be made low. Since the density of defect states at the interface between the oxide 330a and the oxide 330b can be made low, the influence of interface scattering on carrier conduction is small, and a high on-state current can be obtained.

The oxide 330a and the oxide 330b preferably have crystallinity. It is particularly preferable to use a CAAC-OS (c-axis aligned crystalline oxide semiconductor) for the oxide 330b.

The CAAC-OS is a metal oxide having a dense structure with high crystallinity and a small amount of impurities or defects (e.g., oxygen vacancies ($V_O$)). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is unlikely to occur. Thus, a metal oxide including a CAAC-OS is physically stable. Therefore, the metal oxide including a CAAC-OS is resistant to heat and has high reliability.

At least one of the insulator 312, the insulator 314, the insulator 371, the insulator 375, the insulator 382, and the insulator 383 preferably functions as a barrier insulating film, which inhibits diffusion of impurities such as water and hydrogen from the substrate side or above the transistor 300 into the transistor 300. Thus, for at least one of the insulator 312, the insulator 314, the insulator 371, the insulator 375, the insulator 382, and the insulator 383, an insulating material which has a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material which has a function of inhibiting diffusion of oxygen (e.g., at least one of an oxygen atom, an oxygen molecule, and the like) (through which the above oxygen is less likely to pass).

Note that in this specification, a barrier insulating film refers to an insulating film having a barrier property. A barrier property in this specification means a function of inhibiting diffusion of a targeted substance (also referred to as having low permeability). Alternatively, a barrier property in this specification means a function of capturing and fixing (also referred to as gettering) a targeted substance.

Aluminum oxide, magnesium oxide, hafnium oxide, gallium oxide, indium gallium zinc oxide, silicon nitride, silicon nitride oxide, or the like can be used for the insulator 312, the insulator 314, the insulator 371, the insulator 375, the insulator 382, and the insulator 383. For example, silicon nitride, which has a higher hydrogen barrier property, is preferably used for the insulator 312, the insulator 375, and the insulator 383. For example, aluminum oxide or magnesium oxide, which has a function of capturing or fixing more hydrogen, is preferably used for the insulator 314, the insulator 371, and the insulator 382. Accordingly, impurities such as water and hydrogen can be inhibited from diffusing to the transistor 300 side from the substrate side through the insulator 312 and the insulator 314. Furthermore, impurities such as water and hydrogen can be inhibited from diffusing to the transistor 300 side from an interlayer insulating film and the like positioned outside the insulator 383. Alternatively, oxygen contained in the insulator 324 and the like can be inhibited from diffusing to the substrate side through the insulator 312 and the insulator 314. Alternatively, oxygen contained in the insulator 380 and the like can be inhibited from diffusing to above the transistor 300 through the insulator 382 and the like. In this manner, the transistor 300 is preferably surrounded by the insulator 312, the insulator 314, the insulator 371, the insulator 375, the insulator 382, and the insulator 383 having a function of inhibiting diffusion of oxygen and impurities such as water and hydrogen.

Here, an oxide having an amorphous structure is preferably used for the insulator 312, the insulator 314, the insulator 371, the insulator 375, the insulator 382, and the insulator 383. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 300 or provided in the vicinity of the transistor 300, hydrogen contained in the transistor 300 or hydrogen in the vicinity of the transistor 300 can be captured or fixed. In particular, hydrogen contained in the channel formation region of the transistor 300 is preferably captured or fixed. The metal oxide having an amorphous structure is used as the component of the transistor 300 or provided in the vicinity of the transistor 300, whereby the transistor 300 and a semiconductor device which have favorable characteristics and high reliability can be manufactured.

Although the insulator 312, the insulator 314, the insulator 371, the insulator 375, the insulator 382, and the insulator 383 preferably have an amorphous structure, they may partly include a region with a polycrystalline structure. Alternatively, the insulator 312, the insulator 314, the insulator 371, the insulator 375, the insulator 382, and the insulator 383 may have a multilayer structure in which a layer with an amorphous structure and a layer with a polycrystalline structure are stacked. For example, a stacked-layer structure in which a layer with a polycrystalline structure is formed over a layer with an amorphous structure may be employed.

The insulator 312, the insulator 314, the insulator 371, the insulator 375, the insulator 382, and the insulator 383, can be deposited by a sputtering method, for example. Since a sputtering method does not need to use hydrogen as a deposition gas, the hydrogen concentrations in the insulator 312, the insulator 314, the insulator 371, the insulator 375, the insulator 382, and the insulator 383 can be reduced. Note that the deposition method is not limited to a sputtering method, and a CVD method, an MBE method, a PLD method, an ALD method, or the like can be used as appropriate.

The insulator 316, the insulator 380, and the insulator 385 preferably have a lower dielectric constant than the insulator 314. The use of a material having a low dielectric constant for the interlayer insulating film can reduce the parasitic capacitance between wirings. For example, for the insulator 316, the insulator 380, and the insulator 385, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The conductor 305 is placed to overlap with the oxide 330 and the conductor 360. Here, the conductor 305 is preferably provided to be embedded in an opening formed in the insulator 316.

The conductor 305 includes the conductor 305a, the conductor 305b, and the conductor 305c. The conductor 305a is provided in contact with a bottom surface and a side wall of the opening. The conductor 305b is provided to be embedded in a recessed portion formed in the conductor 305a. Here, a top surface of the conductor 305b is lower in level than a top surface of the conductor 305a and a top surface of the insulator 316. The conductor 305c is provided in contact with the top surface of the conductor 305b and a side surface of the conductor 305a. Here, a top surface of the conductor 305c is substantially level with the top surfaces of the conductor 305a and the insulator 316. That is, the conductor 305b is surrounded by the conductor 305a and the conductor 305c.

A conductive material that can be used for the conductor 360a described later may be used for the conductor 305a and the conductor 305c. A conductive material that can be used for the conductor 360b described later may be used for the conductor 305b. Although the transistor 300 having a structure in which the conductor 305 is a stack of the conductor 305a, the conductor 305b, and the conductor 305c is illustrated, the present invention is not limited thereto. For example, the conductor 305 may be provided to have a single-layer structure or a stacked-layer structure of two layers or four or more layers.

The insulator 322 and the insulator 324 function as a gate insulating film.

It is preferable that the insulator 322 have a function of inhibiting diffusion of hydrogen (e.g., at least one of a hydrogen atom, a hydrogen molecule, and the like). In addition, it is preferable that the insulator 322 have a function of inhibiting diffusion of oxygen (e.g., at least one of an oxygen atom, an oxygen molecule, and the like). For example, the insulator 322 preferably has a function of further inhibiting diffusion of one or both of hydrogen and oxygen as compared to the insulator 324.

As the insulator 322, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. As the insulator 322, a barrier insulating film that can be used for the insulator 314 or the like may be used.

Silicon oxide, silicon oxynitride, or the like can be used as appropriate for the insulator 324. When the insulator 324 containing oxygen is provided in contact with the oxide 330, oxygen vacancies in the oxide 330 can be reduced, leading to an improvement in the reliability of the transistor 300. The insulator 324 is preferably processed into an island shape so as to overlap with the oxide 330a. In that case, the insulator 375 is in contact with a side surface of the insulator 324 and a top surface of the insulator 322. Accordingly, the insulator 324 and the insulator 380 can be apart from each other by the insulator 375; thus, diffusion of oxygen contained in the insulator 380 into the insulator 324 can be reduced, so that the amount of oxygen in the insulator 324 can be prevented from being excessively large.

Note that the insulator 322 and the insulator 324 may each have a stacked-layer structure of two or more layers. In that case, without limitation to a stacked-layer structure formed of the same material, a stacked-layer structure formed of different materials may be employed. Note that FIG. 26B and the like illustrate the structure in which the insulator 324 is formed into an island shape so as to overlap with the oxide 330a; however, the present invention is not limited to thereto. In the case where the amount of oxygen contained in the insulator 324 can be adjusted appropriately, a structure in which the insulator 324 is not pattered in a manner similar to that of the insulator 322 may be employed.

The oxide 343a and the oxide 343b are provided over the oxide 330b. The oxide 343a and the oxide 343b are provided to be apart from each other with the conductor 360 therebetween. The oxide 343 (the oxide 343a and the oxide 343b) preferably has a function of inhibiting passage of oxygen. The oxide 343 having a function of inhibiting passage of oxygen is preferably placed between the oxide 330b and the conductor 342 functioning as the source electrode and the drain electrode, in which case the electric resistance between the conductor 342 and the oxide 330b can be reduced. In the case where the electrical resistance between the conductor 342 and the oxide 330b can be sufficiently reduced, the oxide 343 is not necessarily provided.

A metal oxide containing the element M may be used as the oxide 343. In particular, aluminum, gallium, yttrium, or tin is preferably used as the element M. The concentration of the element M in the oxide 343 is preferably higher than that in the oxide 330b. Furthermore, gallium oxide may be used as the oxide 343. A metal oxide such as an In-M-Zn oxide may be used as the oxide 343. Specifically, the atomic ratio of the element M to In in the metal oxide used as the oxide 343 is preferably greater than the atomic ratio of the element M to In in the metal oxide used as the oxide 330b. The thickness of the oxide 343 is preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm.

It is preferable that the conductor 342a be provided in contact with a top surface of the oxide 343a and the conductor 342b be provided in contact with a top surface of the oxide 343b. Each of the conductor 342a and the conductor 342b functions as a source electrode or a drain electrode of the transistor 300.

For the conductor 342 (the conductor 342a and the conductor 342b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

No curved surface is preferably formed between a side surface of the conductor 342 and a top surface of the conductor 342. When no curved surface is formed in the conductor 342, the conductor 342 can have a large cross-sectional area in the channel width direction as illustrated in FIG. 26D. Accordingly, the conductivity of the conductor 342 is increased, so that the on-state current of the transistor 300 can be increased.

The insulator 371a is provided in contact with a top surface of the conductor 342a, and the insulator 371b is provided in contact with a top surface of the conductor 342b.

The insulator 375 is provided in contact with the top surface of the insulator 322, the side surface of the insulator 324, a side surface of the oxide 330a, a side surface of the oxide 330b, a side surface of the oxide 343, the side surface of the conductor 342, and a side surface and a top surface of the insulator 371. The insulator 375 includes an opening formed in a region where the insulator 350 and the conductor 360 are provided.

The insulator 314, the insulator 371, and the insulator 375, which have a function of capturing impurities such as hydrogen, are provided in a region interposed between the insulator 312 and the insulator 383, whereby impurities such as hydrogen contained in the insulator 324, the insulator 316, or the like can be captured and the amount of hydrogen in the region can be kept constant. In that case, the insulator 314, the insulator 371, and the insulator 375 preferably contain aluminum oxide with an amorphous structure.

The insulator 350 includes the insulator 350a and the insulator 350b over the insulator 350a and functions as a gate insulating film. The insulator 350a is preferably placed in contact with a top surface of the oxide 330b, the side surface of the oxide 343, the side surface of the conductor 342, the side surface of the insulator 371, a side surface of the insulator 375, and a side surface of the insulator 380. The thickness of the insulator 350 is preferably larger than or equal to 1 nm and smaller than or equal to 20 nm.

For the insulator 350a, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride are preferable because they are thermally stable. As in the insulator 324, the concentration of impurities such as water and hydrogen in the insulator 350a is preferably reduced.

It is preferable that the insulator 350a be formed using an insulator from which oxygen is released by heating and the insulator 350b be formed using an insulator that has a function of inhibiting the diffusion of oxygen. With such a structure, oxygen contained in the insulator 350a can be inhibited from diffusing into the conductor 360. That is, a reduction in the amount of oxygen supplied to the oxide 330 can be inhibited. In addition, oxidation of the conductor 360 due to oxygen contained in the insulator 350a can be inhibited. For example, the insulator 350b can be provided using a material similar to that for the insulator 322.

Specifically, for the insulator 350b, a metal oxide containing one kind or two or more kinds selected from hafnium, aluminum, gallium, yttrium, zirconium, tungsten, titanium, tantalum, nickel, germanium, magnesium, and the like or a metal oxide that can be used for the oxide 330 can be used. In particular, an insulator containing an oxide of one or both of aluminum and hafnium is preferably used. For the insulator, aluminum oxide, hafnium oxide, an oxide containing aluminum and hafnium (hafnium aluminate), or the like is preferably used. The thickness of the insulator 350b is preferably larger than or equal to 0.5 nm and smaller than or equal to 3.0 nm, further preferably larger than or equal to 1.0 nm and smaller than or equal to 1.5 nm.

Note that although the insulator 350 has a stacked-layer structure of two layers in FIG. 26B and FIG. 26C, the present invention is not limited thereto. The insulator 350 may have a single-layer structure or a stacked-layer structure of three or more layers.

The conductor 360 is provided over the insulator 350b and functions as a first gate electrode of the transistor 300. The conductor 360 preferably includes the conductor 360a and the conductor 360b placed over the conductor 360a. For example, the conductor 360a is preferably placed to cover a bottom surface and a side surface of the conductor 360b. Moreover, as illustrated in FIG. 26B and FIG. 26C, a top surface of the conductor 360 is substantially level with a top surface of the insulator 350. Although the conductor 360 has a two-layer structure of the conductor 360a and the conductor 360b in FIG. 26B and FIG. 26C, the conductor 360 may have a single-layer structure or a stacked-layer structure of three or more layers.

For the conductor 360a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 360a has a function of inhibiting diffusion of oxygen, the conductivity of the conductor 360b can be inhibited from being lowered because of oxidation due to oxygen contained in the insulator 350. As the conductive material having a function of inhibiting diffusion of oxygen, for example, titanium, titanium nitride, tantalum, tantalum nitride, ruthenium, or ruthenium oxide is preferably used.

The conductor 360 also functions as a wiring and thus is preferably a conductor having high conductivity. For example, a conductive material containing tungsten, copper, or aluminum as its main component can be used for the conductor 360b. The conductor 360b may have a stacked-layer structure; for example, a stacked-layer structure of the conductive material and titanium or titanium nitride may be employed.

In the transistor 300, the conductor 360 is formed in a self-aligned manner to fill the opening formed in the insulator 380 and the like. The formation of the conductor 360 in this manner allows the conductor 360 to be placed certainly in a region between the conductor 342a and the conductor 342b without alignment.

As illustrated in FIG. 26C, in the channel width direction of the transistor 300, with reference to a bottom surface of the insulator 322, the level of the bottom surface of the conductor 360 in a region where the conductor 360 and the oxide 330b do not overlap is preferably lower than the level of a bottom surface of the oxide 330b. When the conductor 360 functioning as the gate electrode covers a side surface and a top surface of the channel formation region of the oxide 330b with the insulator 350 and the like therebetween, the electric field of the conductor 360 is likely to act on the entire channel formation region of the oxide 330b. Thus, the on-state current of the transistor 300 can be increased and the frequency characteristics of the transistor 300 can be improved. When the bottom surface of the insulator 322 is a reference, the difference between the level of the bottom surface of the conductor 360 in a region where the oxide 330a and the oxide 330b do not overlap with the conductor 360 and the level of the bottom surface of the oxide 330b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 380 is provided over the insulator 375, and an opening is formed in a region where the insulator 350 and the conductor 360 are provided. In addition, a top surface of the insulator 380 may be planarized. In that case, the top surface of the insulator 380 is preferably aligned with the top surface of the insulator 350 and the top surface of the conductor 360.

The insulator 382 is provided in contact with the top surface of the insulator 380, the top surface of the insulator 350, and the top surface of the conductor 360. The insulator 382 preferably functions as a barrier insulating film that inhibits impurities such as water and hydrogen from diffusing into the insulator 380 from above and preferably has a function of capturing impurities such as hydrogen. The insulator 382 preferably functions as a barrier insulating film that inhibits passage of oxygen. As the insulator 382, an insulator such as aluminum oxide can be used, for example. The insulator 382, which has a function of capturing impurities such as hydrogen, is provided in contact with the insulator 380 in a region interposed between the insulator 312 and the insulator 383, whereby impurities such as hydrogen contained in the insulator 380 and the like can be captured and the amount of hydrogen in the region can be kept constant. It is particularly preferable to use aluminum oxide having an amorphous structure as the insulator 382 because hydrogen can be captured or fixed more effectively in some cases. Accordingly, the transistor 300 and a semiconductor device which have favorable characteristics and high reliability can be manufactured.

For the conductor 340a and the conductor 340b, a conductive material containing tungsten, copper, or aluminum as its main component is preferably used. The conductor 340a and the conductor 340b may each have a stacked-layer structure. In the case where the conductor 340 has a stacked-layer structure, the conductor in contact with the insulator 341 is preferably formed using a conductive material having a function of inhibiting transmission of impurities such as water and hydrogen. For example, any of the above conductive materials that can be used for the conductor 360a may be used.

For the insulator 341a and the insulator 341b, for example, an insulator such as silicon nitride, aluminum oxide, or silicon nitride oxide may be used. Since the insulator 341a and the insulator 341b are provided in contact with the insulator 383, the insulator 382, and the insulator 371, impurities such as water and hydrogen contained in the insulator 380 and the like can be inhibited from entering the oxide 330 through the conductor 340a and the conductor 340b.

The conductor 346 (the conductor 346a and the conductor 346b) functioning as a wiring may be placed in contact with a top surface of the conductor 340a and a top surface of the conductor 340b. The conductor 346 is preferably formed using a conductive material containing tungsten, copper, or aluminum as its main component. Furthermore, the conductor may have a stacked-layer structure and may be a stack of titanium or titanium nitride and the conductive material, for example. Note that the conductor may be formed to be embedded in an opening provided in an insulator.

Thus, a semiconductor device having favorable electrical characteristics can be provided. A semiconductor device having favorable reliability can be provided. A semiconductor device that can be miniaturized or highly integrated can be provided. A semiconductor device with low power consumption can be provided.

Note that this embodiment can be combined with any of the other embodiments in this specification as appropriate.

Embodiment 5

In this embodiment, structures of a functional panel of one embodiment of the present invention are described with reference to drawings.

Structure Example 1 of Functional Panel 700

The functional panel 700 includes the element 550G$(i,j)$ and the element 550S$(i,j)$ (see FIG. 9).

Structure Example 1 of Element 550G$(i,j)$

The electrode 550G$(i,j)$ includes the electrode 551G$(i,j)$, the electrode 552, and the layer 553 containing a light-emitting material (see FIG. 10A). The layer 553 containing a light-emitting material includes a region interposed between the electrode 551G$(i,j)$ and the electrode 552.

Structure Example 1 of Layer 553 Containing Light-Emitting Material

A stacked-layer material can be used for the layer 553 containing a light-emitting material, for example.

For example, a material emitting blue light, a material emitting green light, a material emitting red light, a material emitting infrared rays, or a material emitting ultraviolet rays can be used for the layer 553 containing a light-emitting material.

Structure Example 2 of Layer 553 Containing Light-Emitting Material

A stacked-layer material stacked to emit white light can be used for the layer 553 containing a light-emitting material, for example.

Specifically, a plurality of materials emitting light with different hues can be used for the layer 553 containing a light-emitting material.

For example, a stacked-layer material in which a layer containing a light-emitting material containing a fluorescent material that emits blue light and a layer containing materials that are other than fluorescent materials and emit green light and red light are stacked can be used for the layer 553 containing a light-emitting material. A stacked-layer material in which a layer containing a light-emitting material containing a fluorescent material that emits blue light and a layer containing a material that is other than a fluorescent material and emits yellow light are stacked can be used for the layer 553 containing a light-emitting material.

Note that the layer 553 containing a light-emitting material can be used with a coloring film CF overlapping, for example. Thus, light of a predetermined hue can be extracted from white light.

Structure Example 3 of Layer 553 Containing Light-Emitting Material

A stacked-layer material stacked to emit blue light or ultraviolet rays can be used for the layer 553 containing a light-emitting material, for example. A color conversion layer can be used to overlap with the layer 553 containing a light-emitting material, for example.

Structure Example 4 of Layer 553 Containing Light-Emitting Material

The layer 553 containing a light-emitting material includes a light-emitting unit. The light-emitting unit includes one region where electrons injected from one side are recombined with holes injected from the other side. The light-emitting unit contains a light-emitting material, and the light-emitting material releases energy generated by recombination of electrons and holes as light. Note that a hole-transport layer and an electron-transport layer can be used in the light-emitting unit. The hole-transport layer is placed closer to the positive electrode than the electron-transport layer is, and has higher hole mobility than the electron-transport layer.

A plurality of light-emitting units and an intermediate layer can be used for the layer 553 containing a light-emitting material, for example. The intermediate layer includes a region interposed between two light-emitting units. The intermediate layer includes a charge-generation region, and the intermediate layer has functions of supplying holes to the light-emitting unit placed on the cathode side and supplying electrons to the light-emitting unit placed on the anode side. Furthermore, a structure including a plurality of light-emitting units and an intermediate layer is referred to as a tandem light-emitting element in some cases.

Accordingly, the current efficiency of light emission can be increased. The density of current flowing through the light-emitting element at the same luminance can be reduced. The reliability of the light-emitting element can be increased.

For example, a light-emitting unit containing a material emitting light with one hue and a light-emitting unit containing a material emitting light with a different hue can be stacked and used for the layer 553 containing a light-emitting material. A light-emitting unit containing a material emitting light with one hue and a light-emitting unit containing a material emitting light with the same hue can be stacked and used for the layer 553 containing a light-emitting material. Specifically, two light-emitting units each containing a material emitting blue light can be stacked and used.

For the layer 553 containing a light-emitting material, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used.

[Electrode 551G$(i,j)$ and Electrode 552]

The material that can be used for the wiring or the like, for example, can be used for the electrode 551G$(i,j)$ or the electrode 552. Specifically, a material having a visible-light-transmitting property can be used for the electrode 551G$(i,j)$ or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material having a visible-light-transmitting property can be used.

For example, a metal film that transmits part of light and reflects another part of the light can be used for the electrode 551G$(i,j)$ or the electrode 552. The distance between the electrode 551G(i,j) and the electrode 552 is adjusted using the layer 553 containing a light-emitting material, for example.

Thus, a microcavity structure can be provided in the element 550G(i,j). Light of a predetermined wavelength can be extracted more efficiently than other light. Light with a narrow half width of a spectrum can be extracted. Light of a bright color can be extracted.

A film that efficiently reflects light, for example, can be used for the electrode 551G(i,j) or the electrode 552. Specifically, a material containing silver, palladium, and the like or a material containing silver, copper, and the like can be used for the metal film.

The electrode 551G(i,j) is electrically connected to the pixel circuit 530G(i,j) through the opening portion 591G (see FIG. 11A). For example, the electrode 551G(i,j) overlaps with the opening portion formed in the insulating film 528, and the insulating film 528 is at the periphery of the electrode 551G(i,j).

Thus, a short circuit between the electrode 551G(i,j) and the electrode 552 can be prevented.

Structure Example 1 of Element 550S(i,j)

The element 550S(i,j) includes an electrode 551S(i,j), the electrode 552, and a layer 553S(j) containing a photoelectric conversion material (see FIG. 11A). Note that the electrode 551S(i,j) is electrically connected to the pixel circuit 530S(i,j), and the electrode 552 is electrically connected to a conductive film VPD (see FIG. 7). The electrode 552 used in the element 550G(i,j) can be used in the element 550S(i,j). Thus, the structure and the manufacturing process of the functional panel can be simplified.

For example, a heterojunction photoelectric conversion element, a bulk heterojunction photoelectric conversion element, or the like can be used as the element 550S(i,j).

Structure Example 1 of Layer 553S(j) Containing Photoelectric Conversion Material For example, a stacked-layer film in which a p-type semiconductor film and an n-type semiconductor film are stacked in contact with each other can be used as the layer 553S(j) containing a photoelectric conversion material. Note that the element 550S(i,j) in which a stacked-layer film with such a structure is used as the layer 553S(j) containing a photoelectric conversion material can be referred to as a PN photodiode.

For example, a stacked-layer film in which a p-type semiconductor film, an i-type semiconductor film, and an n-type semiconductor film are stacked such that the i-type semiconductor film is interposed between the p-type semiconductor film and the n-type semiconductor film can be used as the layer 553S(j) containing a photoelectric conversion material. Note that the element 550S(i,j) in which a stacked-layer film with such a structure is used as the layer 553S(j) containing a photoelectric conversion material can be referred to as a PIN photodiode.

For example, a stacked-layer film in which a p+-type semiconductor film, a p--type semiconductor film, a p-type semiconductor film, and an n-type semiconductor film are stacked such that the p--type semiconductor film is interposed between the p+-type semiconductor film and the n-type semiconductor film and the p-type semiconductor film is interposed between the p--type semiconductor film and the n-type semiconductor film can be used as the layer 553S(j) containing a photoelectric conversion material. Note that the element 550S(i,j) in which a stacked-layer film with such a structure is used as the layer 553S(j) containing a photoelectric conversion material can be referred to as an avalanche photodiode.

Structure Example 2 of Layer 553S(j) Containing Photoelectric Conversion Material For example, a semiconductor containing a Group 14 element can be used for the layer 553S(j) containing a photoelectric conversion material. Specifically, a semiconductor containing silicon can be used for the layer 553S(j) containing a photoelectric conversion material. For example, hydrogenated amorphous silicon, microcrystalline silicon, polysilicon, single crystal silicon, or the like can be used for the layer 553S(j) containing a photoelectric conversion material.

For example, an organic semiconductor can be used for the layer 553S(j) containing a photoelectric conversion material. Specifically, part of the layer used as the layer 553 containing a light-emitting material can be used as part of the layer 553S(j) containing a photoelectric conversion material.

Specifically, a hole-transport layer used in the layer 553 containing a light-emitting material can be used in the layer 553S(j) containing a photoelectric conversion material. An electron-transport layer used in the layer 553 containing a light-emitting material can be used in the layer 553S(j) containing a photoelectric conversion material. The hole-transport layer and the electron-transport layer can be used in the layer 553S(j) containing a photoelectric conversion material.

Thus, in a step of forming the hole-transport layer used in the layer 553 containing a light-emitting material, the hole-transport layer used in the layer 553S(j) containing a photoelectric conversion material can be formed. In a step of forming the electron-transport layer used in the layer 553 containing a light-emitting material, the electron-transport layer used in the layer 553S(j) containing a photoelectric conversion material can be formed. The manufacturing process can be simplified.

For example, an electron-accepting organic semiconductor material such as fullerene (e.g., $C_{60}$ or $C_{70}$) or the derivative thereof can be used for the n-type semiconductor film.

For example, a fullerene derivative dissolved or dispersed in a solvent can be used for the layer 553S(i,j) containing a photoelectric conversion material. Specifically, [6,6]-Phenyl-C71-butyric acid methyl ester (abbreviation: PC70BM), [6,6]-Phenyl-C61-butyric acid methyl ester (abbreviation: PC60BM), 1',1",4',4"-Tetrahydro-di[1,4]methanonaphthaleno[1,2:2',3',56,60:2",3"][5,6]fullerene-C60 (abbreviation: ICBA), or the like can be used for the layer 553S(i,j) containing a photoelectric conversion material.

For example, an electron-donating organic semiconductor material such as copper(II) phthalocyanine (CuPc) or tetraphenyldibenzoperiflanthene (DBP) can be used for the p-type semiconductor film.

For example, a π-conjugated organic high molecular material, an oligomer, or a low molecular material dissolved or dispersed in the solvent can be used for the layer 553S(i,j) containing a photoelectric conversion material. Specifically, a polyphenylene-vinylene-based material, a polythiophene-based material, or the like can be used for the layer 553S(i,j) containing a photoelectric conversion material. Specifically, Poly ([2,6'-4,8-di(5-ethylhexylthienyl)benzo[1,2-b;3,3-b]dithiophene]{3-fluoro-2[(2-ethylhexyl)carbonyl]thieno[3,4-b]

thiophenediyl}) (abbreviation: PTB7-Th), Poly({4,8-bis[(2-ethylhexyl)oxy]benzo[1,2-b:4,5b']-dithiophene-2,6-diyl}{3-fluoro-2-[(2-ethylhexyl)carbonyl]thieno[3,4-b]thiophenediyl}) (abbreviation: PYB7), Poly(3-hexylthiophene-2,5-diyl) (abbreviation: P3HT), or the like can be used for the layer $553S(i,j)$ containing a photoelectric conversion material.

For example, a film obtained by co-evaporation of an electron-accepting semiconductor material and an electron-donating semiconductor material can be used as the i-type semiconductor film.

Structure Example 2 of Functional Panel 700

The functional panel 700 includes the insulating film 528 and an insulating film 573 (see FIG. 10A).
<<Insulating Film 528>>
The insulating film 528 includes a region interposed between the functional layer 520 and the base material 770, and the insulating film 528 includes an opening portion in a region overlapping with the element $550G(i,j)$ and the element $550S(i,j)$ (see FIG. 10A).

The material that can be used for the insulating film 521, for example, can be used for the insulating film 528. Specifically, a silicon oxide film, a film containing an acrylic resin, a film containing polyimide, or the like can be used as the insulating film 528.
<<Insulating Film 573>>
The element $550G(i,j)$ and the element $550S(i,j)$ are interposed between a region of the insulating film 573 and the functional layer 520 (see FIG. 10A).

For example, a single film or a stacked film in which a plurality of films are stacked can be used as the insulating film 573. Specifically, a stacked film, in which an insulating film 573A which can be formed by a method that hardly damages the element $550G(i,j)$ and the element $550S(i,j)$ and a dense insulating film 573B with a few defects are stacked, can be used as the insulating film 573.

Thus, diffusion of impurities into the element $550G(i,j)$ and the element $550S(i,j)$ can be inhibited. The reliability of the element $550G(i,j)$ and the element $550S(i,j)$ can be increased.

Structure Example 3 of Functional Panel 700

The functional panel 700 includes a functional layer 720 (see FIG. 10A).
<<Functional Layer 720>>
The functional layer 720 includes a light-blocking film BM, a coloring film CF(G), and an insulating film 771. A color conversion layer can also be used.
<<Light-Blocking Film BM>>
The light-blocking film BM includes an opening portion in a region overlapping with the pixel $702G(i,j)$. The light-blocking film BM includes an opening portion in a region overlapping with the pixel $702S(i,j)$ (see FIG. 11A).

A material of a dark color can be used for the light-blocking film BM, for example. Thus, the display contrast can be increased.
<<Coloring Film CF(G)>>
The coloring film CF(G) includes a region interposed between the base material 770 and the element $550G(i,j)$. A material that selectively transmits light of a predetermined color, for example, can be used for the coloring film CF(G). Specifically, a material that transmits red light, green light, or blue light can be used for the coloring film CF(G).

<<Structure Example of Insulating Film 771>>
The insulating film 771 includes a region interposed between the base material 770 and the element $550G(i,j)$.

The light-blocking film BM, the coloring film CF(G), or color conversion layer are interposed between a region of the insulating film 771 and the base material 770. Thus, unevenness due to the thicknesses of the light-blocking film BM, the coloring film CF(G), or the color conversion layer can be reduced.
<<Color Conversion Layer>>
The color conversion layer includes a region interposed between the base material 770 and the element $550G(i,j)$.

For example, a material that emits light with a wavelength longer than a wavelength of incident light can be used for the color conversion layer. For example, a material that absorbs blue light or ultraviolet rays, converts it into green light, and emits the green light, a material that absorbs blue light or ultraviolet rays, converts it into red light, and emits the red light, or a material that absorbs ultraviolet rays, converts it into blue light, and emits the blue light can be used for the color conversion layer. Specifically, a quantum dot with a diameter of several nanometers can be used for the color conversion layer. Thus, light having a spectrum with a narrow half width can be emitted. Light with high saturation can be emitted.

Structure Example 4 of Functional Panel 700

The functional panel 700 includes a light-blocking film KBM (see FIG. 10A and FIG. 11A).
<<Light-Blocking Film KBM>>
The light-blocking film KBM has an opening portion in a region overlapping with the pixel $702S(i,j)$. Moreover, the light-blocking film KBM includes a region interposed between the functional layer 520 and the base material 770, and has a function of providing a predetermined space between the functional layer 520 and the base material 770. A material of a dark color can be used for the light-blocking film KBM, for example. Thus, stray light that would enter the pixel $702S(i,j)$ can be reduced.

Structure Example 5 of Functional Panel 700

The functional panel 700 includes a functional film 770P or the like (see FIG. 10A).
<<Functional Film 770P and the Like>>
The functional film 770P includes a region overlapping with the element $550G(i,j)$.

An anti-reflection film, a polarizing film, a retardation film, a light diffusion film, a condensing film, or the like can be used as the functional film 770P, for example.

For example, an anti-reflection film with a thickness less than or equal to 1 µm can be used as the functional film 770P. Specifically, a stacked film in which three or more layers, preferably five or more layers, further preferably 15 or more layers of dielectrics are stacked can be used as the functional film 770P. This allows the reflectance to be as low as 0.5% or less, preferably 0.08% or less.

For example, a circularly polarizing film can be used as the functional film 770P.

Furthermore, an antistatic film inhibiting the attachment of a dust, a water repellent film inhibiting the attachment of a stain, an oil repellent film inhibiting the attachment of a stain, an antireflective film (anti-reflection film), a non-glare film (anti-glare film), a hard coat film inhibiting generation of a scratch in use, a self-healing film that self-heals from generated scratches, or the like can be used as the functional film 770P.

Note that this embodiment can be combined with any of the other embodiments in this specification as appropriate.

Embodiment 6

In this embodiment, structures of a functional panel of one embodiment of the present invention are described with reference to drawings.

Figure 14A:
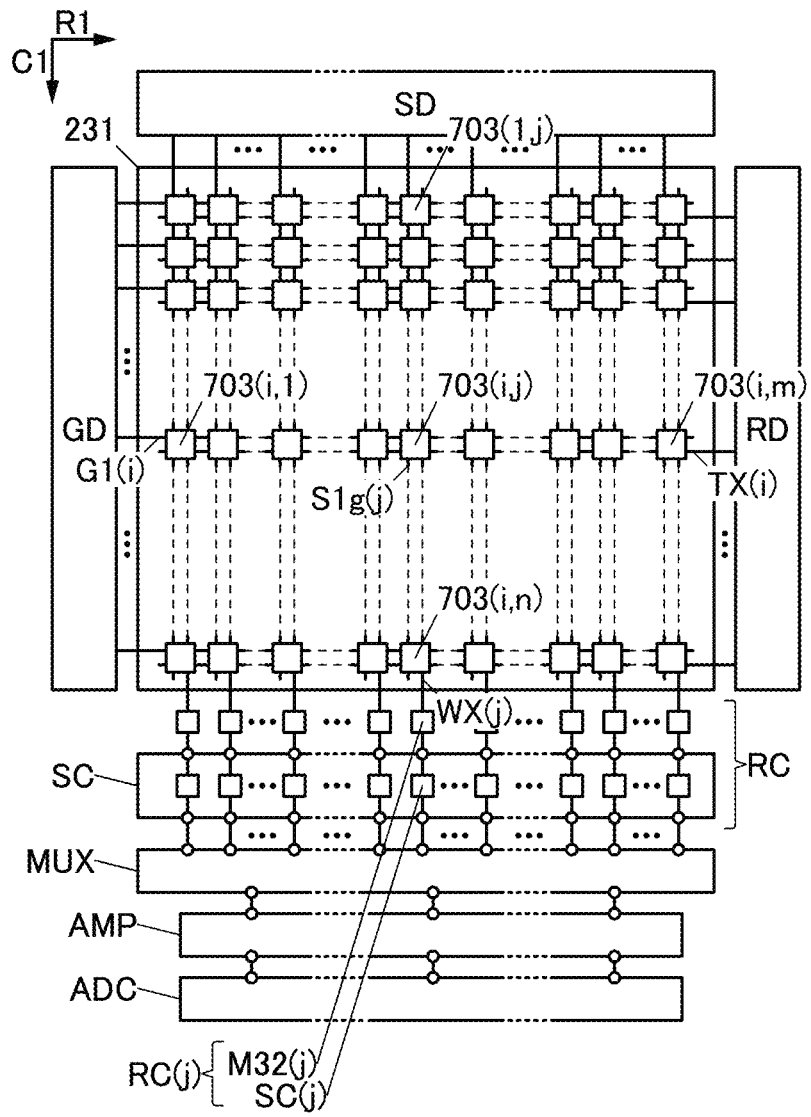
FIG. 14A and FIG. 14B are diagrams illustrating a structure of a functional panel of an embodiment.
Figure 14B:
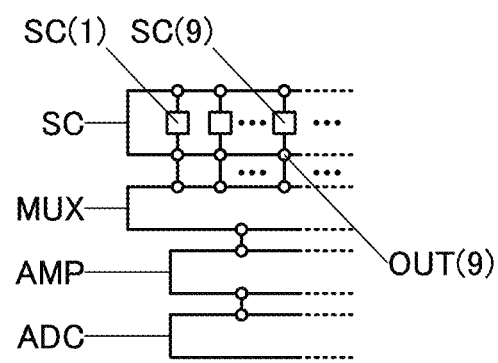

FIG. 14A is a block diagram illustrating a structure of the functional panel of one embodiment of the present invention, and FIG. 14B is a block diagram illustrating part of FIG. 14A.

Figure 15:
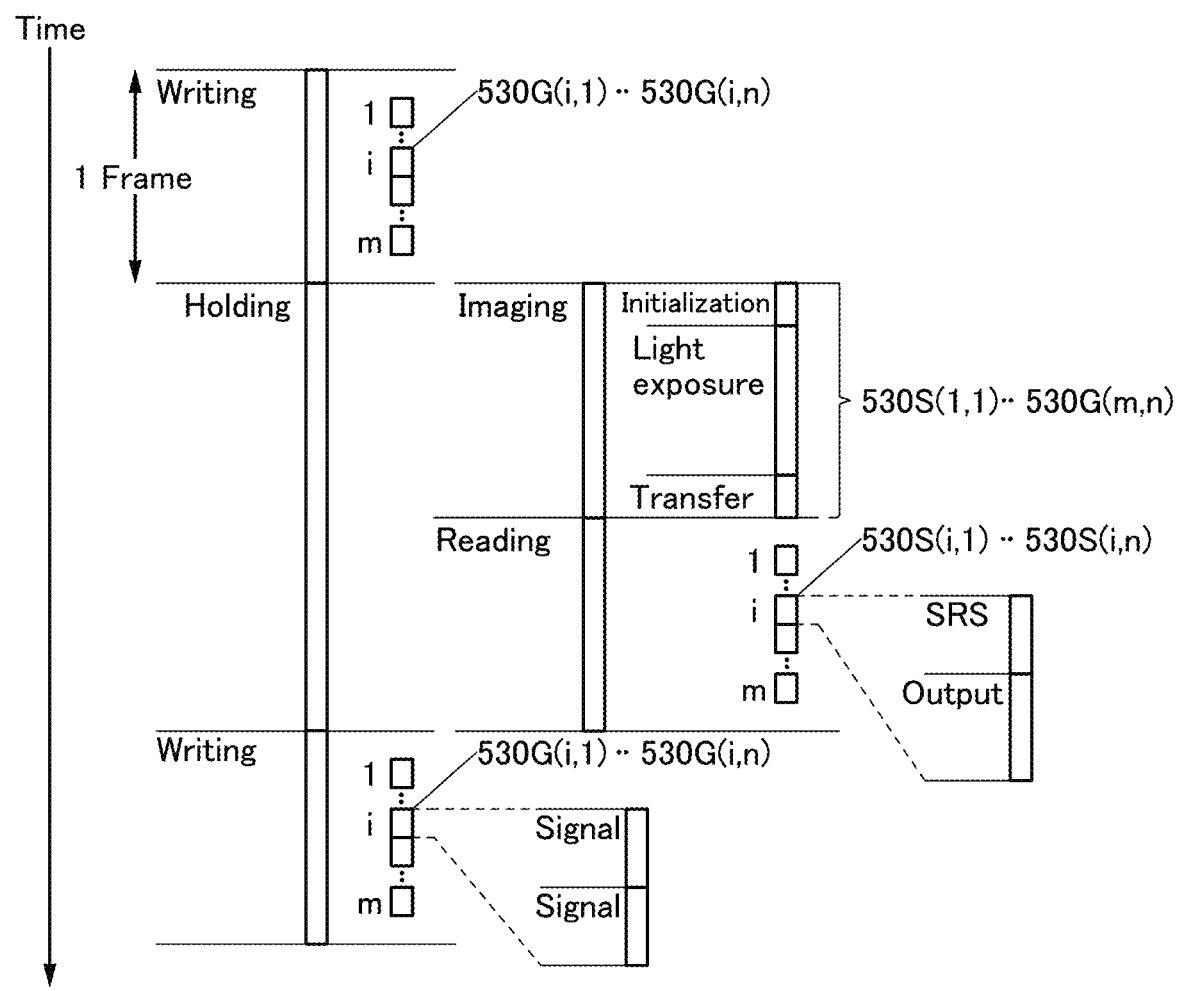
FIG. 15 is a diagram showing an operation of a functional panel of an embodiment.

FIG. 15 is a diagram showing an operation of the functional panel of one embodiment of the present invention.

Structure Example 1 of Functional Panel 700

The functional panel 700 described in this embodiment includes a region 231 (see FIG. 14).

Structure Example 1 of Region 231

The region 231 includes a group of pixel sets 703($i$,1) to 703($i$,$n$) and a different group of pixel sets 703(1,$j$) to 703($m$,$j$). The region 231 also includes the conductive film G1($i$), the conductive film TX($i$), the conductive film S1g($j$), and the conductive film WX($j$).

The group of pixel sets 703($i$,1) to 703($i$,$n$) is provided in the row direction (the direction indicated by an arrow R1 in the drawing), and the group of pixel sets 703($i$,1) to 703($i$,$n$) includes the pixel set 703($i$,$j$).

Furthermore, the group of pixel sets 703($i$,1) to 703($i$,$n$) is electrically connected to the conductive film G1($i$). The group of pixel sets 703($i$,1) to 703($i$,$n$) is electrically connected to the conductive film TX($i$).

The different group of pixel sets 703(1,$j$) to 703($m$,$j$) is provided in the column direction (the direction indicated by an arrow C1 in the drawing) intersecting the row direction, and the different group of pixel sets 703(1,$j$) to 703($m$,$j$) includes the pixel set 703($i$,$j$).

The different group of pixel sets 703(1,$j$) to 703($m$,$j$) is electrically connected to the conductive film S1g($j$). The other group of pixel sets 703(1,$j$) to 703($m$,$j$) is electrically connected to the conductive film WX($j$).

Thus, image data can be supplied to a plurality of pixels. Alternatively, imaging data can be obtained from a plurality of pixels. Thus, a novel functional panel that is highly convenient, useful, or reliable can be provided.

Structure Example 2 of Region 231

The region 231 includes 500 or more groups of pixel sets per inch. Furthermore, the region 231 includes 1000 or more groups of pixel sets per inch, preferably 5000 or more groups of pixel sets per inch, further preferably 10000 or more groups of pixel sets per inch. This can reduce a screen-door effect, for example. Note that the group of pixel sets include the pixel set 703($i$,$j$).

Structure Example 3 of Region 231

The region 231 includes a plurality of pixels arranged in a matrix. For example, the region 231 includes 7600 or more pixels in the row direction, and the region 231 includes 4300 or more pixels in the column direction. Specifically, 7680 pixels are provided in the row direction and 4320 pixels are provided in the column direction.

This enables display of a high-resolution image. As a result, a novel functional panel that is highly convenient or reliable can be provided.

Structure Example 2 of Functional Panel 700

The functional panel 700 of one embodiment of the present invention includes a group of sampling circuits SC, a multiplexer MUX, an amplifier circuit AMP, and an analog-digital converter circuit ADC (see FIG. 14A). Note that the group of sampling circuits SC includes the sampling circuit SC(j).

The sampling circuit SC(j) can be provided for each conductive film WX(t). A differential signal of the pixel circuit 530S($i$,$j$) can be obtained by the corresponding conductive film WX(j). The operating frequency of the sampling circuit SC(j) can be low. Noise can be reduced. As a result, a novel functional panel that is highly convenient or reliable can be provided.

<<Structure Example of Multiplexer MUX>>

The multiplexer MUX has a function of selecting one sampling circuit from a group of sampling circuits to obtain an imaging signal. For example, the multiplexer MUX selects the sampling circuit SC(j) to obtain the imaging signal.

Specifically, the multiplexer MUX is electrically connected to a sampling circuit SC(1) to a sampling circuit SC(9), and selects one sampling circuit SC to obtain an imaging signal (see FIG. 14B). For example, the multiplexer MUX is electrically connected to a third terminal OUT(9) of the sampling circuit SC(9).

The multiplexer MUX is electrically connected to the amplifier circuit AMP and has a function of supplying the obtained imaging signal.

Thus, a predetermined pixel can be selected from a plurality of pixels arranged in the row direction. Alternatively, imaging data can be obtained from a predetermined pixel. Alternatively, the number of imaging signals obtained concurrently can be reduced with use of a plurality of multiplexers. Alternatively, an analog-digital converter circuit ADC in which the number of input channels is smaller than the number of pixels arranged in the row direction can be used. As a result, a novel functional panel that is highly convenient, useful, or reliable can be provided.

<<Structure Example of Amplifier Circuit AMP>>

The amplifier circuit AMP can amplify the imaging signal and supply the amplified signal to the analog-digital converter circuit ADC.

Note that the functional layer 520 includes the multiplexer MUX and the amplifier circuit AMP.

Accordingly, for example, in the step of forming the semiconductor film used in the pixel circuit 530G($i$,$j$), semiconductor films used in the multiplexer MUX and the amplifier circuit AMP can be formed. The manufacturing process of the functional panel can be simplified. Thus, a novel functional panel that is highly convenient, useful, or reliable can be provided.

<<Structure Example of Analog-Digital Converter Circuit ADC>>

The analog-digital converter circuit ADC has a function of converting an analog imaging signal to a digital signal. This can suppress deterioration of an imaging signal due to transmission.

Structure Example 3 of Functional Panel 700

The functional panel 700 of one embodiment of the present invention includes the driver circuit GD, the driver circuit RD, and one pixel set 703(i,j). The driver circuit GD has a function of supplying the first selection signal, and the driver circuit RD has a function of supplying the fourth selection signal and the fifth selection signal.

Structure Example 1 of Pixel 703(i,j)

The pixel set 703(i,j) is supplied with the fourth selection signal and the fifth selection signal in a period during which the first selection signal is not supplied (see FIG. 15). Note that a period from the end of "writing" operation to the beginning of next "writing" operation is the period during which the first selection signal is not supplied. In addition, the pixel circuit 530S(i,j) obtains an imaging signal on the basis of the fourth selection signal, and supplies the imaging signal on the basis of the fifth selection signal.

Note that for example, the first selection signal can be supplied with use of the conductive film G1(i), the fourth selection signal can be supplied with use of the conductive film TX(i), and the fifth selection signal can be supplied with use of the conductive film SE(i) (see FIG. 7).

The operation of supplying the fourth selection signal and making the pixel circuit 530S(i,j) obtain an imaging signal can be referred to as "imaging" (see FIG. 15). The operation of reading an imaging signal from the pixel circuit 530S(i,j) can be referred to as "reading". The operation of supplying a predetermined voltage to the element 550S(i,j) can be referred to as "initialization", the operation of exposing the initialized element 550S(i,j) to light in a predetermined period as "light exposure", and the operation of reflecting a voltage that has been changed along with the light exposure on the pixel circuit 530S(i,j) as "transfer". Moreover, in the figure, SRS corresponds to the operation of supplying a reference signal used in a correlated double sampling method, and "output" corresponds to the operation of supplying an imaging signal.

For example, image data of one frame can be written in 16.7 ms. Specifically, the operation can be performed at a frame rate of 60 Hz. Note that an image signal can be written to the pixel circuit 530G(i,j) in 15.2 µs.

For example, image data of one frame can be held in a period corresponding to 16 frames. Imaging data of one frame can be imaged and read in a period corresponding to 16 frames.

Specifically, it is possible to perform the initialization in 15 µs, the light exposure in a period from 1 ms to 5 ms, and the transfer in 150 µs. Moreover, the reading can be performed in 250 ms.

Accordingly, imaging can be performed in a period during which the first selection signal is not supplied. Noise in imaging can be inhibited. An imaging signal can be read in the period during which the first selection signal is not supplied. Noise in reading can be inhibited. As a result, a novel functional panel that is highly convenient, useful, or reliable can be provided.

Structure Example 2 of Pixel 703(i,j)

The pixel 703(i,j) is supplied with the fourth selection signal in a period during which one image signal is held. For example, in a period during which the pixel circuit 530G(i,j) holds one image signal, the pixel 703(i,j) can emit light using the element 550G(i,j) on the basis of the image signal (see FIG. 15). The pixel circuit 530S(i,j) is supplied with the fourth selection signal after the pixel circuit 530G(i,j) obtains one image signal on the basis of the first selection signal by the time when the pixel circuit 530G(i,j) is supplied with the first selection signal again.

Accordingly, the intensity of light emitted from the element 550G(i,j) can be controlled using the image signal. Light having a controlled intensity can be emitted to an object. The object can be imaged using the element 550S(i,j). The object can be imaged using the element 550S(i,j) while the intensity of emitted light is controlled. The influence of a change from one image signal to another image signal held in the pixel circuit 530G(i,j) on an imaging signal can be eliminated. As a result, a novel functional panel that is highly convenient, useful, or reliable can be provided.

Note that this embodiment can be combined with any of the other embodiments in this specification as appropriate.

Embodiment 7

In this embodiment, structures of display devices of one embodiment of the present invention are described with reference to drawings.

Figure 16A:
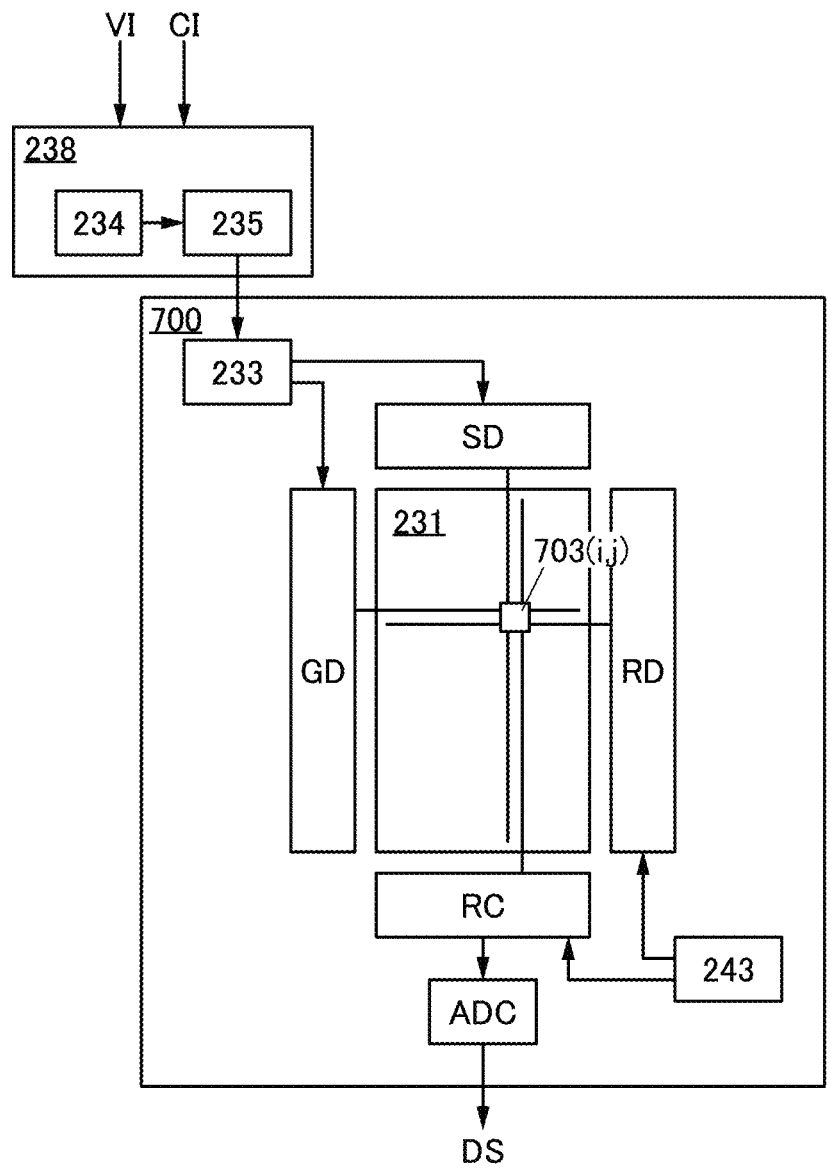
FIG. 16A to FIG. 16D are diagrams illustrating structures of display devices of an embodiment.
Figure 16B:
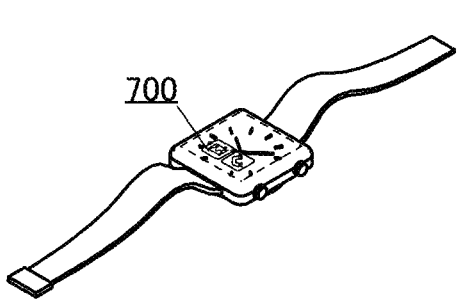
Figure 16C:
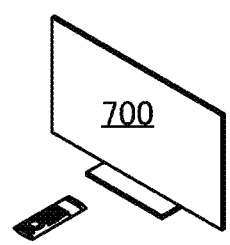
Figure 16D:
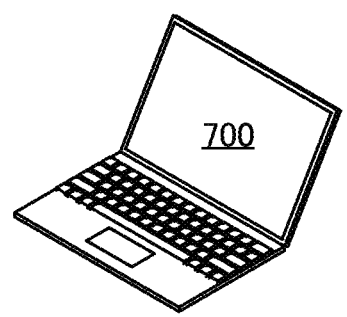

FIG. 16A is a block diagram of the display device of one embodiment of the present invention, and FIG. 16B to FIG. 16D are perspective views illustrating appearances of the display devices of one embodiment of the present invention.

<Structure Example of Display Device>

The display device described in this embodiment includes a control portion 238 and the functional panel 700 (see FIG. 16A).

Structure Example 1 of Control Portion 238

The control portion 238 is supplied with image data VI and control data CI. For example, a clock signal, a timing signal, or the like can be used as the control data CI.

The control portion 238 generates data on the basis of the image data VI and the control portion 238 generates a control signal on the basis of the control data CI. Furthermore, the control portion 238 supplies the data and the control signal.

The data includes a grayscale of 8 bits or more, preferably 12 bits or more, for example. In addition, a clock signal, a start pulse, or the like of a shift register used for a driver circuit can be used as the control signal, for example.

Structure Example 2 of Control Portion 238

For example, a decompression circuit 234 and an image processing circuit 235 can be used in the control portion 238.

<<Decompression Circuit 234>>

The decompression circuit 234 has a function of decompressing the image data VI supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data VI, for example.

The image processing circuit 235 has a function of generating the data by correcting the image data VI on the basis of a predetermined characteristic curve and a function of supplying the data, for example.

Structure Example 1 of Functional Panel 700

The functional panel 700 is supplied with the data and the control signal. For example, the functional panel 700 described in any one of Embodiment 1 to Embodiment 6 can be used.

Structure Example 3 of Pixel 703(i,j)

The pixel 703(i,j) performs display on the basis of the data.

Thus, the image data VI can be displayed using the element 550G(i,j). Thus, a novel display device that is highly convenient, useful, or reliable can be provided. For example, an information terminal (see FIG. 16B), a video display system (see FIG. 16C), a computer (see FIG. 16D), or the like can be provided.

Structure Example 2 of Functional Panel 700

The functional panel 700 includes a driver circuit and a control circuit, for example.

<<Driver Circuit>>

The driver circuit operates on the basis of the control signal. Using the control signal enables a synchronized operation of a plurality of driver circuits (see FIG. 16A).

For example, the driver circuit GD can be used in the functional panel 700. The driver circuit GD is supplied with the control signal and has a function of supplying the first selection signal.

For example, the driver circuit SD can be used in the functional panel 700. The driver circuit SD is supplied with the control signal and the data and can supply an image signal.

For example, the driver circuit RD can be used in the functional panel 700. The driver circuit RD is supplied with the control signal and can supply the third selection signal to the fifth selection signal.

For example, the reading circuit RC can be used in the functional panel 700. The reading circuit RC is supplied with the control signal, and can read an imaging signal by a correlated double sampling method, for example.

<<Control Circuit>>

The control circuit has a function of generating and supplying the control signal. For example, a clock signal or a timing signal can be used as the control signal.

Specifically, the control circuit formed over a rigid substrate can be used in the functional panel. The control circuit formed over the rigid substrate and the control portion 238 can be electrically connected to each other using a flexible printed circuit.

A timing controller 233 can be used as a control circuit, for example. With the use of a control circuit 243, operation of the driver circuit RD can be synchronized with operation of the reading circuit RC.

Note that this embodiment can be combined with any of the other embodiments in this specification as appropriate.

Embodiment 8

In this embodiment, a structure of an input/output device of one embodiment of the present invention is described with reference to drawings.

Figure 17:
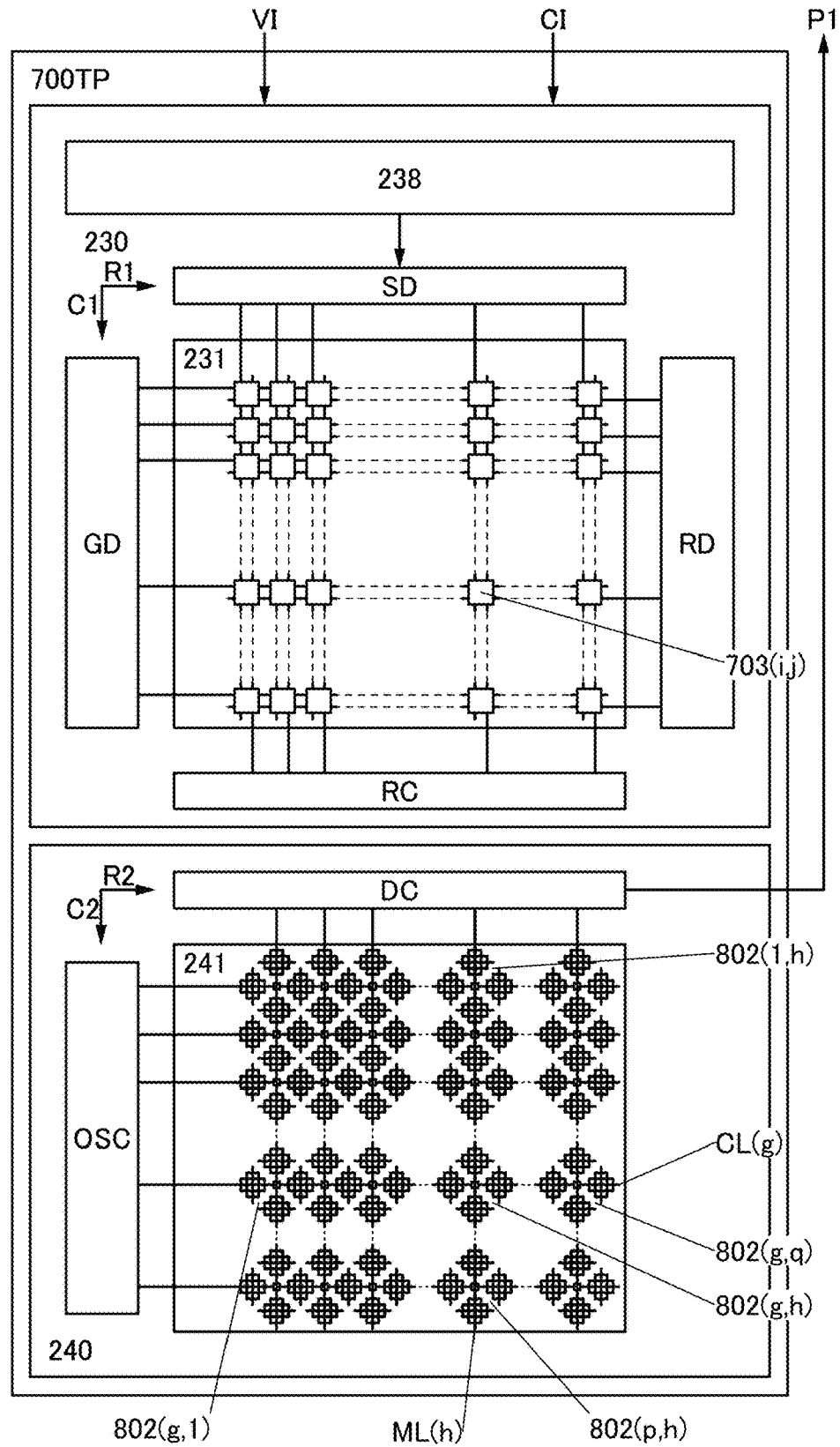
FIG. 17 is a block diagram illustrating a structure of an input/output device of an embodiment.

FIG. 17 is a block diagram illustrating the structure of the input/output device of one embodiment of the present invention.

Structure Example 1 of Input/Output Device

The input/output device described in this embodiment includes an input portion 240 and a display portion 230 (see FIG. 17).

Structure Example 1 of Display Portion 230

The display portion 230 includes the functional panel 700. For example, the functional panel 700 described in any one of Embodiment 1 to Embodiment 6 can be used for the display portion 230. Note that a panel including the input portion 240 and the display portion 230 can be referred to as a functional panel 700TP.

Structure Example 1 of Input Portion 240

The input portion 240 includes a sensing region 241. The input portion 240 senses an object approaching the sensing region 241.

The sensing region 241 includes a region overlapping with the pixel 703(i,j).

Thus, an object approaching the region overlapping with the display portion 230 can be sensed while image data is displayed using the display portion 230. A finger or the like approaching the display portion 230 can be used as a pointer to input position data. Position data can be associated with image data displayed on the display portion 230. Thus, a novel input/output device that is highly convenient, useful, or reliable can be provided.

Structure Example 1 of Sensing Region 241

The sensing region 241 includes one or a plurality of sensors, for example.

The sensing region 241 includes a group of sensors 802(g,1) to 802(g,q) and a different group of sensors 802(1,h) to 802(p,h). Note that g is an integer greater than or equal to 1 and less than or equal top, h is an integer greater than or equal to 1 and less than or equal to q, and p and q are each an integer greater than or equal to 1.

The group of sensors 802(g,1) to 802(g,q) includes a sensor 802(g,h), is provided in a row direction (the direction indicated by an arrow R2 in the drawing), and is electrically connected to a wiring CL(g). Note that the direction indicated by the arrow R2 may be the same as or different from the direction indicated by the arrow R1.

The different group of sensors 802(1,h) to 802(p,h) includes the sensor 802(g,h), is provided in a column direction (the direction indicated by an arrow C2 in the drawing) intersecting the row direction, and is electrically connected to a wiring ML(h).

<<Sensor>>

The sensor has a function of sensing an approaching pointer. For example, a finger or a stylus pen can be used as the pointer. For example, a piece of metal or a coil can be used for the stylus pen.

Specifically, a capacitive proximity sensor, an electromagnetic inductive proximity sensor, an optical proximity sensor, a resistive proximity sensor, or the like can be used as the sensor.

A plurality of types of sensors can be used in combination. For example, a sensor that senses a finger and a senor that senses a stylus pen can be used in combination.

This allows determination of the kind of a pointer. Different instructions can be associated with sensing data depending on the kind of a pointer that has been determined.

Specifically, in the case where it is determined that a finger is used as a pointer, sensing data can be associated with a gesture. In the case where it is determined that a stylus pen is used as a pointer, sensing data can be associated with drawing processing.

Specifically, a finger can be sensed using a capacitive, pressure-sensitive, or optical proximity sensor. A stylus pen can be sensed using an electromagnetic inductive or optical proximity sensor.

Structure Example 2 of Input Portion 240

The input portion 240 includes an oscillation circuit OSC and a sensing circuit DC (see FIG. 17).

The oscillation circuit OSC supplies a search signal to the sensor 802(g,h). For example, a rectangular wave, a sawtooth wave, a triangular wave, or a sine wave can be used as the search signal.

The sensor 802(g,h) generates and supplies a sensing signal that changes on the basis of the search signal and the distance to a pointer approaching the sensor 802(g,h).

The sensing circuit DC supplies input data on the basis of the sensing signal.

Accordingly, the distance from an approaching pointer to the sensing region 241 can be sensed. The position in the sensing region 241 where the pointer comes the closest can be sensed.

Note that this embodiment can be combined with any of the other embodiments in this specification as appropriate.

Embodiment 9

In this embodiment, structures of a data processing device of one embodiment of the present invention will be described with reference to drawings.

Figure 18A:
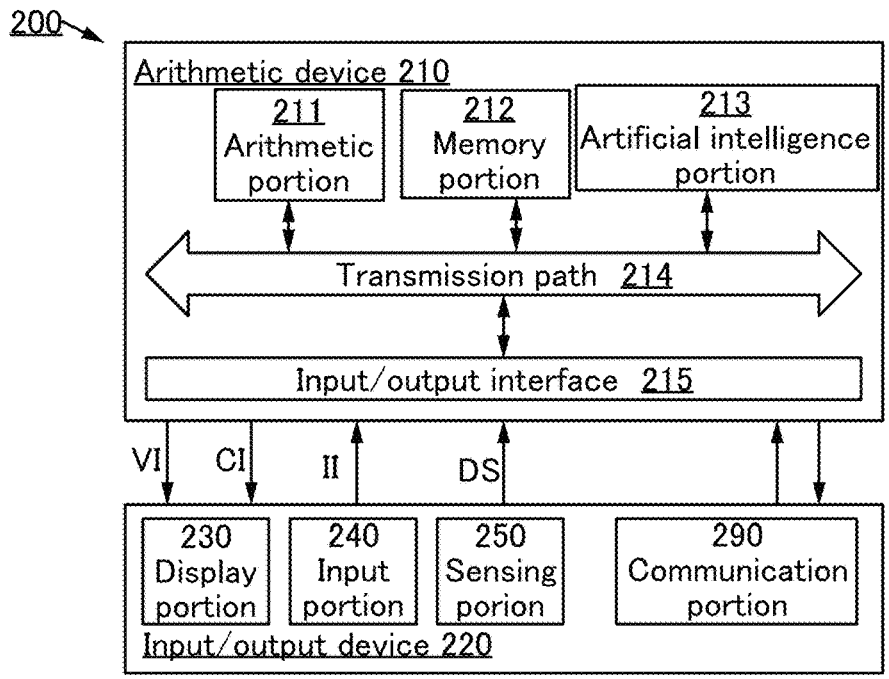
FIG. 18A to FIG. 18C are a block diagram and projection views illustrating structures of data processing devices of an embodiment.
Figure 18B:
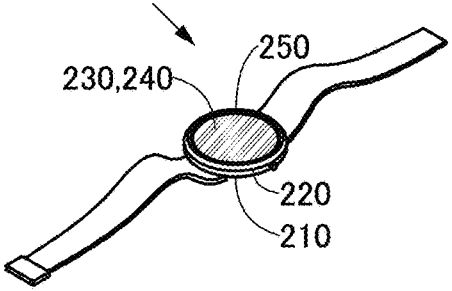
Figure 18C:
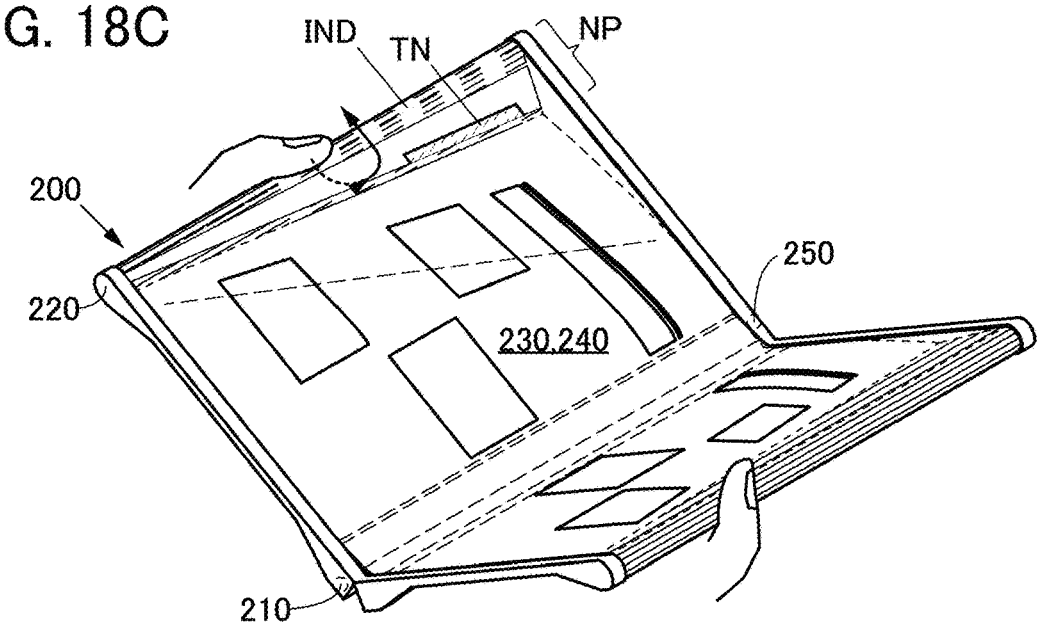

FIG. 18A is a block diagram illustrating a structure of the data processing device of one embodiment of the present invention. FIG. 18B and FIG. 18C are projection views illustrating examples of the appearance of the data processing device.

Figure 19A:
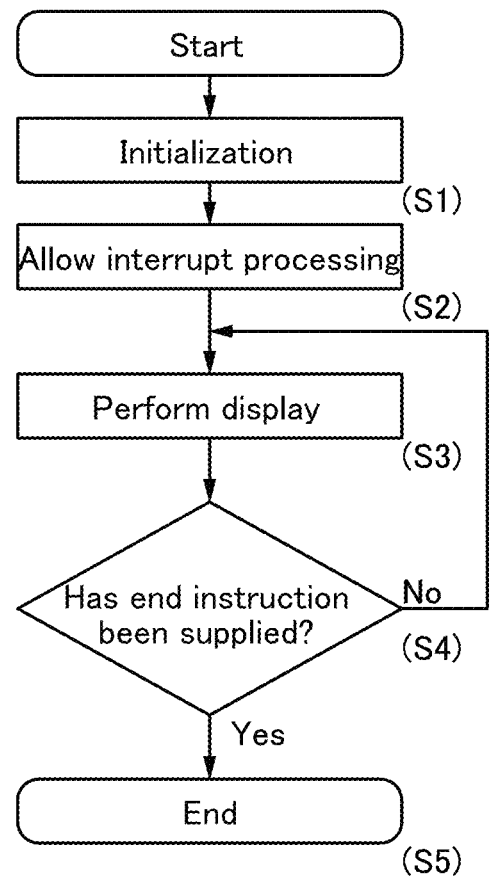
FIG. 19A and FIG. 19B are flow charts showing a driving method of a data processing device of an embodiment.
Figure 19B:
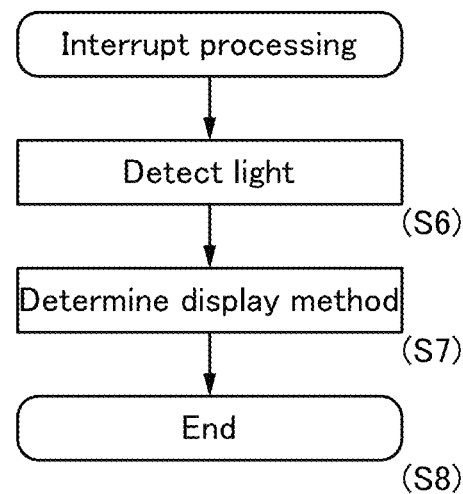

FIG. 19 is a flowchart showing a program of one embodiment of the present invention. FIG. 19A is a flow chart showing main processing of the program of one embodiment of the present invention, and FIG. 19B is a flow chart showing interrupt processing.

Figure 20A:
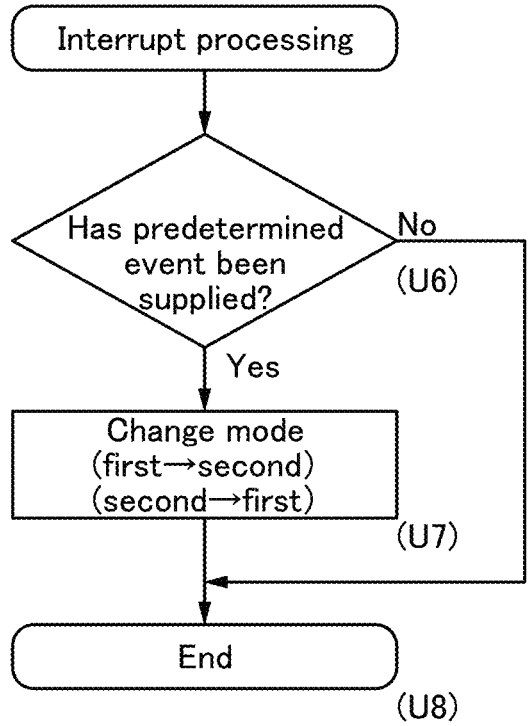
FIG. 20A to FIG. 20C are diagrams showing a driving method of a data processing device of an embodiment.
Figure 20B:
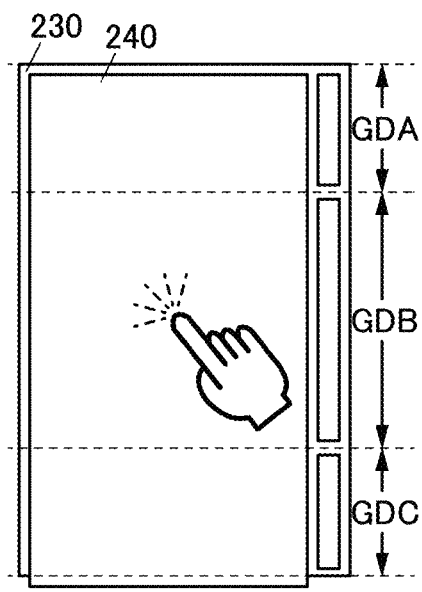
Figure 20C:
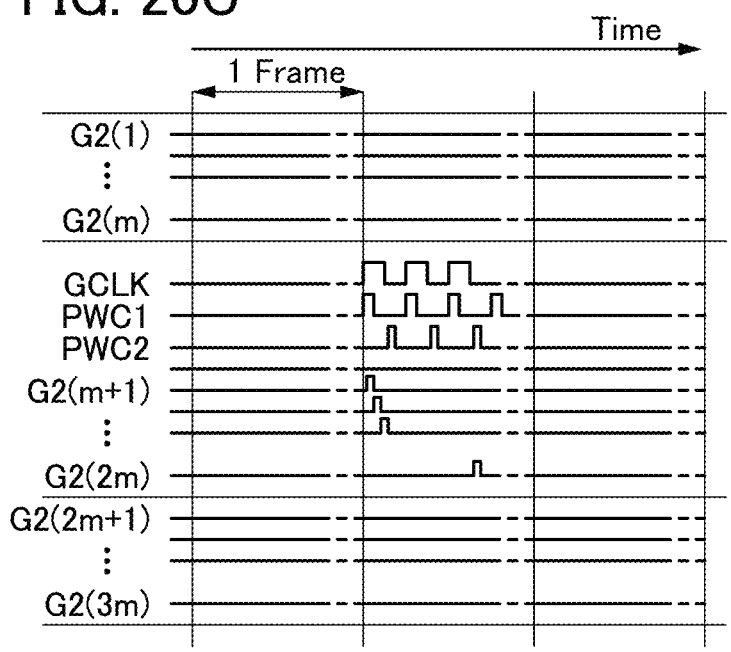

FIG. 20 is a diagram showing a program of one embodiment of the present invention. FIG. 20A is a flow chart showing interrupt processing of the program of one embodiment of the present invention. FIG. 20B is a schematic view illustrating handling of the data processing device of one embodiment of the present invention, and FIG. 20C is a timing chart showing the operation of the data processing device of one embodiment of the present invention.

Figure 21A:
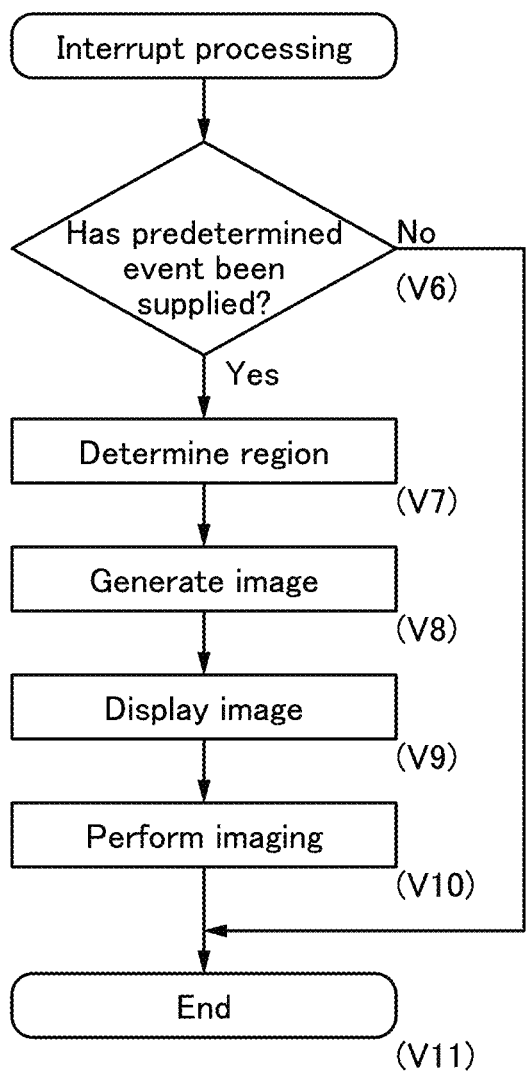
FIG. 21A to FIG. 21C are diagrams showing a driving method of a data processing device of an embodiment.
Figure 21B:
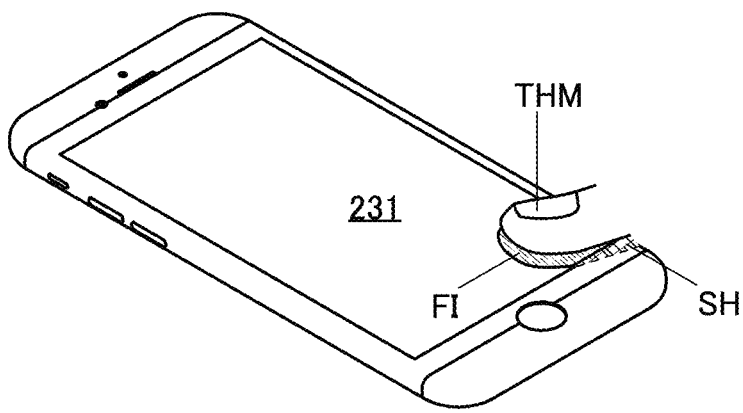
Figure 21C:

FIG. 21 is a diagram showing a program of one embodiment of the present invention. FIG. 21A is a flow chart showing interrupt processing different from the interrupt processing shown in FIG. 19B. FIG. 21B is a schematic view illustrating operation of the program shown in FIG. 21A, and FIG. 21C is a schematic view of a taken image of a fingerprint.

FIG. 22 is a diagram showing a program of one embodiment of the present invention. FIG. 22A is a flow chart showing interrupt processing different from the interrupt processing shown in FIG. 19B. FIG. 22B to FIG. 22D are schematic views illustrating operation of the program shown in FIG. 22A.

Structure Example 1 of Data Processing Device

The data processing device described in this embodiment includes an arithmetic device 210 and an input/output device 220 (see FIG. 18A). Note that the input/output device 220 is electrically connected to the arithmetic device 210. A data processing device 200 can include a housing (see FIG. 18B and FIG. 18C).

Structure Example 1 of Arithmetic Device 210

The arithmetic device 210 is supplied with input data II or sensing data DS. The arithmetic device 210 generates the control data CI and the image data VI on the basis of the input data II or the sensing data DS, and supplies the control data CI and the image data VI.

The arithmetic device 210 includes an arithmetic portion 211 and a memory portion 212. The arithmetic device 210 also includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

<<Structure Example of Input/Output Device 220>>

The input/output device 220 supplies the input data II and the sensing data DS. The input/output device 220 is supplied with the control data CI and the image data VI (see FIG. 18A).

As the input data II, for example, a scan code of a keyboard, position data, data on button handling, sound data, or image data can be used. As the sensing data DS, for example, illuminance data, attitude data, acceleration data, bearing data, pressure data, temperature data, humidity data, or the like of the environment where the data processing device 200 is used, or the like can be used.

As the control data CI, for example, a signal controlling the luminance of display of the image data VI, a signal controlling the color saturation, or a signal controlling the hue can be used. A signal that changes display of part of the image data VI can be used as the control data CI.

The input/output device 220 includes the display portion 230, the input portion 240, and the sensing portion 250. For example, the input/output device described in Embodiment 8 can be used as the input/output device 220. The input/output device 220 can include a communication portion 290.

<<Structure Example of Display Portion 230>>

The display portion 230 displays the image data VI on the basis of the control data CI. For example, the display device described in Embodiment 7 can be used for the display portion 230.

<<Structure Example of Input Portion 240>>

The input portion 240 generates the input data II. For example, the input portion 240 has a function of supplying position data P1.

For example, a human interface or the like can be used as the input portion 240 (see FIG. 18A). Specifically, a keyboard, a mouse, a touch sensor, a microphone, a camera, or the like can be used as the input portion 240.

A touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of a finger in contact with the touch panel and can determine that a predetermined gesture is supplied when the analysis results meet predetermined conditions. Thus, the user can supply a predetermined operation instruction associated with a predetermined gesture in advance by using the gesture.

For instance, the user can supply a "scroll instruction" for changing the display position of image data by using a gesture of moving a finger in contact with the touch panel along the touch panel.

The user can supply a "dragging instruction" for pulling out and displaying a navigation panel NP at an edge portion of the region 231 by using a gesture of moving a finger in contact with the edge portion of the region 231 (see FIG. 18C). Moreover, the user can supply a "leafing through instruction" for displaying index images IND, some parts of other pages, or thumbnail images TN of other pages in a predetermined order on the navigation panel NP so that the user can flip through these images, by using a gesture of moving the position where a finger presses hard. The instruction can be supplied by using the finger press pressure. Consequently, the user can turn the pages of an e-book reader like flipping through the pages of a paper book. The user can search a certain page with the aid of the thumbnail images TN or the index images IND.

<<Structure Example of Sensing Portion 250>>

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, illuminance data, attitude data, acceleration data, bearing data, pressure data, temperature data, humidity data, or the like can be supplied.

For example, a photosensor, an attitude sensor, an acceleration sensor, a direction sensor, a GPS (Global positioning System) signal receiving circuit, a pressure-sensitive switch, a pressure sensor, a temperature sensor, a humidity sensor, a camera, or the like can be used as the sensing portion 250.

<<Communication Portion 290>>

The communication portion 290 has a function of supplying data to a network and obtaining data from the network.

<<Housing>>

Note that the housing has a function of storing the input/output device 220 or the arithmetic device 210. The housing has a function of supporting the display portion 230 or the arithmetic device 210.

Thus, the control data CI can be generated on the basis of the input data II or the sensing data DS. The image data VI can be displayed on the basis of the input data II or the sensing data DS. The data processing device is capable of operating with knowledge of the intensity of light that the housing of the data processing device receives in the environment where the data processing device is used. The user of the data processing device can select a display method. Thus, a novel data processing device that is highly convenient, useful, or reliable can be provided.

Note that in some cases, these components cannot be clearly distinguished from each other and one component may also serve as another component or may include part of another component. For example, a touch panel in which a touch sensor overlaps with a display panel is an input portion as well as a display portion.

Structure Example 2 of Arithmetic Device 210

The arithmetic device 210 includes an artificial intelligence portion 213 (see FIG. 18A).

The artificial intelligence portion 213 is supplied with the input data II or the sensing data DS, and the artificial intelligence portion 213 infers the control data CI on the basis of the input data II or the sensing data DS. Moreover, the artificial intelligence portion 213 supplies the control data CI.

In this manner, the control data CI for display that can be felt suitable can be generated. Display that can be felt suitable is possible. The control data CI for display that can be felt comfortable can be generated. Display that can be felt comfortable is possible. Thus, a novel data processing device that is highly convenient, useful, or reliable can be provided.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate the control data CI for displaying extracted part in the color, design, font, or the like different from those of another part, and the data.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for displaying a boundary between extracted part of the image and another part. Specifically, the artificial intelligence portion 213 can generate the control data CI for displaying a rectangle surrounding the extracted part of the image.

[Inference Using Sensing Data DS]

Specifically, the artificial intelligence portion 213 can make an inference using the sensing data DS. The artificial intelligence portion 213 can generate the control data CI on the basis of the inference RI so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. The artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. A clock signal, a timing signal, or the like that is supplied to a control portion included in the input portion 240 can be used as the control data CI.

Structure Example 2 of Data Processing Device

Another structure of the data processing device of one embodiment of the present invention is described with reference to FIG. 19A and FIG. 19B.

<<Program>>

The program of one embodiment of the present invention includes the following steps (see FIG. 19A).

[First Step]

In a first step, setting is initialized (see (S1) in FIG. 19A).

For example, predetermined image data that is to be displayed on start-up, a predetermined mode for displaying the image data, and data for determining a predetermined display method for displaying the image data are obtained from the memory portion 212. Specifically, one still image data or another moving image data can be used as the predetermined image data. Furthermore, a first mode or a second mode can be used as the predetermined mode.

[Second Step]

In a second step, interrupt processing is allowed (see (S2) in FIG. 19A). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can be executed any time after the program is started up.

[Third Step]

In a third step, image data is displayed by a predetermined mode or a predetermined display method selected in the first step or the interrupt processing (see (S3) in FIG. 19A). Note that the predetermined mode determines a mode for displaying the data, and the predetermined display method determines a method for displaying the image data. For example, the image data VI can be used as data to be displayed.

One method for displaying the image data VI can be associated with the first mode, for example. Another method for displaying the image data VI can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, to perform display on the basis of the selection signals can be associated with the first mode.

For example, when selection signals are supplied at a frequency of 30 Hz or higher, preferably 60 Hz or higher, the movement of a displayed moving image can be smooth.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, to perform display on the basis of the selection signals can be associated with the second mode.

The supply of selection signals at a frequency lower than 30 Hz, preferably lower than 1 Hz, further preferably less than once a minute enables display with a flicker or flickering inhibited. Furthermore, the power consumption can be reduced.

For example, in the case where the data processing device 200 is used for a clock, the display can be refreshed at a frequency of once a second, once a minute, or the like.

In the case where a light-emitting element is used as a display element, for example, the light-emitting element can be made to emit light in a pulsed manner so that the image data is displayed. Specifically, an organic EL element can be made to emit light in a pulsed manner, and its afterglow can be used for display. The organic EL element has excellent frequency characteristics; thus, time for driving the light-emitting element can be shortened and the power consumption can be reduced in some cases. Heat generation is inhibited; thus, the deterioration of the light-emitting element can be suppressed in some cases. When the duty ratio is set to be lower than or equal to 20%, afterimages included in the display can be reduced.

[Fourth Step]

In a fourth step, selection is performed such that the program proceeds to a fifth step when an end instruction has been supplied (Yes), whereas the program proceeds to the third step when the end instruction has not been supplied (No) (see (S4) in FIG. 19A).

For example, the end instruction supplied in the interrupt processing may be used for the determination.

[Fifth Step]

In the fifth step, the program ends (see (S5) in FIG. 19A).

<<Interrupt Processing>>

The interrupt processing includes a sixth step to an eighth step described below (see FIG. 19B).

[Sixth Step]

In the sixth step, the illuminance of the environment where the data processing device 200 is used is sensed using the sensing portion 250, for example (see (S6) in FIG. 19B). Note that color temperature or chromaticity of ambient light may be sensed instead of the illuminance of the environment.

[Seventh Step]

In the seventh step, a display method is determined on the basis of the sensed illuminance data (see (S7) in FIG. 19B). For example, a display method is determined such that the display brightness is not too dark or too bright.

Note that in the case where the color temperature of the ambient light or the chromaticity of the ambient light is sensed in the sixth step, the color of display may be adjusted.

[Eighth Step]

In the eighth step, the interrupt processing ends (see (S8) in FIG. 19B).

Structure Example 3 of Data Processing Device

Another structure of the data processing device of one embodiment of the present invention is described with reference to FIG. 20.

FIG. 20A is a flow chart showing a program of one embodiment of the present invention. FIG. 20A is a flow chart showing interrupt processing different from the interrupt processing shown in FIG. 19B.

Note that the structure example 3 of the data processing device is different from the interrupt processing described with reference to FIG. 19B in that the interrupt processing includes a step of changing a mode on the basis of a supplied predetermined event. Different portions are described in detail here, and the above description is referred to for portions that can use similar structures.

<<Interrupt Processing>>

The interrupt processing includes a sixth step to an eighth step described below (see FIG. 20A).

[Sixth Step]

In the sixth step, the program proceeds to the seventh step when a predetermined event has been supplied (Yes), whereas the program proceeds to the eighth step when the predetermined event has not been supplied (No) (see (U6) in FIG. 20A). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 20A). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including a driver circuit GDA, a driver circuit GDB, and a driver circuit GDC supplies a selection signal can be changed (see FIG. 20B).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 20B and FIG. 20C). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a conductive film $G2(m+1)$ to a conductive film $G2(2m)$ on the basis of the signal GCLK, the signal PWC1, the signal PWC2, and the like.

Thus, for example, the driver circuit GDB can supply a selection signal without supply of selection signals from the driver circuit GDA and the driver circuit GDC. The display of the region where a selection signal is supplied from the driver circuit GDB can be refreshed without any change in the display of regions where selection signals are supplied from the driver circuit GDA and the driver circuit GDC. Power consumed by the driver circuits can be reduced.

[Eighth Step]

In the eighth step, the interrupt processing ends (see (U8) in FIG. 20A). Note that in a period during which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is arranged so as to be pushed in a housing can be used for the sensing portion 250.

<<Instruction Associated with Predetermined Event>>

For example, the end instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that position data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 18C). Materials distributed in a conference room in, for example, a company can be received and used for a conference material.

Structure Example 4 of Data Processing Device

Another structure of the data processing device of one embodiment of the present invention is described with reference to FIG. 21.

Note that the structure example 4 of the data processing device described with reference to FIG. 21A is different from the structure example described with reference to FIG. 19B in the interrupt processing. Specifically, the interrupt processing includes the step of determining a region, the step of generating an image, the step of displaying the image, and the step of imaging on the basis of a supplied predetermined event. Different portions are described in detail here, and the above description is referred to for portions that can use similar structures.

<<Interrupt Processing>>

The interrupt processing includes a sixth step to an eleventh step (see FIG. 21A).

[Sixth Step]

In the sixth step, the program proceeds to the seventh step when a predetermined event has been supplied (Yes), whereas the program proceeds to the eleventh step when the predetermined event has not been supplied (No) (see (V6) in FIG. 21A).

The predetermined event can be supplied using the sensing portion 250, for example. Specifically, a motion such as lifting of the data processing device can be used as the predetermined event. For example, a motion of the data processing device can be sensed using an angular acceleration sensor or an acceleration sensor. Touch of a finger or approach of an object can be sensed using a touch sensor.

[Seventh Step]

In the seventh step, a first region SH is determined (see (V7) in FIG. 21A).

For example, a region where an object such as a finger touches or approaches the input/output device 220 of one embodiment of the present invention can be the first region SH. A region that is set in advance by the user or the like can be used as the first region SH.

Specifically, an image of a finger THM or the like that touches or approaches the functional panel of one embodiment of the present invention is taken using the pixel 703($i,j$) and subjected to image processing, whereby the first region SH can be determined (see FIG. 21B).

For example, an image of a shadow caused when external light is blocked by touch or approach of an object such as the finger THM is taken using the pixel 703($i,j$) in the functional panel of one embodiment of the present invention and subjected to image processing, whereby the first region SH can be determined.

With the use of the pixel 703($i,j$) in the functional panel of one embodiment of the present invention, an object such as the finger THM that touches or approaches the functional panel is irradiated with light, and an image of light reflected by the object is taken using the pixel 703($i,j$) and subjected to image processing, whereby the first region SH can be determined.

A region where an object such as the finger THM touches can be determined as the first region SH by a touch sensor.

[Eighth Step]

In the eighth step, an image FI including a second region and a third region is generated on the basis of the first region SH (see (V8) in FIG. 21A and FIG. 21B). For example, the shape of the first region SH is used as the shape of the second region, and a region excluding the first region SH is used as the third region.

[Ninth Step]

In the ninth step, the image FI is displayed such that the second region overlaps with the first region SH (see (V9) in FIG. 21A and FIG. 21B).

For example, an image signal is generated from the image FI and supplied to the region 231, and light is emitted from the pixel 703($i,j$). In a period during which the first selection signal is supplied to the conductive film G1($i$), the generated image signal is supplied to the conductive film S1$g$($j$), and the image signal can be written to the pixel 703($i,j$). The generated image signal is supplied to the conductive film S1$g$($j$) and the conductive film S2$g$($j$), and an enhanced image signal can be written to the pixel 703($i,j$). The use of an enhanced image signal enables display with higher luminance.

Thus, the image FI can be displayed to overlap with the first region SH where the object such as a finger touches or approaches the region 231. The region where the object such as a finger touches can be irradiated with light using the pixel 703($i,j$). The touching or approaching object such as the finger THM can be illuminated with a light. The object such as a finger can be led to touch or approach the region that is determined in advance by the user or the like.

[Tenth Step]

In the tenth step, the object that touches or approaches the first region SH is imaged while the image FI is displayed (see (V10) in FIG. 21A and FIG. 21B).

For example, an image of the finger THM or the like approaching the region 231 is taken while the finger or the like is irradiated with light. Specifically, an image of a fingerprint FP of the finger THM touching the region 231 can be taken (see FIG. 21C).

For example, the supply of the first selection signal can be stopped while an image is displayed with the pixel 703($i,j$). For example, imaging can be performed using the pixel 703($i,j$) while the supply of the first selection signal to the pixel circuit 530G($i,j$) is stopped.

Accordingly, the touching or approaching object such as a finger can be imaged while the object is illuminated. Imaging can be performed in a period during which the first selection signal is not supplied. Noise in imaging can be inhibited. A clear image of a fingerprint can be obtained. An image that can be used for the authentication of the user can be obtained. In any area of the region 231, an image of the fingerprint of the finger touching the region 231 can be taken clearly. Thus, a novel data processing device that is highly convenient, useful, or reliable can be provided.

[Eleventh Step]

In the eleventh step, the interrupt processing ends (see (V11) in FIG. 21A).

Structure Example 5 of Data Processing Device

Another structure of the data processing device of one embodiment of the present invention is described with reference to FIG. 22.

<<Interrupt Processing>>

Figure 22A:
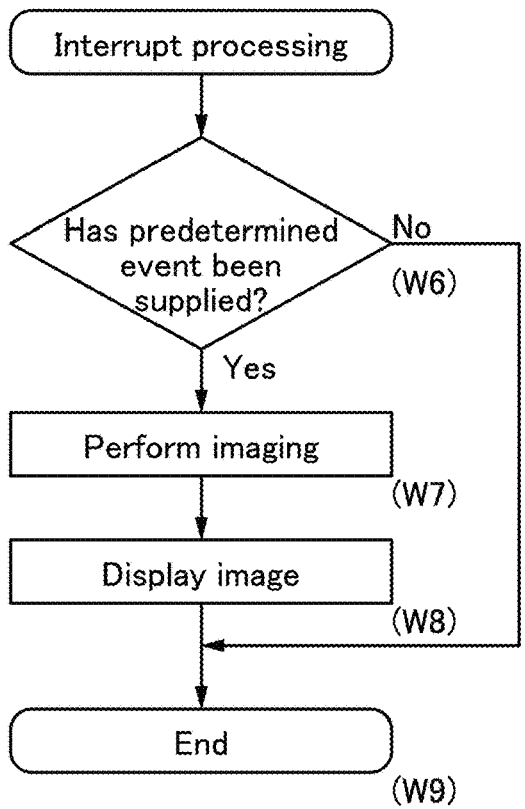
FIG. 22A to FIG. 22D are diagrams showing a driving method of a data processing device of an embodiment.

The interrupt processing includes a sixth step to a ninth step (see FIG. 22A).

[Sixth Step]

In the sixth step, the program proceeds to the seventh step when a predetermined event has been supplied (Yes), whereas the program proceeds to the ninth step when the predetermined event has not been supplied (No) (see (W6) in FIG. 22A).

Figure 22B:
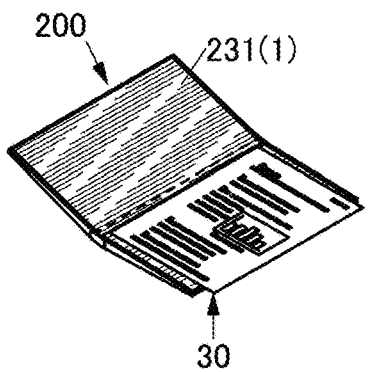

For example, an object 30 is placed in a certain position in the data processing device 200, and a predetermined event can be supplied with use of the input portion 240 (see FIG. 22B). Specifically, the contact or approach of a finger or the like is sensed with use of a touch sensor in a region 231(1) and can be used for the predetermined event. For example, a touch sensor placed to overlap with a place where an image associated with the interrupt processing is displayed can be used. Specifically, an image associated with the interrupt processing is displayed in the region 231(1) and the input portion 240 placed to overlap with the region 231(1) can be used.

[Seventh Step]

In the seventh step, imaging is performed using the region 231(1) (see (W7) in FIG. 22A).

Figure 22C:
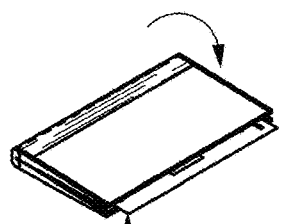

For example, when the object 30 approaches or adheres closely to the region 231, a still image is captured (see FIG. 22C). Specifically, a still image is captured when the intensity of external light entering the region 231 becomes smaller than a predetermined value. Alternatively, a still image is captured when an image taken in the region 231 does not show a change exceeding a predetermined level for a predetermined period. Alternatively, a still image is captured after the housing of the data processing device 200 is closed.

[Eighth Step]

In the eighth step, display is performed using the region 231(1) (see (W8) in FIG. 22A).

Figure 22D:
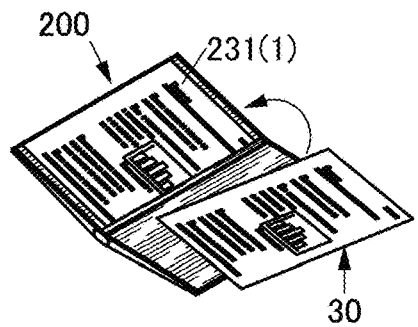

For example, the still image captured in the seventh step is displayed in the region 231 (see FIG. 22D).

[Ninth Step]

In the ninth step, the interrupt processing ends (see (W9) in FIG. 22A).

Accordingly, the touching or approaching object such as a finger can be imaged while being illuminated. A clear image with reduced distortion can be obtained. Information printed on a print or the like can be duplicated to electronic data. Thus, a novel data processing device that is highly convenient, useful, or reliable can be provided.

Note that this embodiment can be combined with any of the other embodiments in this specification as appropriate.

Embodiment 10

In this embodiment, structures of data processing devices of one embodiment of the present invention are described with reference to drawings.

Figure 23A:
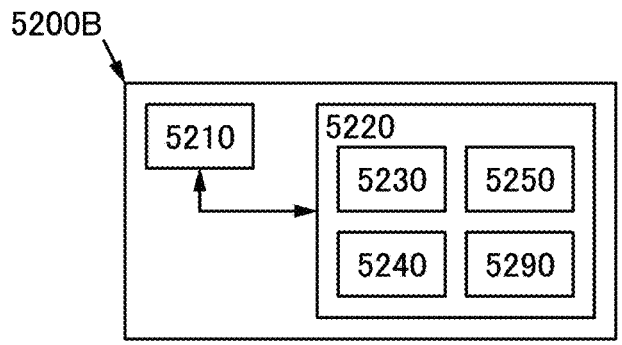
FIG. 23A to FIG. 23E are diagrams illustrating structures of data processing devices of an embodiment.
Figure 23B:
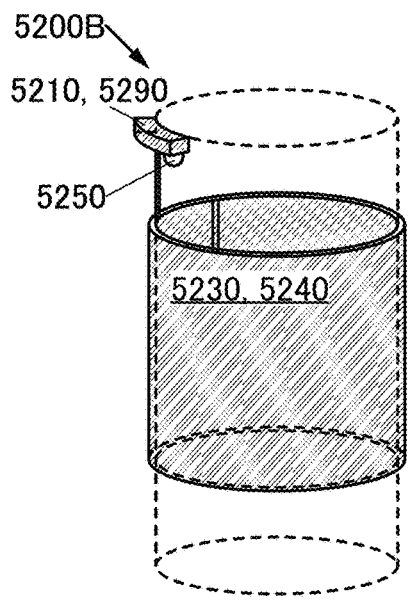
Figure 23C:
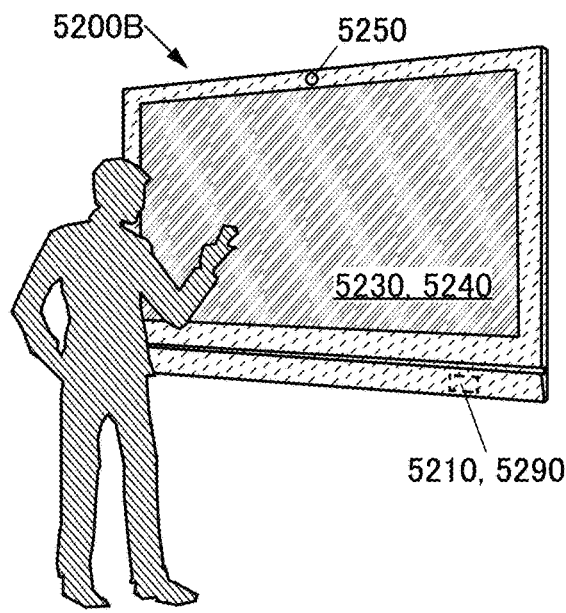
Figure 23D:
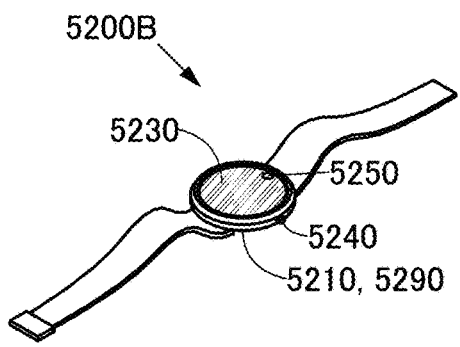
Figure 23E:
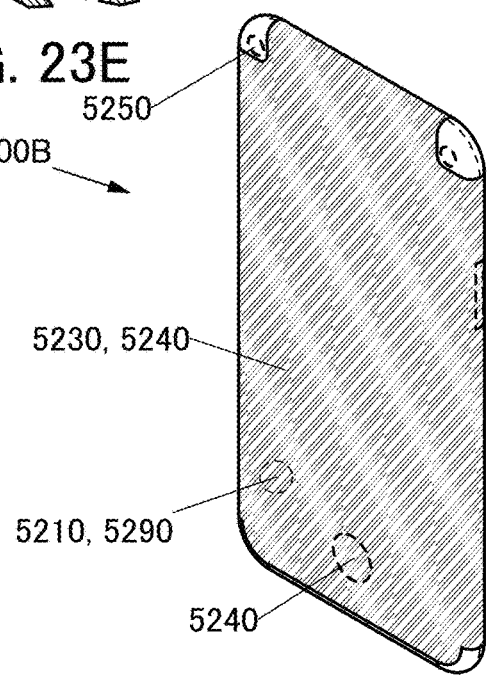
Figure 24A:
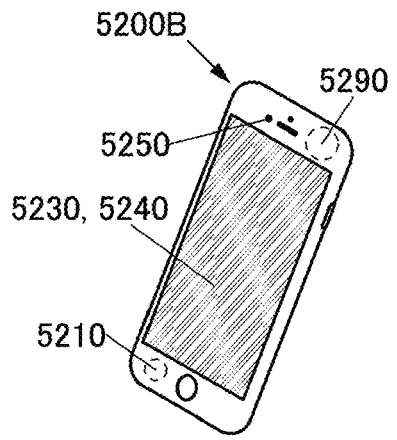
FIG. 24A to FIG. 24E are diagrams illustrating structures of data processing devices of an embodiment.
Figure 24B:
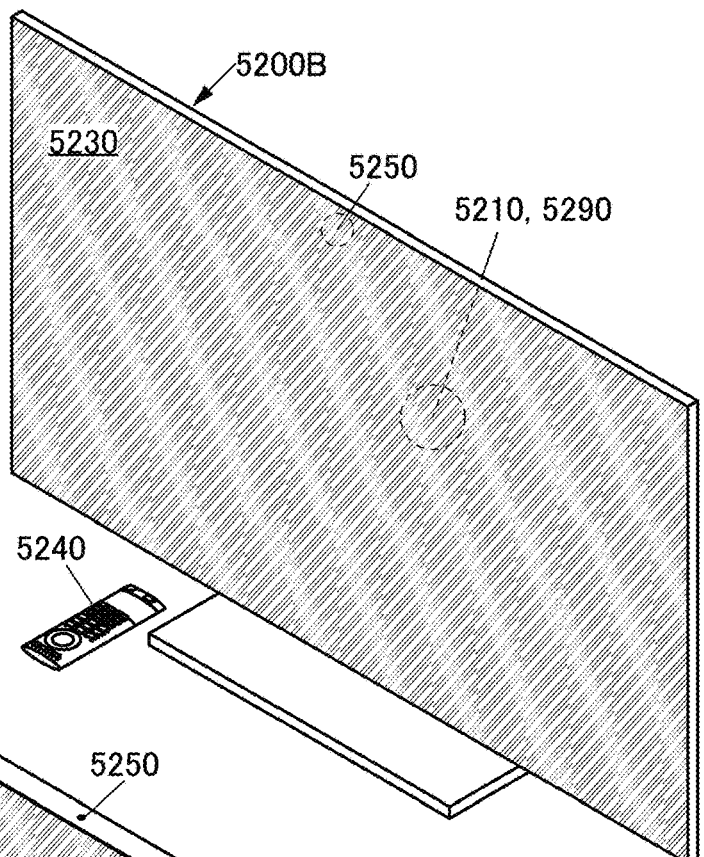
Figure 24C:
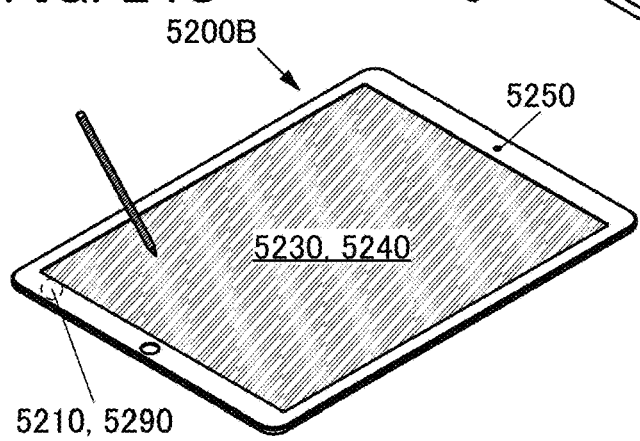
Figure 24D:
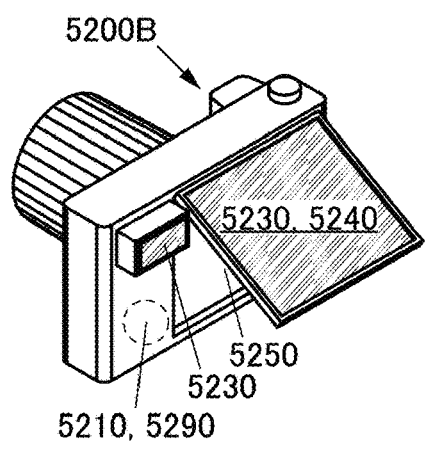
Figure 24E:
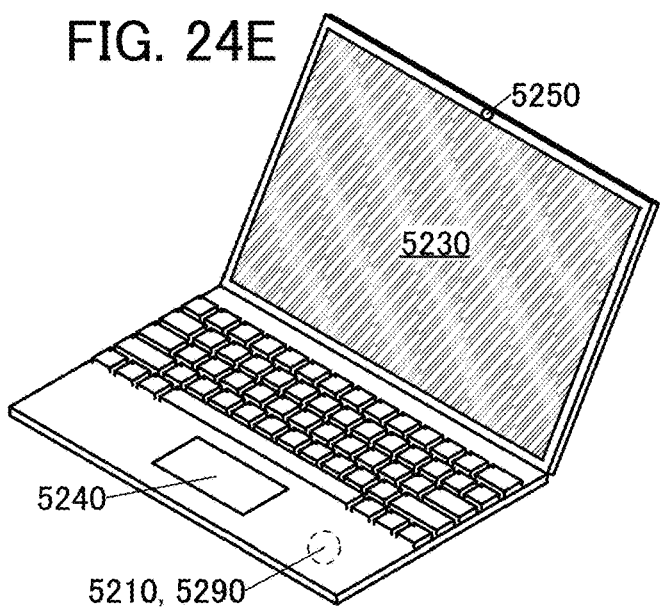
Figure 25A:
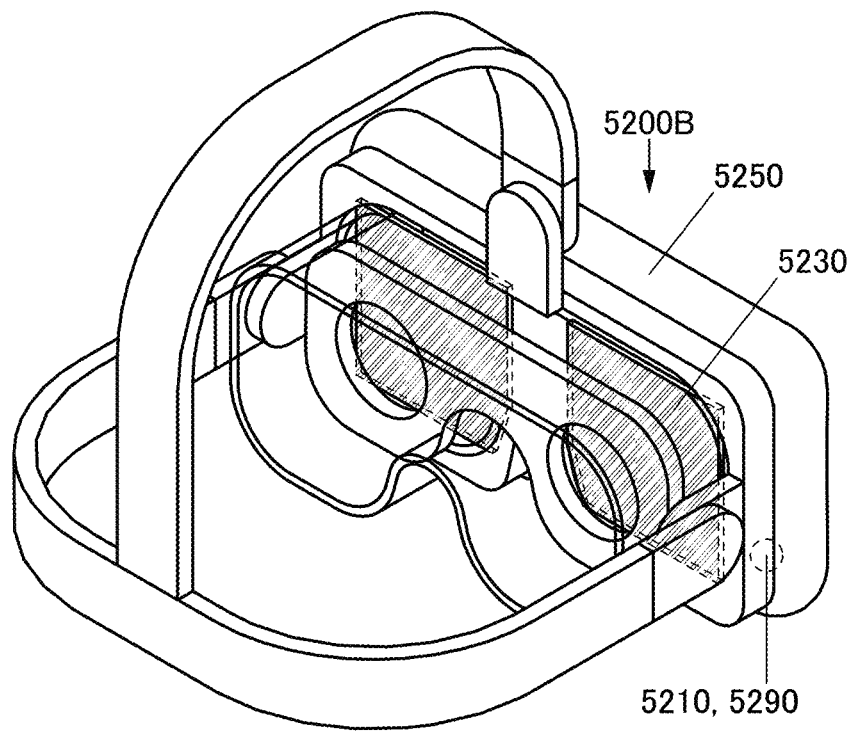
FIG. 25A and FIG. 25B are diagrams illustrating structures of data processing devices of an embodiment.
Figure 25B:
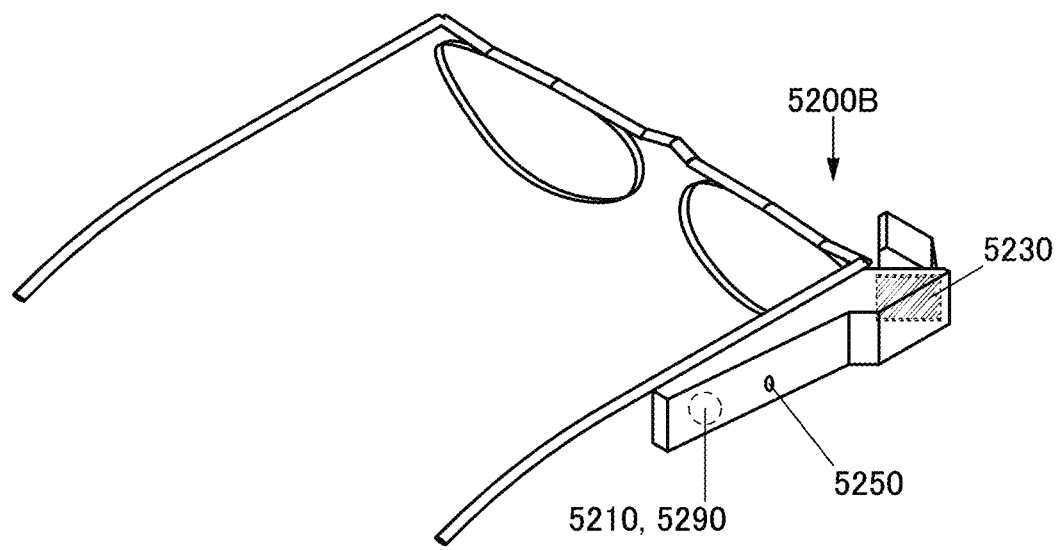

FIG. 23 to FIG. 25 are diagrams illustrating structures of the data processing devices of one embodiment of the present invention. FIG. 23A is a block diagram of the data processing device, and FIG. 23B to FIG. 23E are perspective views illustrating structures of the data processing devices. In addition, FIG. 24A to FIG. 24E are perspective views illustrating structures of the data processing devices. FIG. 25A and FIG. 25B are perspective views illustrating structures of the data processing devices.

<Data Processing Device>

A data processing device 5200B described in this embodiment includes an arithmetic device 5210 and an input/output device 5220 (see FIG. 23A).

The arithmetic device 5210 has a function of being supplied with operation data and has a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image data. For example, the display panel described in any one of Embodiment 1 to Embodiment 6 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude detection device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, near field communication, or the like.

Structure Example 1 of Data Processing Device

For example, the display portion 5230 can have an outer shape along a cylindrical column or the like (see FIG. 23B). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

Structure Example 2 of Data Processing Device

For example, the data processing device has a function of generating image data on the basis of the path of a pointer used by a user (see FIG. 23C). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like.

Structure Example 3 of Data Processing Device

The data processing device can receive data from another device and display the data on the display portion 5230 (see FIG. 23D). Several options can be displayed. The user can choose some from the options and send a reply to a transmitter of the data. For example, the data processing device has a function of changing its display method in accordance with the illuminance of a usage environment. Thus, the power consumption of a smartwatch can be reduced, for example. A smartwatch can display an image to be suitably used even in an environment under strong external light, e.g., outdoors in fine weather, for example.

Structure Example 4 of Data Processing Device

For example, the display portion 5230 has a surface gently curved along a side surface of a housing (see FIG. 23E). The display portion 5230 includes a display panel, and the display panel has a function of performing display on the front surface, the side surfaces, the top surface, and the rear surface, for example. Thus, for example, a mobile phone can display data not only on its front surface but also on its side surfaces, its top surface, and its rear surface.

Structure Example 5 of Data Processing Device

For example, the data processing device can receive data via the Internet and display the data on the display portion 5230 (see FIG. 24A). A created message can be checked on the display portion 5230. The created message can be sent to another device. For example, the data processing device has a function of changing its display method in accordance with the illuminance of a usage environment. Thus, the power consumption of a smartphone can be reduced. A smartphone can display an image to be suitably used even in an environment under strong external light, e.g., outdoors in fine weather, for example.

Structure Example 6 of Data Processing Device

A remote controller can be used as the input portion 5240 (see FIG. 24B). For example, the data processing device can receive data from a broadcast station or via the Internet and display the data on the display portion 5230. An image of a user can be taken using the sensing portion 5250. The image of the user can be transmitted. The data processing device can obtain a viewing history of the user and provide it to a cloud service. The data processing device can obtain recommendation data from a cloud service and display the data on the display portion 5230. A program or a moving image can be displayed on the basis of the recommendation data. For example, the data processing device has a function of changing its display method in accordance with the illuminance of a usage environment. Accordingly, for example, a television system can display an image to be suitably used even when irradiated with strong external light that enters a room in fine weather.

Structure Example 7 of Data Processing Device

For example, the data processing device can receive educational materials via the Internet and display them on the display portion 5230 (see FIG. 24C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another data processing device. When the data processing device is placed on a stand or the like, the display portion 5230 can be used as a sub-display. Thus, for example, a tablet computer can display an image to be suitably used even in an environment under strong external light, e.g., outdoors in fine weather.

Structure Example 8 of Data Processing Device

The data processing device includes, for example, a plurality of display portions 5230 (see FIG. 24D). For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The data processing device has a function of changing its shooting conditions in accordance with the illuminance of a usage environment. Accordingly, for example, a digital camera can display an object in such a manner that an image is favorably viewed even in an environment under strong external light, e.g., outdoors in fine weather.

Structure Example 9 of Data Processing Device

For example, the data processing device of this embodiment is used as a master and another data processing device is used as a slave, whereby the other data processing device can be controlled (see FIG. 24E). As another example, part of image data can be displayed on the display portion 5230 and another part of the image data can be displayed on a display portion of another data processing device. An image signal can be supplied to another data processing device. With the communication portion 5290, data to be written can be obtained from an input portion of another data processing device. Thus, a large display region can be utilized by using a portable personal computer, for example.

Structure Example 10 of Data Processing Device

The data processing device includes, for example, the sensing portion 5250 that senses an acceleration or a direction (see FIG. 25A). The sensing portion 5250 can supply data on the position of the user or the direction in which the user faces. The data processing device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

<<Structure example 11 of data Processing Device>>

The data processing device includes, for example, an imaging device and the sensing portion 5250 that senses an acceleration or a direction (see FIG. 25B). The sensing portion 5250 can supply data on the position of the user or the direction in which the user faces. The data processing device can generate image data in accordance with the position of the user or the direction in which the user faces. Accordingly, the data can be shown together with a real-world scene, for example. An augmented reality image can be displayed on a glasses-type data processing device.

Note that this embodiment can be combined with any of the other embodiments in this specification as appropriate.

Example 1

In this example, a structure of a fabricated functional panel of one embodiment of the present invention is described with reference to FIG. 2C, FIG. 2D, and FIG. 27A.

Figure 27A:
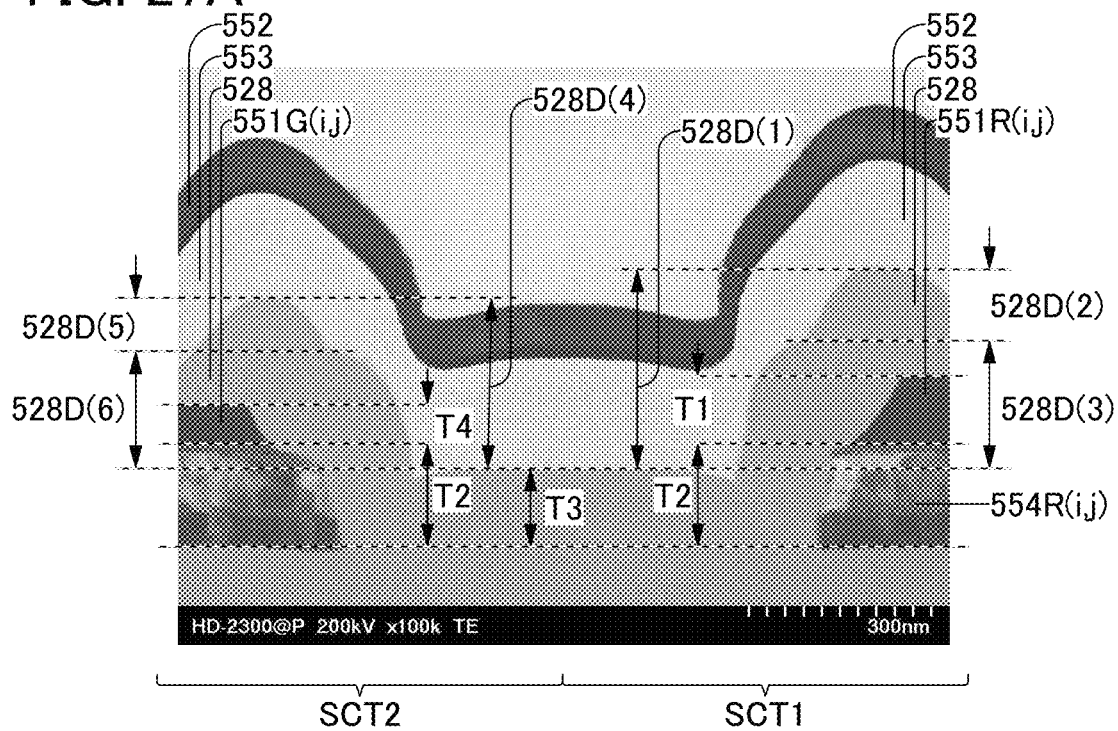
FIG. 27A and FIG. 27B are each a transmission electron microscopy image showing a cross section of a functional panel in Example.

FIG. 27A is a transmission electron microscopy image showing a cross section of the functional panel of one embodiment of the present invention, and corresponds to part of FIG. 2C.

Structure Example 1 of Functional Panel

Figure 28A:
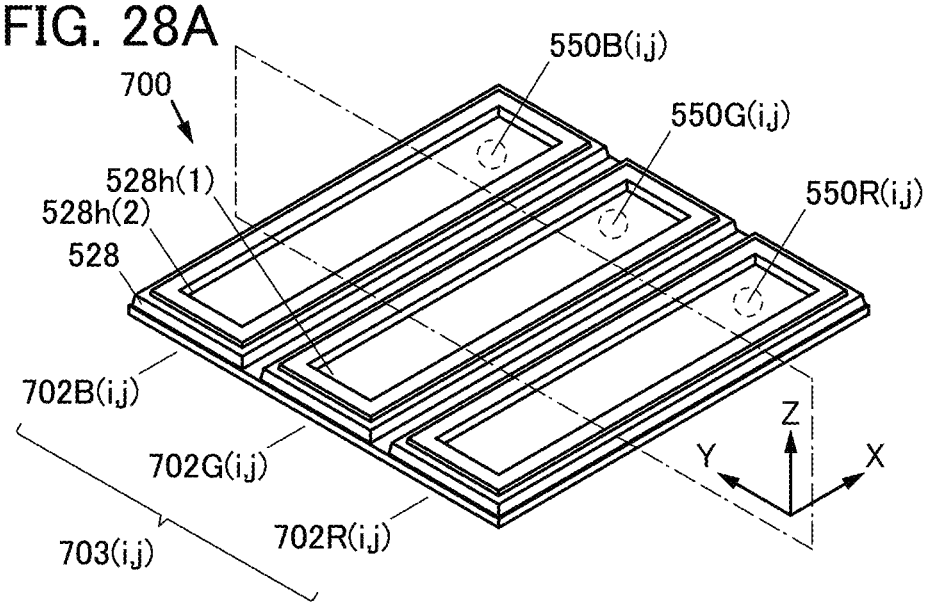
FIG. 28A to FIG. 28C are diagrams illustrating a structure and characteristics of a functional panel in Example.

The fabricated functional panel includes an element 550R($i,j$), a reflective film 554R($i,j$), and the insulating film 528 (see FIG. 27A and FIG. 28A).

<<Structure Example of Element>>

The element 550R($i,j$) includes an electrode 551R($i,j$), the electrode 552, and the layer 553 containing a light-emitting material.

The layer 553 containing a light-emitting material includes a region interposed between the electrode 551R($i,j$) and the electrode 552. Note that a film containing indium, tin, silicon, and oxygen was used for the electrode 551R($i,j$), and a stacked film was used for the electrode 552. The stacked film is a film in which a film containing indium, tin, and oxygen and a film containing silver and magnesium are stacked in this order.

The electrode 551R($i,j$) has a light-transmitting property, and the electrode 551R($i,j$) has the thickness T1. Specifically, the thickness T1 was 110 nm.

<<Structure Example of Reflective Film 554R($i,j$)>>

The electrode 551R($i,j$) is interposed between a region of the reflective film 554R($i,j$) and the layer 553 containing a light-emitting material, and the reflective film 554R($i,j$) has a thickness T2. Specifically, the thickness T2 was 160 nm. Note that a stacked film was used as the reflective film, and the stacked film is a film in which a titanium film, an aluminum film, and a titanium film are stacked in this order.

<<Structure Example of Insulating Film 528>>

The insulating film 528 has the thickness T3. Specifically, the thickness T3 was 170 nm. Note that a film containing silicon, oxygen, and nitrogen was used as the insulating film 528.

The opening portion 528h(1) overlaps with the electrode 551R($i,j$), and the insulating film 528 has the step-like cross-sectional shape SCT1.

The step-like cross-sectional shape SCT1 includes the step 528D(1). Specifically, the step 528D(1) was 330 nm. The step 528D(1) is larger than or equal to a thickness obtained by adding the thickness T2 to the thickness T1.

Thus, a thin portion of the layer 553 containing a light-emitting material was able to be formed in the step 528D(1) surrounding the opening portion. Specifically, a portion having a thickness of 64.1 nm was able to be formed in the layer 553 containing a light-emitting material. Note that the layer 553 containing a light-emitting material has a thickness of 176.6 nm in a flat portion. In addition, the electrode 552 has a thickness of 70 nm in the flat portion and a thickness of 39.5 nm in the thinnest portion. Furthermore, a current was able to be inhibited from flowing to the outside of the opening portion 528h(1) along the spread of the layer 553 containing a light-emitting material. Moreover, light-emitting regions were able to be concentrated in a region overlapping with the opening portion 528h(1).

The step-like cross-sectional shape SCT1 includes the step 528D(2) and the step 528D(3) in the step 528D(1).

The step 528D(2) is smaller than the step 528D(3), and the step 528D(2) is greater than or equal to 0.5 times and less than or equal to 1.5 times the thickness T1. Specifically, the step 528D(2) was 120 nm. The step 528D(3) was 210 nm.

The functional panel described in this example includes the element 550G($i,j$) (see FIG. 2C, FIG. 2D, and FIG. 27A).

The element 550G($i,j$) includes the electrode 551G($i,j$), the electrode 552, and the layer 553 containing a light-emitting material.

The layer 553 containing a light-emitting material includes a region interposed between the electrode 551G($i,j$) and the electrode 552.

<<Structure Example of Insulating Film 528>>

The opening portion 528h(2) overlaps with the electrode 551G($i,j$), and the insulating film 528 has the step-like cross-sectional shape SCT2.

The step-like cross-sectional shape SCT2 includes the step 528D(4). Specifically, the step 528D(4) was 280 nm. The step 528D(4) was 0.85 times the step 528D(1).

Thus, a thin portion of the layer 553 containing a light-emitting material was able to be formed along each of the step 528D(1) and the step 528D(4). Specifically, a portion having a thickness of 64.1 nm was able to be formed in the layer 553 containing a light-emitting material. Note that the layer 553 containing a light-emitting material has a thickness of 176.6 nm in a flat portion. Alternatively, a current was able to be inhibited from flowing between the electrode 552 in a region overlapping with the opening portion 528h(2) and the electrode 551R($i,j$) through the layer 553 containing a light-emitting material in a region overlapping with the insulating film 528. Furthermore, a current was able to be inhibited from flowing between the electrode 552 in a region overlapping with the opening portion 528h(1) and the electrode 551G($i,j$) through the layer 553 containing a light-emitting material in a region overlapping with the insulating film 528. Moreover, light-emitting regions can be concentrated in a region overlapping with the opening portion 528h(1) or a region overlapping with the opening portion 528h(2).

The electrode 551G($i,j$) has the thickness T4. Specifically, the thickness T4 was 60 nm.

The step-like cross-sectional shape SCT2 includes the step 528D(5) and the step 528D(6) in the step 528D(4).

The step 528D(5) is greater than or equal to 0.5 times and less than or equal to 1.5 times the thickness T4, and the step 528D(5) is smaller than the step 528D(6). Specifically, the step 528D(5) was 80 nm that is 1.3 times the thickness T4. The step 528D(6) was 200 nm that is 0.95 times the step 528D(3).

Thus, the step 528D(5) was able to be changed depending on the thickness T4 of the electrode 551G($i,j$). Alternatively, the step 528D(3) and the step 528D(6) were able to be constant without being affected by the thickness T1 of the electrode 551R(i,j) and the thickness T4 of the electrode 551G(i,j). Alternatively, a thin portion of the layer 553 containing a light-emitting material was able to be formed along the step 528D(3) surrounding the opening portion 528h(1) and the step 528D(6) surrounding the opening portion 528h(2). Alternatively, a current was able to be inhibited from flowing between the electrode 552 in a region overlapping with the opening portion 528h(2) and the electrode 551R(i,j) through the layer 553 containing a light-emitting material in a region overlapping with the insulating film 528. Furthermore, a current was able to be inhibited from flowing between the electrode 552 overlapping with the opening portion 528h(1) and the electrode 551G(i,j) through the layer 553 containing a light-emitting material in a region overlapping with the insulating film 528. Moreover, light-emitting regions were able to be concentrated in a region overlapping with the opening portion 528h(1) or a region overlapping with the opening portion 528h(2).

Example 2

In this example, a structure of a fabricated functional panel of one embodiment of the present invention is described with reference to FIG. 27B.

Figure 27B:
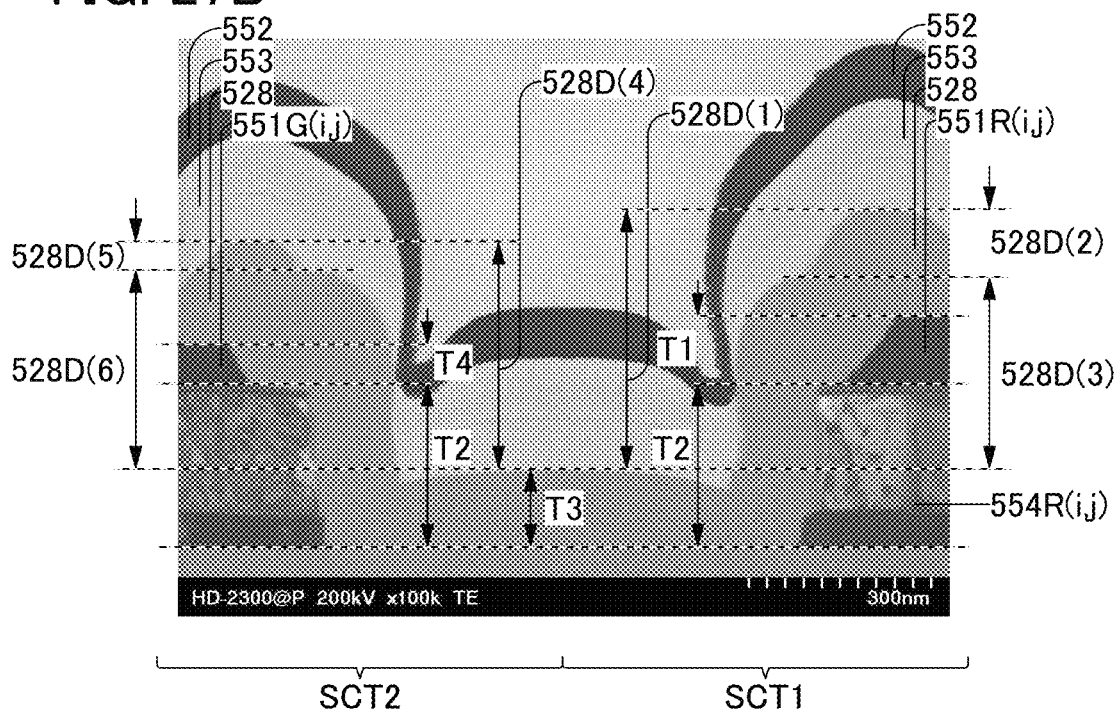

FIG. 27B is a transmission electron microscopy image showing a cross section of the functional panel of one embodiment of the present invention.

Structure Example 2 of Functional Panel

The functional panel described in this example is different from the functional panel described in Example 1 in the size of each portion (see FIG. 27B). The sizes of respective portions are listed in the following table. Note that a reflective film included in the functional panel described in this example is thicker than that included in the functional panel described in Example 1. For example, the thickness T2 of the reflective film 554R(i,j) in the functional panel described in this example is thicker than the thickness T2 of the reflective film 554R(i,j) in the functional panel described in Example 1.

TABLE 1

| | T1 | T2 | T3 | T4 | 528D(1) | 528D(2) | 528D(3) | 528D(4) | 528D(5) | 528D(6) |
|---|---|---|---|---|---|---|---|---|---|---|
| Example 1 | 110 nm | 160 nm | 170 nm | 60 nm | 330 nm | 120 nm | 210 nm | 280 nm | 80 nm | 200 nm |
| Example 2 | 110 nm | 260 nm | 170 nm | 60 nm | 420 nm | 110 nm | 310 nm | 370 nm | 50 nm | 320 nm |

Thus, a thin portion of the layer 553 containing a light-emitting material was able to be formed along the step 528D(1) surrounding the opening portion. Specifically, a portion having a thickness of 4.0 nm was able to be formed in the layer 553 containing a light-emitting material. Note that the layer 553 containing a light-emitting material has a thickness of 176.6 nm in a flat portion. In addition, the electrode 552 has a thickness of 70 nm in the flat portion and a thickness of 14.4 nm in the thinnest portion Example 3

In this example, a structure of a fabricated functional panel of one embodiment of the present invention is described with reference to Table 2, FIG. 27B, and FIG. 28A to FIG. 28C.

Figure 28B:
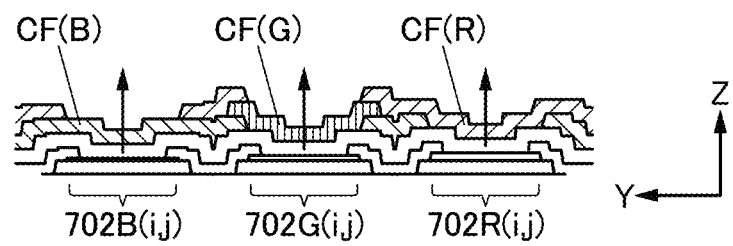
Figure 28C:
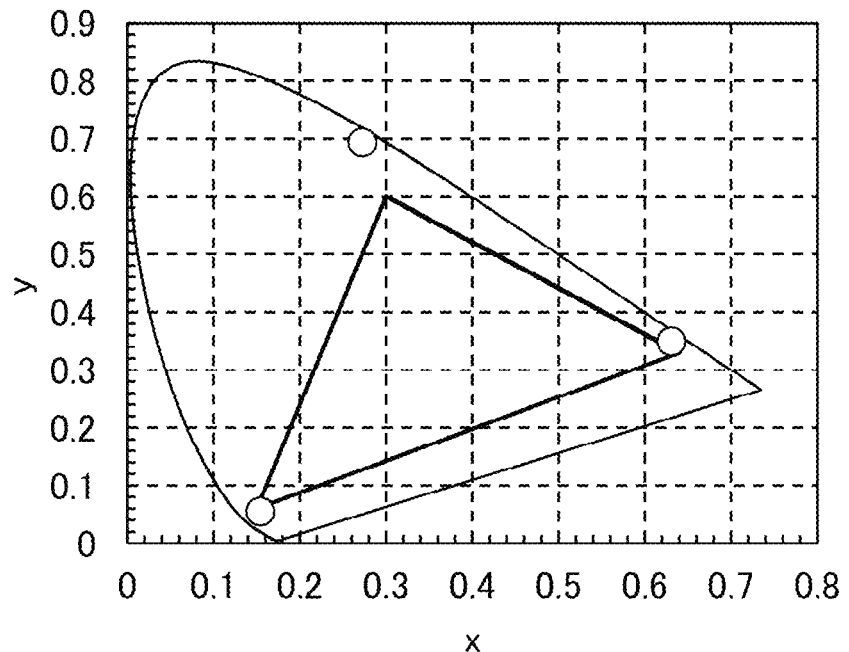

FIG. 28A is a perspective view of the functional panel of one embodiment of the present invention, and FIG. 28B is a cross-sectional view of a cutting plane Y-Z in FIG. 28A. FIG. 28C is a chromaticity diagram showing display performance of the functional panel of one embodiment of the present invention.

Structure Example 3 of Functional Panel

The functional panel described in this example has specifications listed in the following table. Each portion of the functional panel has the size described with reference to FIG. 27B in Example 2.

TABLE 2

| Items | Specifications |
|---|---|
| Display region | 21.1 mm(H) × 11.9 mm(V) (diagonal 0.95 inch) |
| Pixel number | WQHD (2560 × 1440 pixels) |
| Resolution | 3078 ppi |
| Pixel pitch | 2.75 μm(H) × 8.25 um(V) |
| Pixel arrangement | RGB stripe |
| Element structure | Tandem OLED |
| | Color filter |

Moreover, the functional panel described in this embodiment includes a pixel set 703(i,j), and the pixel set 703(i,j) includes the pixel 702B(i,j), the pixel 702G(i,j), and the pixel 702R(i,j) (see FIG. 28A).

The pixel 702B(i,j) includes a tandem light-emitting element and has a microcavity resonance structure that is adjusted to efficiently extract blue light; the pixel 702G(i,j) includes a tandem light-emitting element and has a microcavity resonance structure that is adjusted to efficiently extract green light; and the pixel 702R(i,j) includes a tandem light-emitting element and has a microcavity resonance structure that is adjusted to efficiently extract red light (see FIG. 28B).

Note that the tandem light-emitting elements each include a light-emitting unit that emits blue light and a light-emitting unit that emits yellow light, and the light-emitting unit that emits yellow light includes a region interposed between the light-emitting unit that emits blue light and the electrode 552.

Furthermore, the functional panel described in this embodiment includes a coloring film CF(B) that transmits blue light, the coloring film CF(G) that transmits green light, and a coloring film CF(R) that transmits red light. The coloring film CF(B) is placed to overlap with the pixel 702B(i,j), the coloring film CF(G) is placed to overlap with the pixel 702G(i,j), and the coloring film CF(R) is placed to overlap with the pixel 702R(i,j). Note that a region where the coloring films overlap with each other is provided between adjacent pixels.

<Evaluation Result>

Red, green, and blue colors were displayed with the use of the fabricated functional panel, and their chromaticities were measured with a spectroradiometer (manufactured by TOPCON TECHNOHOUSE CORPORATION: SR-UL1R). The measurement results are shown in the following table and plotted on an xy chromaticity diagram (CIE1931) (see FIG. 28C). Note that a triangle on the chromaticity diagram corresponds to an sRGB color space, and the fabricated functional panel has a capability of expressing a color gamut with an sRGB area ratio of 120.1% and an sRGB coverage of 96.0%.

TABLE 3

|  | Chromaticity | | Luminance | Driving voltage |
| --- | --- | --- | --- | --- |
|  | x | y | (cd/m$^2$) | (V) |
| Red | 0.629 | 0.351 | 1229 | 10.8 |
| Green | 0.272 | 0.694 | 3377.8 | 10.2 |
| Blue | 0.153 | 0.049 | 393.2 | 10.6 |

Bright red, green, and blue colors were able to be displayed. Even when the luminance is changed, a change in display color was extremely small and a crosstalk phenomenon was suppressed.

Example 4

In this example, the fabricated functional panel is described with reference to FIG. 29A to FIG. 33C and Table 4.

Figure 29A:
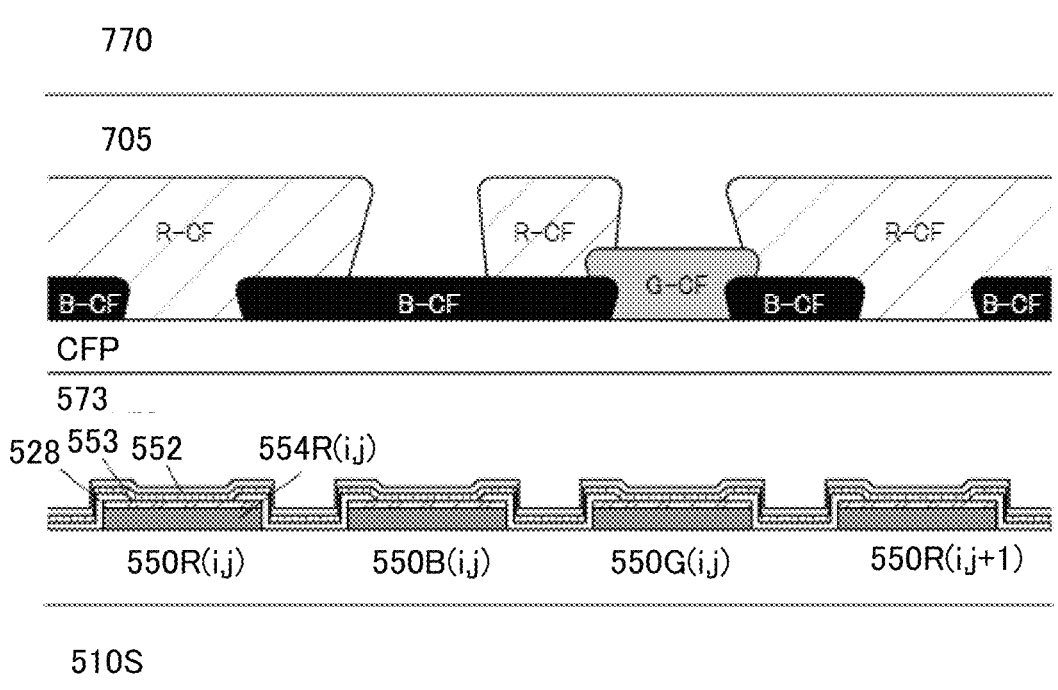
FIG. 29A and FIG. 29B are diagrams illustrating a structure of a functional panel in Example.
Figure 29B:
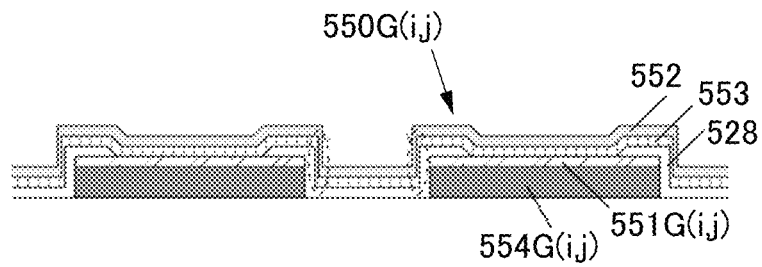

FIG. 29A is a cross-sectional view illustrating part of the structure of the fabricated functional panel, and FIG. 29B is a cross-sectional view illustrating part of the structure in FIG. 29A.

Figure 30A:
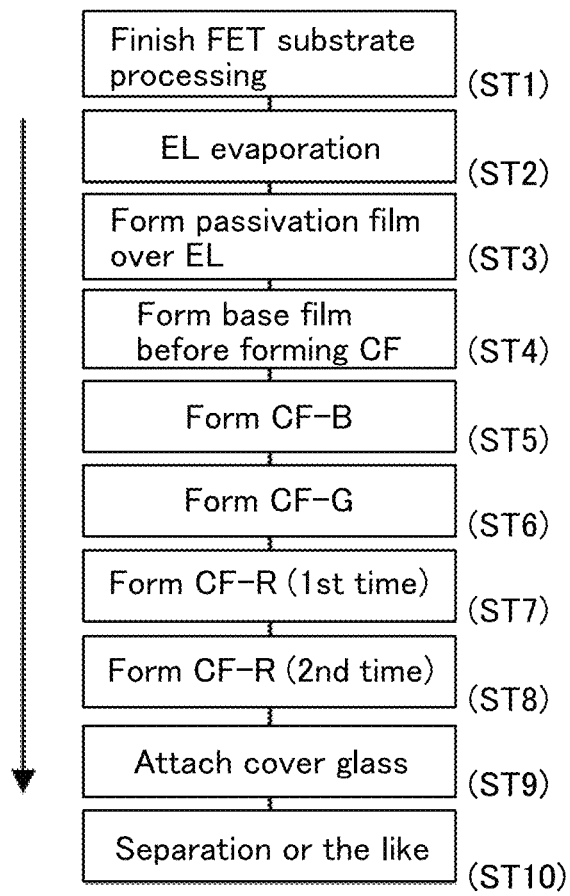
FIG. 30A is a diagram showing a fabrication method of a functional panel in Example.
Figure 30B:
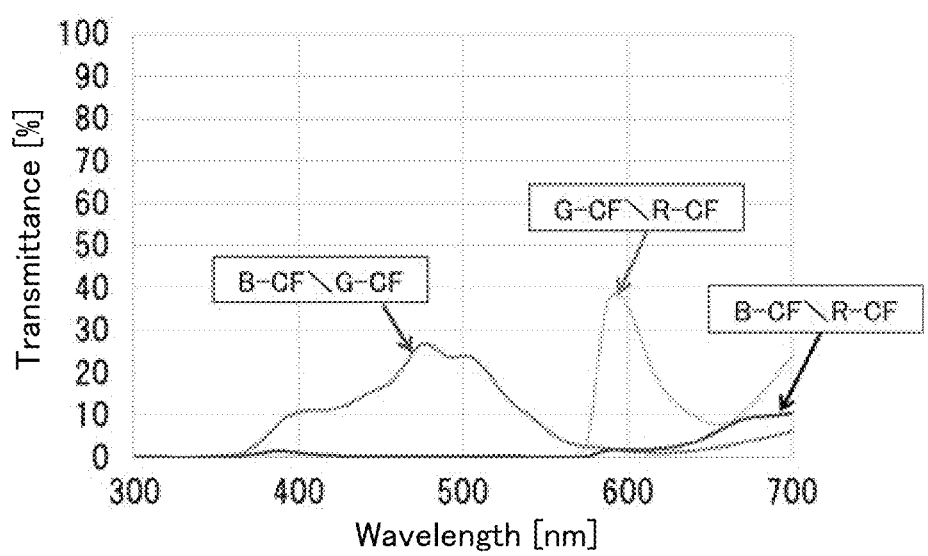
FIG. 30B is a graph showing characteristics of coloring films in the functional panel in Example.

FIG. 30A is a flow chart showing a fabrication method of the functional panel, and FIG. 30B is a graph showing wavelength-transmittance curves of coloring films overlapping with each other.

Figure 31A:
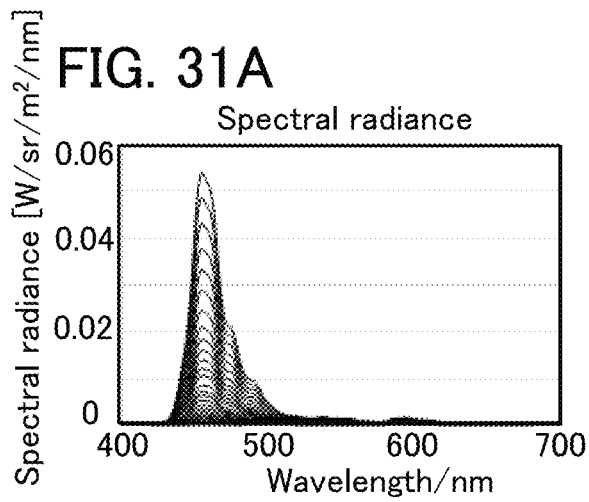
FIG. 31A to FIG. 31F are graphs showing characteristics of a functional panel in Example.
Figure 31B:
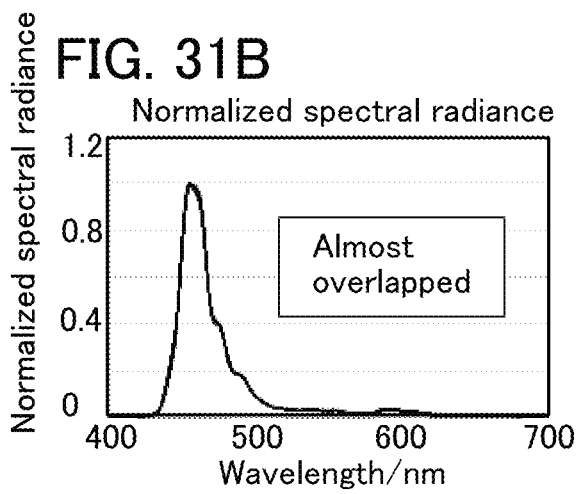
Figure 31C:
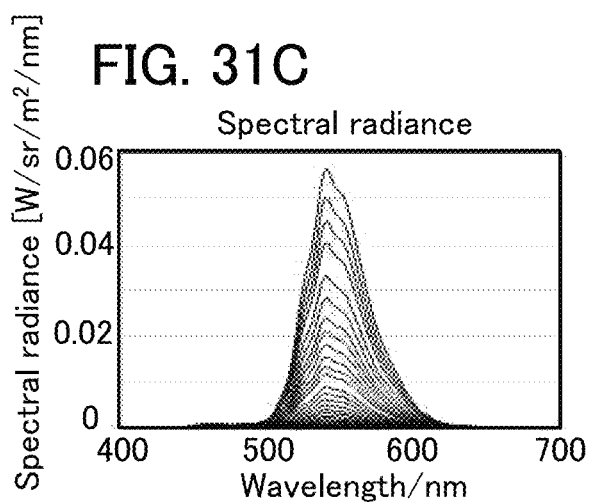
Figure 31D:
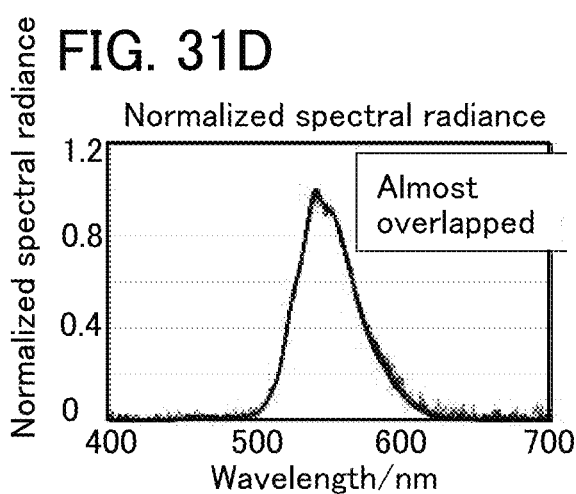
Figure 31E:
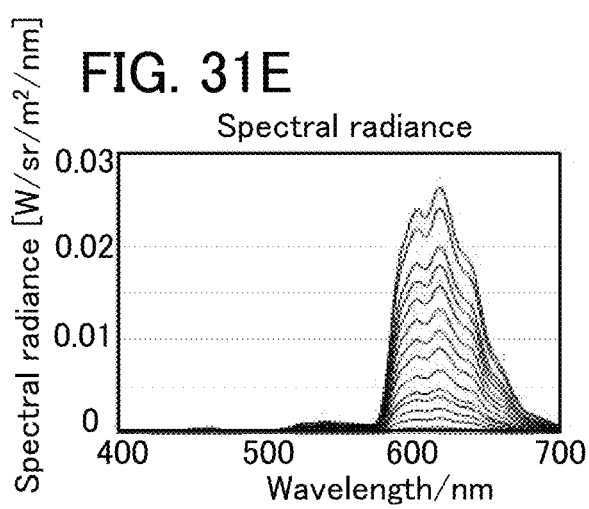
Figure 31F:
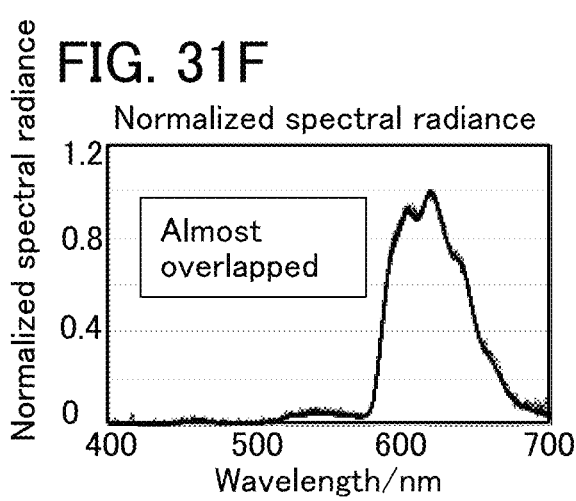

FIG. 31A is a graph showing changes in spectral radiance of different brightness of blue displayed on the fabricated functional panel, and FIG. 31B is a graph showing normalized spectral radiance, which is shown in FIG. 31A, based on each maximum value. FIG. 31C is a graph showing changes in spectral radiance of different brightness of green displayed on the fabricated functional panel, and FIG. 31D is a graph showing normalized spectral radiance, which is shown in FIG. 31C, based on each maximum value. FIG. 31E is a graph showing changes in spectral radiance of different brightness of red displayed on the fabricated functional panel, and FIG. 31F is a graph showing normalized spectral radiance, which is shown in FIG. 31E, based on each maximum value.

FIG. 32A is a graph showing normalized spectral radiance of red displayed on the fabricated functional panel, and FIG. 32B is an enlarged graph of part of FIG. 32A. FIG. 32C is a graph showing normalized spectral radiance of green displayed on the fabricated functional panel, and FIG. 32D is an enlarged graph of part of FIG. 32C. FIG. 32E is a graph showing normalized spectral radiance of blue displayed on the fabricated functional panel, and FIG. 32F is an enlarged graph of part of FIG. 32E.

Figure 33A:
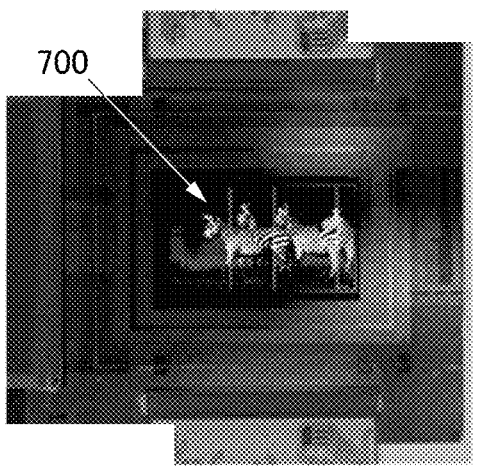
FIG. 33A and FIG. 33B are photographs of a functional panel in Example.
Figure 33B:
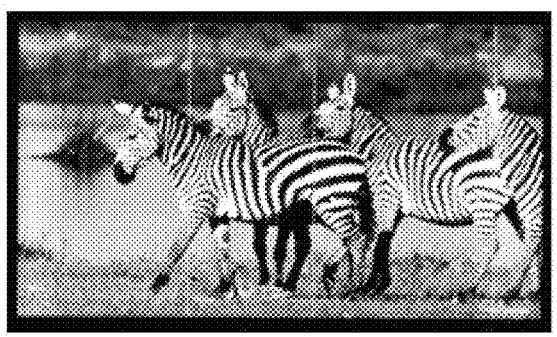
Figure 33C:
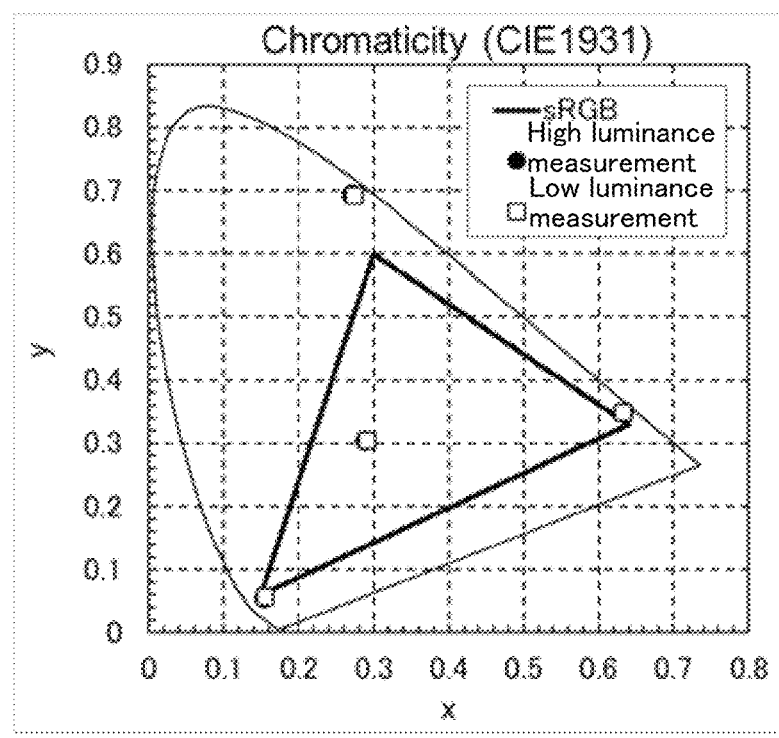
FIG. 33C is a graph showing characteristics of the functional panel in Example.

FIG. 33A is a photograph of an external view of the fabricated functional panel, and FIG. 33B is a photograph showing a display result. FIG. 33C is a chromaticity diagram showing display performance of the fabricated functional panel.

Structure Example 4 of Functional Panel

The functional panel described in this example includes a base material 510S and the insulating film 573 (see FIG. 29A). The element 550R($i,j$), the element 550B($i,j$), the element 550G($i,j$), and an element 550R(i,j+1) are provided between the base material 510S and the insulating film 573.

The functional panel includes a base film CFP and the sealant 705, and a coloring film B-CF, a coloring film G-CF, and a coloring film R-CF are provided between the base film CFP and the sealant 705. Note that the base film CFP includes a region interposed between the insulating film 573 and the coloring film B-CF.

The coloring film B-CF includes a region overlapping with the element 550B($i,j$) and includes opening portions in a position overlapping with the element 550R($i,j$) and in a position overlapping with the element 550G($i,j$).

The coloring film G-CF includes a region overlapping with the element 550G($i,j$) and includes opening portions in a position overlapping with the element 550R($i,j$) and in a position overlapping with the element 550B($i,j$).

The coloring film R-CF includes a region overlapping with the element 550R($i,j$) and includes opening portions in a position overlapping with the element 550B($i,j$) and in a position overlapping with the element 550G($i,j$).

The coloring film R-CF includes a region overlapping with the coloring film B-CF, and the region where the coloring film R-CF and the coloring film B-CF overlap with each other overlaps not only with a gap between the element 550R($i,j$) and the element 550B($i,j$) but also with a gap between the element 550B($i,j$) and the element 550G($i,j$).

Note that the element 550G($i,j$) includes the electrode 551G($i,j$), the electrode 552, and the layer 553 containing a light-emitting material, and the layer 553 containing a light-emitting material includes a region interposed between the electrode 551G($i,j$) and the electrode 552 (see FIG. 29B). The functional panel includes the reflective film 554G($i,j$), and the electrode 551G($i,j$) is interposed between a region of the reflective film 554G($i,j$) and the layer 553 containing a light-emitting material.

<<Formation Method of Functional Panel>>

The functional panel of this example was fabricated by a method including ten steps described below.

[First Step]

In a first step, a functional layer including a transistor and the like was formed (see FIG. 30A (ST1)).

[Second Step]

In a second step, a light-emitting element was formed (see FIG. 30A (ST2)).

[Third Step]

In a third step, the insulating film 573 was formed (see FIG. 30A (ST3)).

[Fourth Step]

In a fourth step, the base film CFP was formed (see FIG. 30A (ST4)).

[Fifth Step]

In a fifth step, the coloring film B-CF was formed (see FIG. 30A (ST5)).

[Sixth Step]

In a sixth step, the coloring film G-CF was formed (see FIG. 30A (ST6)).

[Seventh Step]

In a seventh step, the coloring film R-CF was formed (see FIG. 30A (ST7)).

[Eighth Step]

In an eighth step, another coloring film R-CF was formed overlapping with the coloring film R-CF (see FIG. 30A (ST8)).

[Ninth Step]

In a ninth step, the base material 770 and the coloring film R-CF were bonded to each other using the sealant 705 (see FIG. 30A (ST9)).

[Tenth Step]

In a tenth step, one functional panel was separated from other functional panels (see FIG. 30A (ST10)).

<Evaluation Result>

From the transmittance of the coloring film B-CF and the transmittance of the coloring film G-CF, the transmittance of a region where the coloring film B-CF overlaps with the coloring film G-CF was calculated. The result is shown with the use of a reference numeral (B-CF\G-CF) (see FIG. 30B).

From the transmittance of the coloring film G-CF and the transmittance of the coloring film R-CF, the transmittance of a region where the coloring film G-CF overlaps with the coloring film R-CF was calculated. The result is shown with the use of a reference numeral (G-CF\R-CF) (see FIG. 30B).

From the transmittance of the coloring film B-CF and the transmittance of the coloring film R-CF, the transmittance of a region where the coloring film B-CF overlaps with the coloring film R-CF was calculated. The result is shown with the use of a reference numeral (B-CF\R-CF) (see FIG. 30B). Thus, a structure in which the coloring film B-CF and the coloring film R-CF overlap with each other can be suitably used for a light-blocking layer provided between pixels.

<<Red, Green, and Blue Display Results>>

With the use of the fabricated functional panel, blue was displayed at different luminance from 1 cd/m$^2$ to 181 cd/m$^2$ (see FIG. 31A). As a result, regardless of the display brightness, there was no change in shapes of the normalized spectral radiance curves (see FIG. 31B).

With the use of the fabricated functional panel, green was displayed at different luminance from 1 cd/m$^2$ to 1824 cd/m$^2$ (see FIG. 31C). As a result, regardless of the display brightness, there was no change in shapes of the normalized spectral radiance curves (see FIG. 31D).

With the use of the fabricated functional panel, red was displayed at different luminance from 1 cd/m$^2$ to 473 cd/m$^2$ (see FIG. 31E). As a result, regardless of the display brightness, there was no change in shapes of the normalized spectral radiance curves (see FIG. 31F).

The fabricated functional panel includes a region where the coloring film R-CF overlaps with the coloring film B-CF, and the region where the coloring film R-CF and the coloring film B-CF overlap with each other overlaps not only with a gap between the element 550R(i,j) and the element 550B(i,j) but also with a gap between the element 550B(i,j) and the element 550G(i,j). Light emitted by the functional panel with such a structure has an emission spectrum represented by a solid line in each graph (see FIG. 32A to FIG. 32F).

Meanwhile, light emitted by a functional panel with a structure in which the coloring film R-CF and the coloring film B-CF are not formed to overlap with each other at the position overlapping with the gap between the element 550B(i,j) and the element 550G(i,j) has an emission spectrum represented by a dashed line in each graph. The spectrum represented by the dashed line has a larger half width than the spectrum represented by the solid line. Alternatively, the spectrum represented by the dashed line has a larger bottom width of the spectrum than that by the solid line. Thus, there is a lack of color saturation.

The external view of the fabricated functional panel and the display result are shown (see FIG. 33A and FIG. 33B). A high-resolution image was able to be displayed.

The chromaticity of the fabricated functional panel was measured using the spectroradiometer (manufactured by TOPCON TECHNOHOUSE CORPORATION: SR-UL1R). The result is shown by plotting chromaticities on an xy chromaticity diagram (Chromaticity) (CIE1931) (see FIG. 33C). Note that a triangle on the chromaticity diagram corresponds to an sRGB color space.

<<White Display Result>>

White display was performed using the fabricated functional panel with a luminance of 204 cd/m$^2$ or a luminance of 2203.4 cd/m$^2$. Note that the displayed white color has a chromaticity x of 0.288 and chromaticity y of 0.304. Even when the luminance was changed, a change in the chromaticity was extremely small.

<<Red, Green, and Blue Display Results>>

A condition for displaying white with a luminance of 204 cd/m$^2$ and a condition for displaying white with a luminance of 2203.4 cd/m$^2$ were set, and only red, only green, or only blue was displayed in each condition. Table 4 shows the sRGB coverage and the sRGB area ratio. Even when the luminance was changed, a change in the chromaticity was extremely small.

TABLE 4

|  | sRGB coverage | sRGB area ratio |
| --- | --- | --- |
| High luminance | 95.9% | 121.2% |
| Low luminance | 95.4% | 119.8% |

Example 5

In this example, a structure of a light-emitting element 1 included in the functional panel of one embodiment of the present invention is described with reference to FIG. 34 to FIG. 38.

Figure 34:
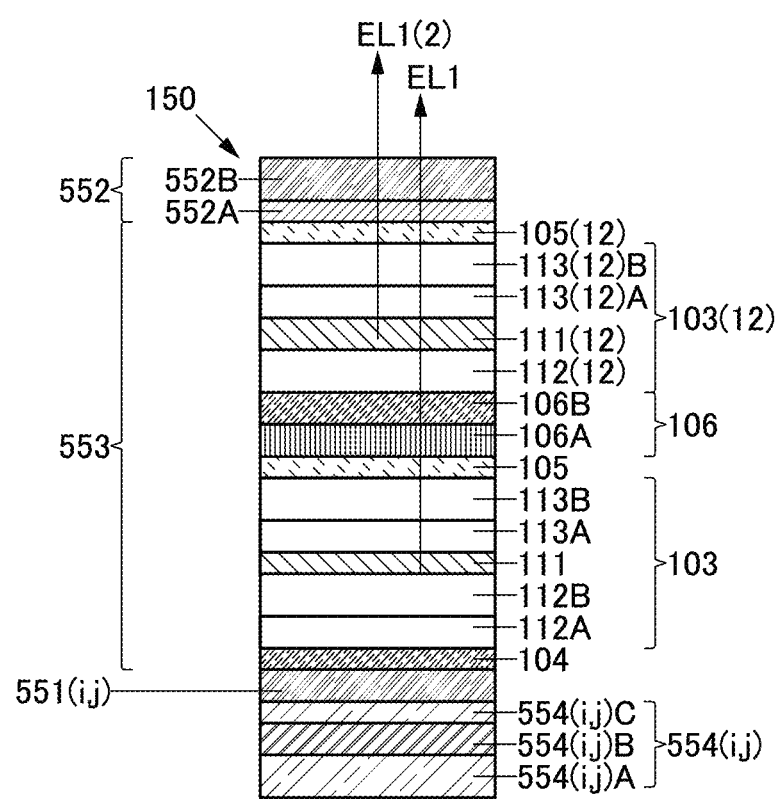
FIG. 34 is a diagram illustrating a structure of a light-emitting element in Example.

FIG. 34 is a diagram illustrating the structure of the light-emitting element 1 included in the functional panel of one embodiment of the present invention.

Figure 35:
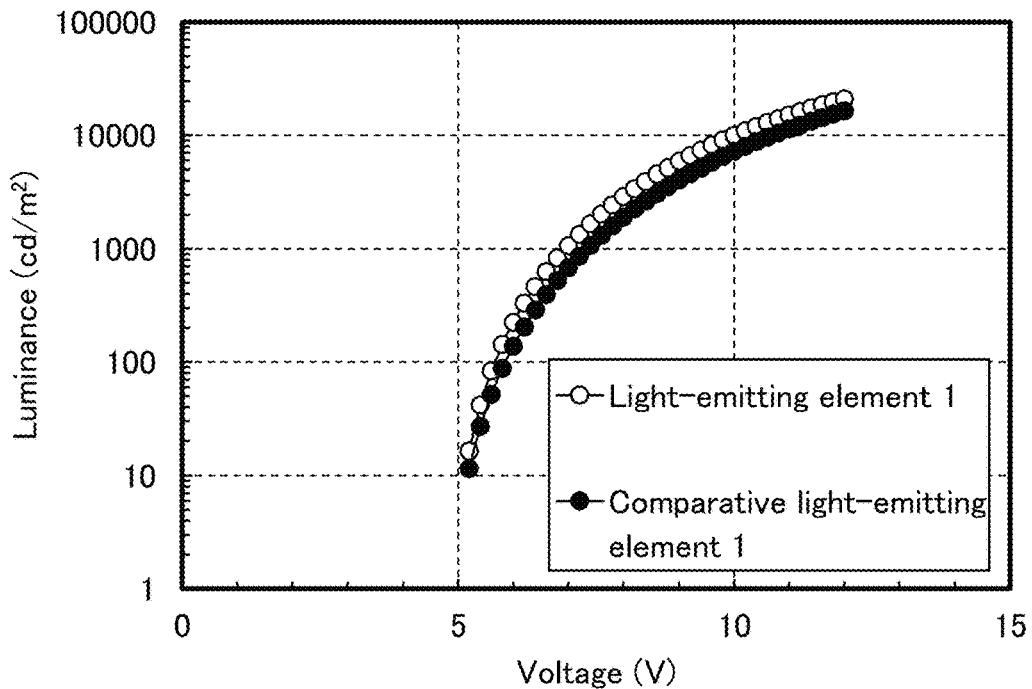
FIG. 35 is a graph showing voltage-luminance characteristics of light-emitting elements in Example.

FIG. 35 is a graph showing voltage-luminance characteristics of the light-emitting element 1 included in the functional panel of one embodiment of the present invention.

Figure 36:
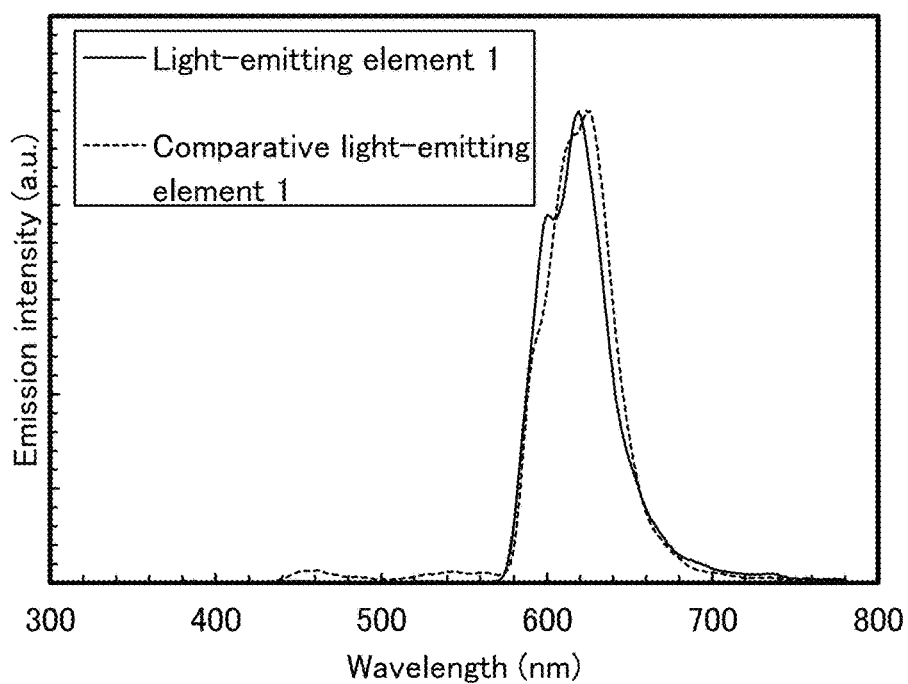
FIG. 36 is a graph showing emission spectra of light-emitting elements emitting light with a luminance of 1000 $cd/m^2$.

FIG. 36 is a graph showing an emission spectrum of the light-emitting element 1 included in the functional panel of one embodiment of the present invention emitting light with a luminance of 1000 cd/m$^2$.

Figure 37:
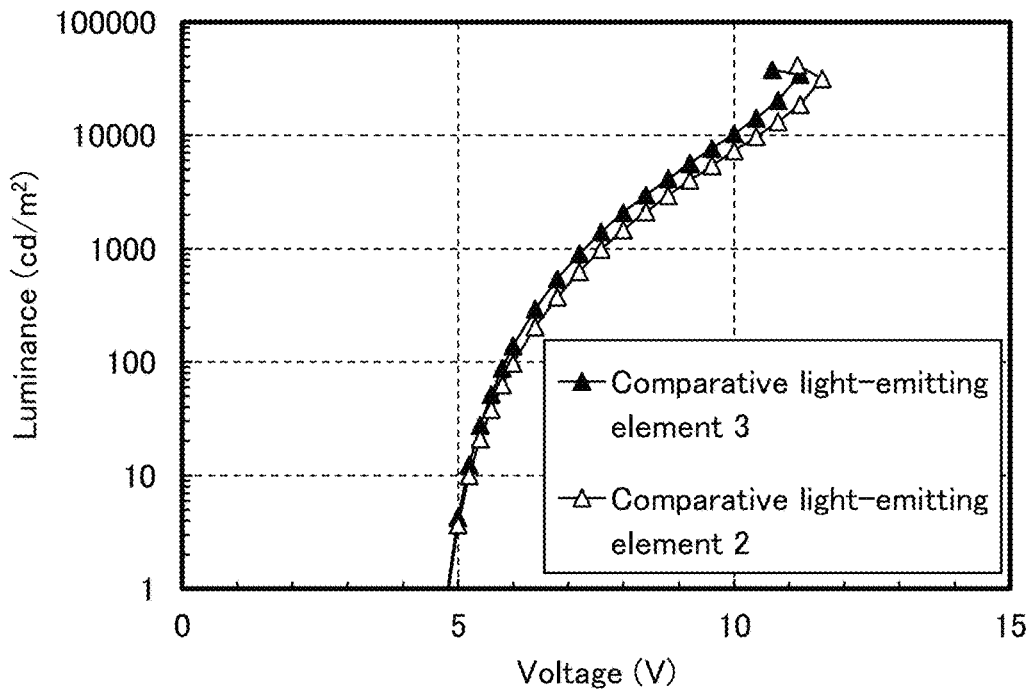
FIG. 37 is a graph showing voltage-luminance characteristics of comparative light-emitting elements in Example.

FIG. 37 is a graph showing voltage-luminance characteristics of a comparative light-emitting element 2 and a comparative light-emitting element 3.

Figure 38:
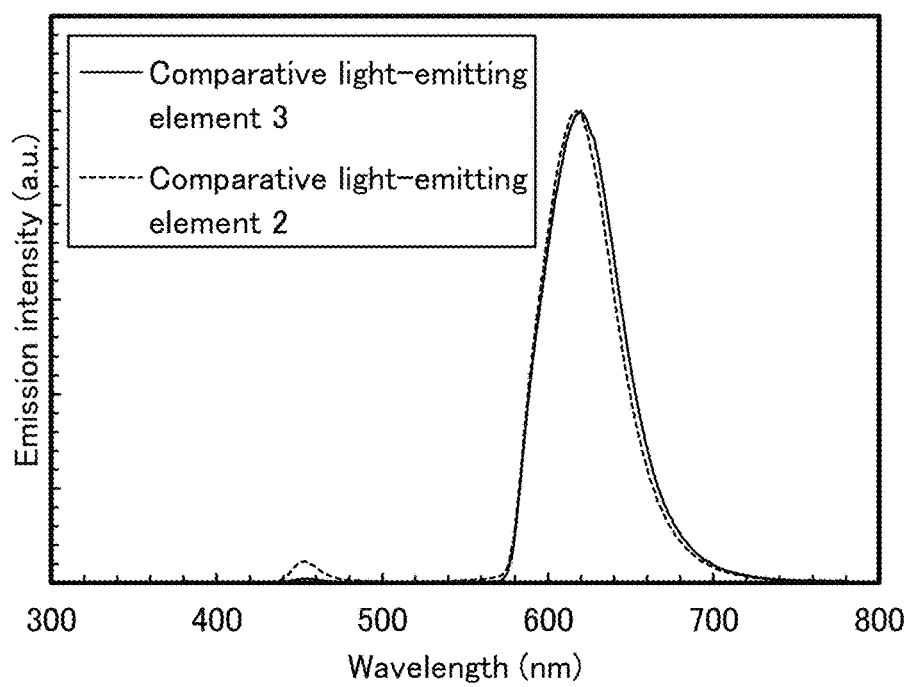
FIG. 38 is a graph showing emission spectra of the comparative light-emitting elements emitting light with a luminance of 1000 $cd/m^2$.

FIG. 38 is a graph showing emission spectra of the comparative light-emitting element 2 and the comparative light-emitting element 3 emitting light with a luminance of 1000 cd/m$^2$.

<Structure Example of Functional Panel>

The fabricated functional panel described in this example includes an element, a reflective film, and an insulating film. Specifically, the element, the reflective film, and the insulating film described in Example 3 are included.

<<Structure Example of Element>>

An element of the fabricated functional panel described in this example has a structure similar to that of a light-emitting element 150 (see FIG. 34).

The light-emitting element 150 includes an electrode 551(i,j), the electrode 552, and the layer 553 containing a light-emitting material. The layer 553 containing a light-emitting material includes a unit 103, the intermediate layer 106, and a unit 103(12). The layer 553 containing a light-emitting material includes a layer 105, and the layer 105 has a thickness larger than or equal to 0.05 nm and smaller than 0.1 nm.

<<Structure Example of Light-Emitting Element 1>>

Table 5 shows structures of the light-emitting element 1 described in this example and a comparative light-emitting element 1 described later. The structural formulae of materials used in this example are shown below.

TABLE 5

| Structure | Reference numeral | Material | Composition ratio | Thickness/nm |
|---|---|---|---|---|
| Electrode | 552B | ITO | | 70 |
| Electrode | 552A | Ag:Mg | | 25 |
| Layer | 105(12) | LiF | | 1 |
| Layer | 113(12) B | NBPhen | | 15 |
| Layer | 113(12) A | 4,6mCzP2Pm | | 25 |
| Layer | 111(12) | 8BP-4mDBtPBfpm:βNCCP:Ir(ppy)2(4dppy) | 0.5:0.5:0.1 | 40 |
| Layer | 112(12) | PCBBiF | | 15 |
| Layer | 106B | OCHD-001 | | 2.5 |
| Layer | 106A | CuPc | | 2 |
| Layer | 105 | LiOx | | X |
| Layer | 113B | NBPhen | | 10 |
| Layer | 113A | cgDBCzPA | | 15 |
| Layer | 111 | cgDBCzPA:3,10PCA2Nbf(IV)-02 | 1:0.015 | 25 |
| Layer | 112B | PCzN2 | | 10 |
| Layer | 112A | BBABnf | | 15 |
| Layer | 104 | OCHD-001 | | 1 |
| Electrode | 551(i, j) | ITSO | | 110 |
| Reflective film | 554(i, j) C | Ti | | 6 |
| Reflective film | 554(i, j) B | Al | | 180 |
| Reflective film | 554(i, j) A | Ti | | 50 |

[Chemical Formula 1]

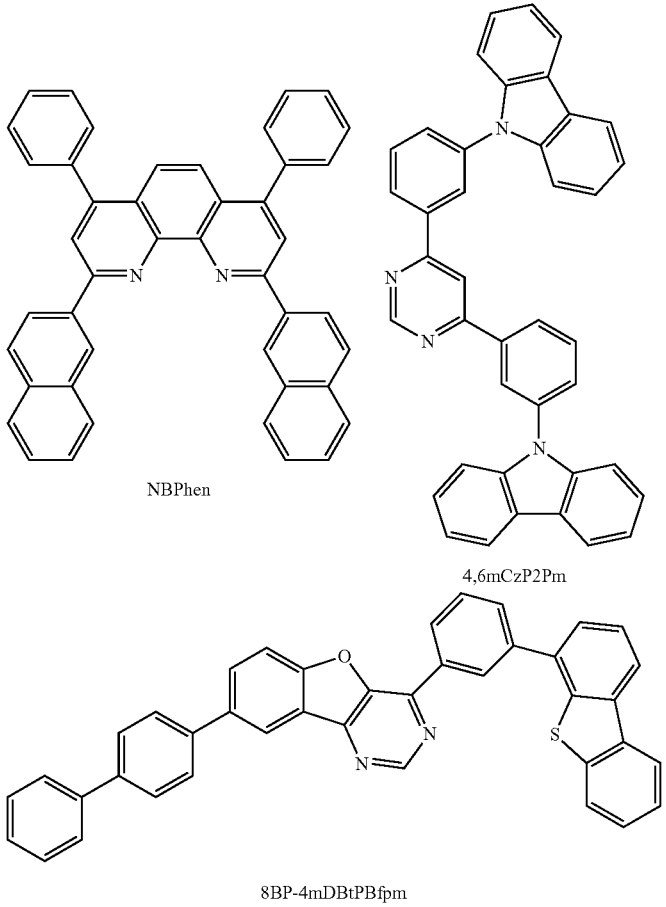

NBPhen 4,6mCzP2Pm

8BP-4mDBtPBfpm

-continued
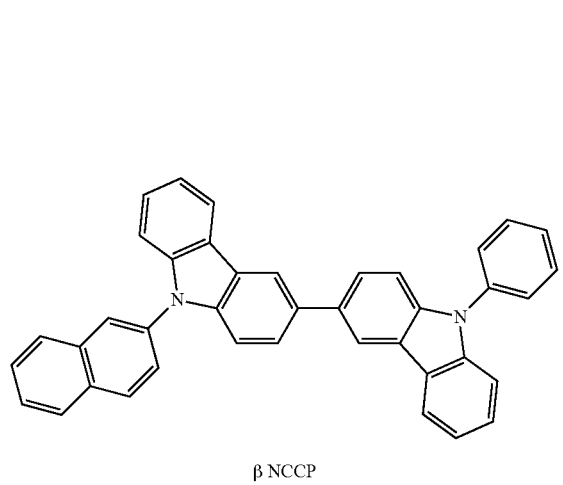
βNCCP
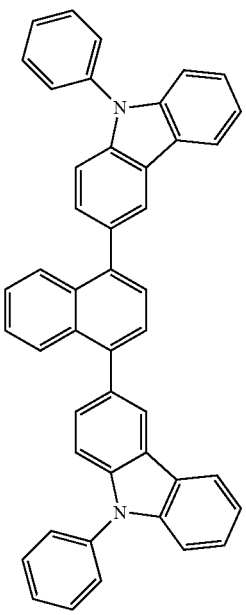
PCzN2
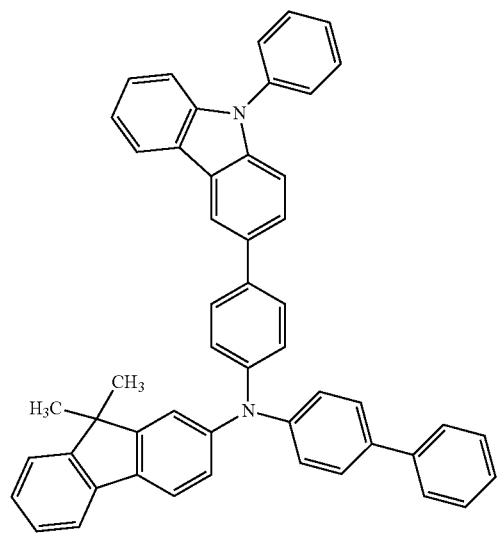
PCBBiF
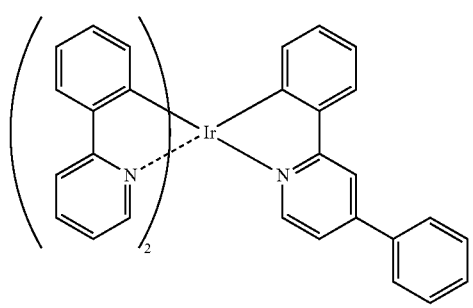
Ir(ppy)2(4dppy)

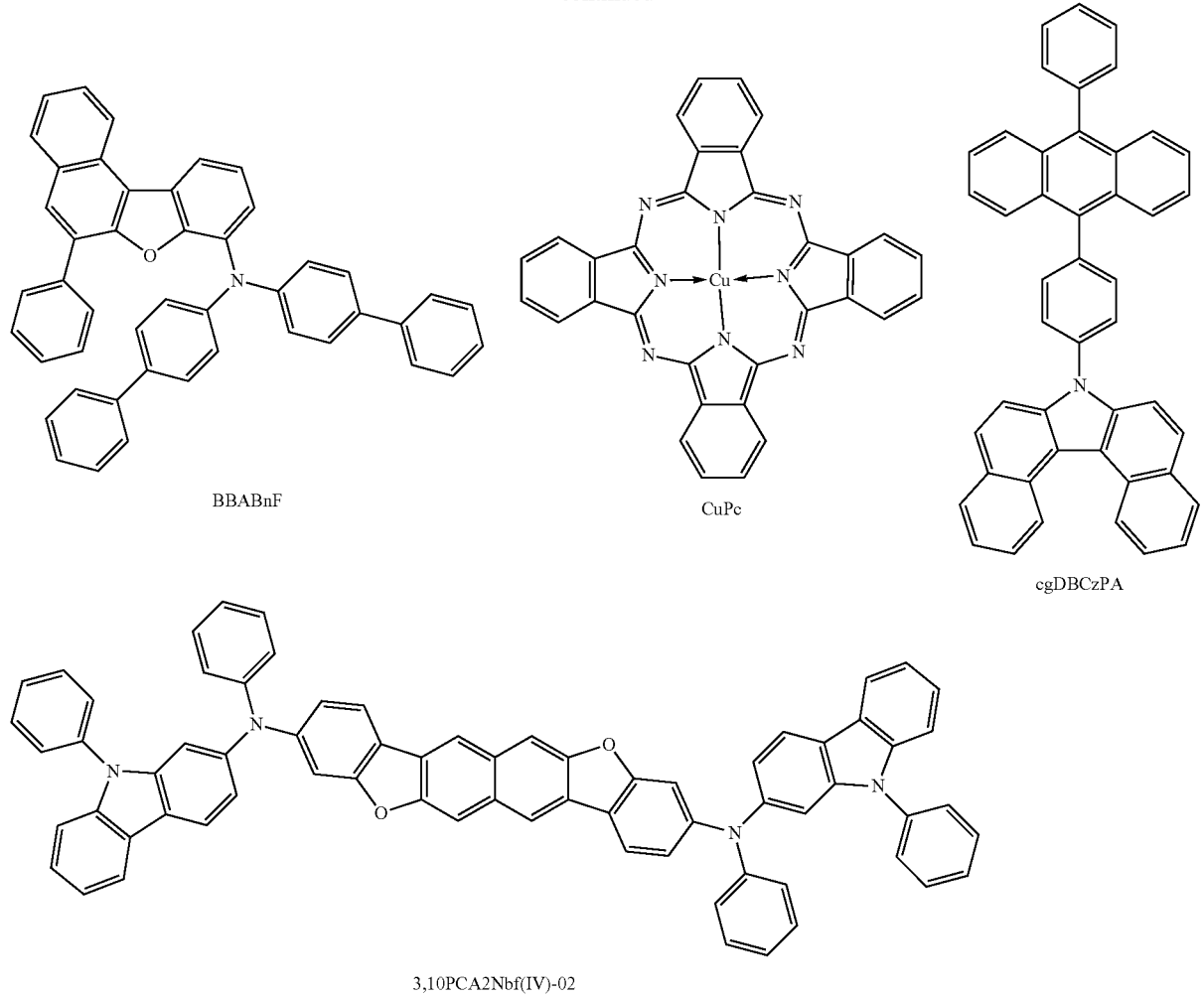

BBABnF

CuPc cgDBCzPA 3,10PCA2Nbf(IV)-02

<<Fabrication Method of Light-Emitting Element 1>>

The light-emitting element 1 described in this example was fabricated using a method including the following steps.

[First Step]

In a first step, a reflective film 554(i,j) was formed. Specifically, the reflective film 554(i,j) was formed by a sputtering method using titanium as a target.

Note that the reflective film 554(i,j)A contains Ti and has a thickness of 50 nm.

[Second Step]

In a second step, a reflective film 554(i,j)B was formed over the reflective film 554(i,j)A. Specifically, the reflective film 554(i,j)B was formed by a sputtering method using aluminum as a target.

Note that the reflective film 554(i,j)B contains Al and has a thickness of 180 nm.

[Third Step]

In a third step, a reflective film 554(i,j)C was formed over the reflective film 554(i,j)B. Specifically, the reflective film 554(i,j)C was formed by a sputtering method using titanium as a target.

Note that the reflective film 554(i,j)C contains Ti and has a thickness of 6 nm.

[Fourth Step]

In a fourth step, the electrode 551(i,j) was formed over the reflective film 554(i,j)C. Specifically, the electrode 551(i,j) was formed by a sputtering method using indium oxide-tin oxide containing silicon or silicon oxide (abbreviation: ITSO) as a target.

Note that the electrode 551(i,j) contains ITSO and has a thickness of 110 nm and an area of 7.65 μm² (1.15 μm×6.65 μm).

Next, a base material over which the electrode 551(i,j) was formed was washed with water, baked at 200° C. for an hour, and then subjected to UV ozone treatment for 370 seconds. Then, the substrate was transferred into a vacuum evaporation apparatus where the pressure was reduced to approximately $10^{-4}$ Pa, and vacuum baking was performed at 170° C. for 30 minutes in a heating chamber of the vacuum evaporation apparatus. Then, the substrate was cooled down for approximately 30 minutes.

[Fifth Step]

In a fifth step, a layer 104 was formed over the electrode 551(i,j). Specifically, a material was deposited by a resistance-heating method.

Note that the layer 104 contains an electron accepter material (OCHD-001) and has a thickness of 1 nm.

[Sixth Step]

In a sixth step, a layer 112A was formed over the layer 104. Specifically, a material was deposited by a resistance-heating method.

Note that the layer 112A contains N,N-bis(4-biphenyl)-6-phenylbenzo[b]naphtho[1,2-d]furan-8-amine (abbreviation: BBABnf) and has a thickness of 15 nm.
[Seventh Step]

In a seventh step, a layer 112B was formed over the layer 112A. Specifically, a material was deposited by a resistance-heating method.

Note that the layer 112B contains PCzN2 and has a thickness of 10 nm.
[Eighth Step]

In an eighth step, a layer 111 was formed over the layer 112B. Specifically, materials were co-deposited by a resistance-heating method.

Note that the layer 111 contains 7-[4-(10-phenyl-9-anthryl)phenyl]-7H-dibenzo[c,g] carbazole (abbreviation: cgDBCzPA) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) at a weight ratio that is cgDBCzPA:3,10PCA2Nbf(IV)-02=1:0.015 and has a thickness of 25 nm.
[Ninth Step]

In a ninth step, a layer 113A was formed over the layer 111. Specifically, a material was deposited by a resistance-heating method.

Note that the layer 113A contains cgDBCzPA and has a thickness of 15 nm.
[Tenth Step]

In a tenth step, a layer 113B was formed over the layer 113A. Specifically, a material was deposited by a resistance-heating method.

The layer 113B contains 2,9-bis(naphthalen-2-yl)-4,7-diphenyl-1,10-phenanthroline (abbreviation: NBPhen) and has a thickness of 10 nm.
[Eleventh Step]

In an eleventh step, the layer 105 was formed over the layer 113B. Specifically, a material was deposited by a resistance-heating method.

Note that the layer 105 contains lithium oxide (abbreviation: LiOx) and has a thickness of 0.05 nm.
[Twelfth Step]

In a twelfth step, a layer 106A was formed over the layer 105. Specifically, a material was deposited by a resistance-heating method.

Note that the layer 106A contains copper phthalocyanine (abbreviation: CuPc) and has a thickness of 2 nm.
[Thirteenth Step]

In a thirteenth step, a layer 106B was formed over the layer 106A. Specifically, a material was deposited by a resistance-heating method.

Note that the layer 106B contains an electron acceptor material (OCHD-001) and has a thickness of 2.5 nm.
[Fourteenth Step]

In a fourteenth step, a layer 112(12) was formed over the layer 106B. Specifically, a material was deposited by a resistance-heating method.

The layer 112(12) contains N-(1,1'-biphenyl-4-yl)-9,9-dimethyl-N-[4-(9-phenyl-9H-carbazol-3-yl)phenyl]-9H-fluoren-2-amine (abbreviation: PCBBiF) and has a thickness of 15 nm.
[Fifteenth Step]

In a fifteenth step, a layer 111(12) was formed over the layer 112(12). Specifically, materials were co-deposited by a resistance-heating method.

The layer 111(12) contains 8-(1,1'-biphenyl-4-yl)-4-[3-(dibenzothiophen-4-yl)phenyl]-[1][1]benzofuro[3,2-d]pyrimidine (abbreviation: 8BP-4mDBtPBfpm), 9-(2-naphthyl)-9'-phenyl-9H,9'H-3,3'-bicarbazole (abbreviation: βNCCP), and bis[2-(2-pyridinyl-κN2)phenyl-κC][2-(5-phenyl-2-pyridinyl-κN2)phenyl-κC]iridium(III) (abbreviation: [Ir(ppy)$_2$(4dppy)]) at a weight ratio that is 8BP-4mDBtPBfpm:βNCCP:Ir(ppy)$_2$(4dppy)=0.5:0.5:0.1 and has a thickness of 40 nm.
[Sixteenth Step]

In a sixteenth step, a layer 113(12)A was formed over the layer 111(12). Specifically, a material was deposited by a resistance-heating method.

Note that the layer 113(12)A contains 9,9'-(pyrimidine-4,6-diyldi-3,1-phenylene)bis(9H-carbazole) (abbreviation: 4,6mCzP2Pm) and has a thickness of 25 nm.
[Seventeenth Step]

In a seventeenth step, a layer 113(12)B was formed over the layer 113(12)A. Specifically, a material was deposited by a resistance-heating method.

Note that the layer 113(12)B contains NBPhen and has a thickness of 15 nm.
[Eighteenth Step]

In an eighteenth step, a layer 105(12) was formed over the layer 113(12)B. Specifically, a material was deposited by a resistance-heating method.

Note that the layer 105(12) contains lithium fluoride (abbreviation: LiF) and has a thickness of 1 nm.
[Nineteenth Step]

In a nineteenth step, an electrode 552A was formed over the layer 105(12). Specifically, materials were co-deposited by a resistance-heating method.

Note that the electrode 552A contains Ag and Mg at Ag:Mg=1:0.1 (weight ratio) and has a thickness of 25 nm.
[Twentieth Step]

In a twentieth step, an electrode 552B was formed over the electrode 552A. Specifically, the electrode 552B was formed by a sputtering method using indium oxide-tin oxide (abbreviation: ITO) as a target.

Note that the electrode 552B contains ITO and has a thickness of 70 nm.

<<Operation Characteristics of Light-Emitting Element 1>>

The light-emitting element 1 emitted light when electric power was supplied (see FIG. 34). Note that the light emitted by the light-emitting element 1 includes light EL1 and light EL1(2). Operation characteristics of the light-emitting element 1 were measured (see FIG. 35 and FIG. 36). Note that the measurement was performed at room temperature.

Table 6 shows main initial characteristics of the light-emitting element 1 emitting light with a luminance of approximately 1000 cd/m$^2$ (initial characteristics of other comparative light-emitting elements are also shown in Table 6, and their structures will be described later).

TABLE 6

|  | Voltage (V) | Chromaticity X | Chromaticity y |
| --- | --- | --- | --- |
| Light-emitting element 1 | 7.0 | 0.65 | 0.35 |
| Comparative light-emitting element 1 | 7.4 | 0.64 | 0.34 |
| Comparative light-emitting element 2 | 7.6 | 0.64 | 0.34 |
| Comparative light-emitting element 3 | 7.2 | 0.66 | 0.34 |

The light-emitting element 1 was found to have favorable characteristics. For example, the light-emitting element 1 was able to obtain the same luminance as the comparative light-emitting element 1 at a lower driving voltage than that of the comparative light-emitting element 1. Note that in the light-emitting element 1, the layer 105 was formed to correspond to a thickness of 0.05 nm, and in the comparative light-emitting element 1, the layer 105 was formed to correspond to a thickness of 0.1 nm. In the case of the comparative light-emitting element having the electrode 551(i,j) with an area of 7.65 μm² (1.15 μm×6.63 μm), the result was such that for the layer 105, the thickness corresponds to 0.05 nm is preferable than the thickness corresponds to 0.1 nm. Consequently, the driving voltage was able to be lowered. As a result, a novel functional panel that is highly convenient, useful, or reliable was able to be provided.

Reference Example 1

Table 5 shows a structure of the comparative light-emitting element 1.

The fabricated comparative light-emitting element 1 described in this example is different from the light-emitting element 1 in that the layer 105 has a thickness of 0.1 nm.

<<Fabrication Method of Comparative Light-Emitting Element 1>>

The comparative light-emitting element 1 was fabricated using a method including the following steps.

Note that the fabrication method of the comparative light-emitting element 1 is different from the fabrication method of the light-emitting element 1 in that a thickness of 0.1 nm is employed instead of a thickness of 0.05 nm in the step of forming the layer 105. Different portions are described in detail here, and the above description is referred to for portions that formed by a similar method.

[Eleventh Step]

In the eleventh step, the layer 105 was formed over the layer 113B. Specifically, a material was deposited by a resistance-heating method.

Note that the layer 105 contains LiOx and has a thickness of 0.1 nm.

Reference Example 2

Table 7 shows structures of the comparative light-emitting element 2 and the comparative light-emitting element 3.

<<Fabrication Method of Comparative Light-Emitting Element 2>>

The comparative light-emitting element 2 was fabricated using a method including the following steps.

Note that the fabrication method of the comparative light-emitting element 2 is different from the fabrication method of the light-emitting element 1 in that the steps of forming the reflective film 554(i,j)A and the reflective film 554(i,j)B are omitted, a film containing APC is used instead of a film containing Ti with a thickness of 6 nm in the step of forming the reflective film 554(i,j)C, a thickness of 85 nm and an area of 4 mm² (2 mm×2 mm) are employed in the step of forming the electrode 551(i,j), a thickness of 35 nm is employed instead of the thickness of 15 nm in the step of forming the layer 112A, and a thickness of 15 nm is employed instead of the thickness of 25 nm in the step of forming the electrode 552A. Different portions are described in detail here, and the above description is referred to for portions that formed by a similar method.

[First Step to Third Step]

The first step and second step were omitted, and the reflective film 554(i,j)C was formed in the third step. Specifically, the reflective film 554(i,j)C was formed by a sputtering method using APC as a target.

Note that the reflective film 554(i,j)C contains APC.

[Fourth Step]

In the fourth step, the electrode 551(i,j) was formed over the reflective film 554(i,j)C. Specifically, the electrode 551(i,j) was formed by a sputtering method using indium oxide-tin oxide containing silicon or silicon oxide (ITSO) as a target.

The electrode 551(i,j) contains ITSO and has a thickness of 85 nm and an area of 4 mm² (2 mm×2 mm).

[Sixth Step]

In the sixth step, the layer 112A was formed over the layer 104. Specifically, a material was deposited by a resistance-heating method.

TABLE 7

| Structure | Reference numeral | Material | Composition ratio | Thickness/nm |
|---|---|---|---|---|
| Electrode | 552B | ITO | | 70 |
| Electrode | 552A | Ag:Mg | | 15 |
| Layer | 105(12) | LiF | | 1 |
| Layer | 113(12) B | NBPhen | | 15 |
| Layer | 113(12) A | 4,6mCzP2Pm | | 25 |
| Layer | 111(12) | 8BP-4mDBtPBfpm: βNCCP:Ir(ppy)2(4dppy) | 0.5:0.5:0.1 | 40 |
| Layer | 112(12) | PCBBiF | | 15 |
| Layer | 106B | OCHD-001 | | 3.5 |
| Layer | 106A | CuPc | | 2 |
| Layer | 105 | LiOx | | X |
| Layer | 113B | NBPhen | | 10 |
| Layer | 113A | cgDBCzPA | | 15 |
| Layer | 111 | cgDBCzPA:3,10PCA2Nbf(IV)- 02 | 1:0.015 | 25 |
| Layer | 112B | PCzN2 | | 10 |
| Layer | 112A | BBABnf | | 35 |
| Layer | 104 | OCHD-001 | | 1 |
| Electrode | 551(i, j) | ITSO | | 85 |
| Reflective film | 554(i, j) C | APC | | |

The fabricated comparative light-emitting element 2 described in this example is different from the light-emitting element 1 in that the reflective film 554(i,j)C contains an alloy containing Ag—Pd—Cu (abbreviation: APC), the electrode 551(i,j) has a thickness of 85 nm and an area of 4 mm² (2 mm×2 mm), and the layer 112A has a thickness of 35 nm.

The layer 112A contains BBABnf and has a thickness of 35 nm.

[Nineteenth Step]

In the nineteenth step, the electrode 552A was formed over the layer 105(12). Specifically, materials were co-deposited by a resistance-heating method.

Note that the electrode 552A contains Ag and Mg at Ag:Mg=1:0.1 (weight ratio) and has a thickness of 15 nm.

The fabricated comparative light-emitting element 3 described in this example is different from the light-emitting element 2 in that the layer 105 has a thickness of 0.1 nm.

<<Fabrication Method of Comparative Light-Emitting Element 3>>

The comparative light-emitting element 3 was fabricated using a method including the following steps.

Note that the fabrication method of the comparative light-emitting element 3 is different from the fabrication method of the light-emitting element 2 in that a thickness of 0.1 nm is employed instead of a thickness of 0.05 nm in the step of forming the layer 105. Different portions are described in detail here, and the above description is referred to for portions that formed by a similar method.

[Eleventh Step]

In the eleventh step, the layer 105 was formed over the layer 113B. Specifically, a material was deposited by a resistance-heating method.

Note that the layer 105 contains LiOx and has a thickness of 0.1 nm.

<<Operation Characteristics of Comparative Light-Emitting Element 1 to Comparative Light-Emitting Element 3>>

Operation characteristics of the comparative light-emitting element 1 to the comparative light-emitting element 3 were measured (see FIG. 37 and FIG. 38). Note that the measurement was performed at room temperature.

Table 6 shows main initial characteristics of the comparative light-emitting element 1 to the comparative light-emitting element 3.

Note that the comparative light-emitting element 3 was able to obtain the same luminance as the comparative light-emitting element 2 at a lower driving voltage than that of the comparative light-emitting element 2. The layer 105 in the comparative light-emitting element 3 has a thickness of 0.05 nm, and the layer 105 in the comparative light-emitting element 2 has a thickness of 0.1 nm. In the case of the comparative light-emitting element including the electrode 551($i,j$) having an area of 4 mm$^2$ (2 mm×2 mm), the result was such that a thickness of 0.1 nm is preferable than a thickness of 0.05 nm for the layer 105.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load).

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (e.g., a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope.

As another expression, it can be expressed as "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2". Alternatively, the expression "a source (or a first terminal or the like) of a transistor is electrically connected to X by at least a first connection path through Z1, the first connection path does not include a second connection path, the second connection path includes a connection path through the transistor, a drain (or a second terminal or the like) of the transistor is electrically connected to Y by at least a third connection path through Z2, and the third connection path does not include the second connection path" can also be used. Alternatively, it can be expressed as "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

30: object, 103: unit, 104: layer, 105: layer, 106: intermediate layer, 106A: layer, 106B: layer, 106N: portion, 111: layer, 112: layer, 112A: layer, 112B: layer, 113: layer, 113A: layer, 113B: layer, 150: light-emitting element, 200: data processing device, 210: arithmetic device, 211: arithmetic portion, 212: memory portion, 213: artificial intelligence portion, 214: transmission path, 215: input/output interface, 220: input/output device, 2203: luminance, 230: display portion, 231: region, 233: timing controller, 234: decompression circuit, 235: image processing circuit, 238: control portion, 240: input portion, 241: sensing region, 243: control circuit, 250: sensing portion, 290: communication portion, 300: transistor, 305: conductor, 305a: conductor, 305b: conductor, 305c: conductor, 312: insulator, 314: insulator, 316: insulator, 322: insulator, 324: insulator, 330: oxide, 330a: oxide, 330b: oxide, 340: conductor, 340a: conductor, 340b: conductor, 341: insulator, 341a: insulator, 341b: insulator, 342: conductor, 342a: conductor, 342b: conductor, 343: oxide, 343a: oxide, 343b: oxide, 346: conductor, 346a: conductor, 346b: conductor, 350: insulator, 350a: insulator, 350b: insulator, 360: conductor, 360a: conductor, 360b: conductor, 371: insulator, 371a: insulator, 371b: insulator, 375: insulator, 380: insulator, 382: insulator, 383: insulator, 385: insulator, 501: insulating film, 501A: insulating film, 501B: insulating film, 501C: insulating film, 501D: insulating film, 504: conductive film, 506: insulating film, 507A: conductive film, 507B: conductive film, 508: semiconductor film, 508A: region, 508B: region, 508C: region, 510: base material, 510S: base material, 512A: conductive film, 512B: conductive film, 516: insulating film, 516A: insulating film, 516B: insulating film, 518: insulating film, 519B: terminal, 520: functional layer, 520B: functional layer, 521: insulating film, 5210: arithmetic device, 521A: insulating film, 521B: insulating film, 522B: insulating film, 522G: insulating film, 524: conductive film, 528: insulating film, 528D: step, 528h: opening portion, 5290: communication portion, 530G: pixel circuit, 530S: pixel circuit, 550B: element, 550G: element, 550R: element, 550S: element, 551: electrode, 551B: electrode, 551G: electrode, 551R: electrode, 551S: electrode, 552: electrode, 552A: electrode, 552B: electrode, 553: layer, 553S: layer, 554: reflective film, 554B: reflective film, 554G: reflective film, 554R: reflective film, 573: insulating film, 573A: insulating film, 573B: insulating film, 591G: opening portion, 591S: opening portion, 700: functional panel, 700TP: functional panel, 702B: pixel, 702G: pixel, 702R: pixel, 702S: pixel, 703: pixel, 705: sealant, 720: functional layer, 770: base material, 770P: functional film, 771: insulating film, 802: sensor, 1504: conductive film, 1506: insulating film, 1508: semiconductor, 1508A: region, 1508B: region, 1508C: region, 1512A: conductive film, 1512B: conductive film, 5200B: data processing device, 5220: input/output device, 5230: display portion, 5240: input portion, 5250: sensing portion, ADC: analog-digital converter circuit, AMP: amplifier circuit, ANO: conductive film, BM: light-blocking film, C21: capacitor, C22: capacitor, C31: capacitor, CAPSEL: conductive film, CDSBIAS: conductive film, CDSVDD: conductive film, CDSVSS: conductive film, CF: coloring film, CFP: base film, CI: control data, CL: conductive film, CP: conductive material, DC: sensing circuit, DS: sensing data, EL1: light, EL1(2): light, FD: node, FI: image, FP: fingerprint, FPC1: flexible printed circuit, G1: conductive film, G2: conductive film, GCLK: signal, GD: driver circuit, GDA: driver circuit, GDB: driver circuit, GDC: driver circuit, II: input data, IN: terminal, IND: index image, KB: structure body, KBM: light-blocking film, M21: transistor, M31: transistor, M32: transistor, MD: transistor, MD2: transistor, ML: wiring, MUX: multiplexer, N21: node, N22: node, NP: navigation panel, NS: node, OSC: oscillation circuit, OUT: terminal, P1: position data, PWC1: signal, PWC2: signal, RC: reading circuit, RD: driver circuit, RS: conductive film, S1g: conductive film, S2g: conductive film, SC: sampling circuit, SCT1: cross-sectional shape, SCT2: cross-sectional shape, SD: driver circuit, SE: conductive film, SH: region, SW21: switch, SW22: switch, SW23: switch, SW31: switch, SW32: switch, SW33: switch, T1: thickness, T2: thickness, T3: thickness, T4: thickness, THM: finger, TN: thumbnail image, TX: conductive film, V0: conductive film, VCL: conductive film, VCOM2: conductive film, VCP: conductive film, VI: image data, VIV: conductive film, VLEN: conductive film, VPD: conductive film, VPI: conductive film, VR: conductive film, WX: conductive film

The invention claimed is:

1. A functional panel comprising:
a first element comprising a first reflective film;
a second element comprising a second reflective film; and
an insulating film,
wherein the first element further comprises a first electrode, a second electrode, and a layer containing a light-emitting material,
wherein the insulating film is located over a portion of the first reflective film and a portion of the first electrode,
wherein the layer containing the light-emitting material comprises a region interposed between the first electrode and the second electrode,
wherein the first electrode has a light-transmitting property,
wherein the first electrode has a first thickness,
wherein the first electrode is interposed between a region of the first reflective film and the layer containing the light-emitting material,
wherein the first reflective film has a second thickness,
wherein the insulating film comprises a first opening portion,
wherein the first opening portion overlaps with the first electrode,
wherein the insulating film has a first step-like cross-sectional shape,
wherein the first step-like cross-sectional shape surrounds the first opening portion when seen from above,
wherein the first step-like cross-sectional shape comprises a first step,
wherein the second thickness is greater than the first thickness,
wherein the second reflective film has the second thickness, and
wherein the first reflective film comprises a region which extends beyond an end portion of the first electrode.

2. The functional panel according to claim 1,
wherein the first step-like cross-sectional shape comprises a second step and a third step in the first step,
wherein the second step is smaller than the third step, and
wherein the second step is greater than or equal to 0.5 times and less than or equal to 1.5 times the first thickness.

3. The functional panel according to claim 1,
wherein the second element comprises a third electrode, the second electrode, and the layer containing the light-emitting material,
wherein the layer containing the light-emitting material comprises a region interposed between the third electrode and the second electrode,
wherein the insulating film comprises a second opening portion,
wherein the second opening portion overlaps with the third electrode,
wherein the insulating film has a second step-like cross-sectional shape,
wherein the second step-like cross-sectional shape surrounds the second opening portion,
wherein the second step-like cross-sectional shape has a slope, and
wherein the slope is greater than or equal to 60° and less than or equal to 90° with respect to a surface of the third electrode.

4. The functional panel according to claim 3,
wherein the second step-like cross-sectional shape comprises a fourth step, and
wherein the fourth step is greater than or equal to 0.7 times and less than or equal to 1.3 times the first step.

5. The functional panel according to claim 3,
wherein the third electrode has a fourth thickness,
wherein the second step-like cross-sectional shape comprises a fifth step and a sixth step in a fourth step,
wherein the fifth step is greater than or equal to 0.5 times and less than or equal to 1.5 times the fourth thickness,
wherein the fifth step is smaller than the sixth step, and
wherein the sixth step is greater than or equal to 0.7 times and less than or equal to 1.3 times a third step.

6. The functional panel according to claim 3, comprising a pixel set,
wherein the pixel set comprises a first pixel and a second pixel,
wherein the first pixel comprises the first element and a pixel circuit,
wherein the second pixel comprises the second element, and
wherein the first element is electrically connected to the pixel circuit.

7. The functional panel according to claim 6, comprising a functional layer,
wherein the functional layer comprises the pixel circuit,
wherein the pixel circuit comprises a first transistor,
wherein the functional layer comprises a driver circuit,
wherein the driver circuit comprises a second transistor,
wherein the first transistor comprises a semiconductor film, and
wherein the second transistor comprises a semiconductor film that can be formed in a step of forming the semiconductor film.

8. The functional panel according to claim 6, comprising a region,
wherein the region comprises a group of pixel sets, a different group of pixel sets, a first conductive film, and a second conductive film, wherein the group of pixel sets is arranged in a row direction,
wherein the group of pixel sets comprises the pixel set,
wherein the group of pixel sets is electrically connected to the first conductive film,
wherein the different group of pixel sets is arranged in a column direction intersecting the row direction,
wherein the different group of pixel sets comprises the pixel set, and
wherein the different group of pixel sets is electrically connected to the second conductive film.

9. A display device comprising:
a control portion; and
the functional panel according to claim 6,
wherein the control portion is supplied with image data and control data,
wherein the control portion generates data on the basis of the image data,
wherein the control portion generates a control signal on the basis of the control data,
wherein the control portion supplies the data and the control signal,
wherein the functional panel is supplied with the data and the control signal, and
wherein the pixel set performs display on the basis of the data.

10. An input/output device comprising an input portion and a display portion,
wherein the display portion comprises the functional panel according to claim 6,
wherein the input portion comprises a sensing region,
wherein the input portion senses an object approaching the sensing region, and
wherein the sensing region comprises a region overlapping with the first pixel.

11. A data processing device comprising an arithmetic device and an input/output device,
wherein the arithmetic device is supplied with input data or sensing data,
wherein the arithmetic device generates control data and image data on the basis of the input data or the sensing data,
wherein the arithmetic device supplies the control data and the image data,
wherein the input/output device supplies the input data and the sensing data,
wherein the input/output device is supplied with the control data and the image data,
wherein the input/output device comprises a display portion, an input portion, and a sensing portion,
wherein the display portion comprises the functional panel according to claim 6,
wherein the display portion displays the image data on the basis of the control data,
wherein the input portion generates the input data, and
wherein the sensing portion generates the sensing data.

12. A data processing device comprising one or more of a keyboard, a hardware button, a pointing device, a touch sensor, an illuminance sensor, an imaging device, an audio input device, an eye-gaze input device, and an attitude detection device, and the functional panel according to claim 6.

13. The functional panel according to claim 1,
wherein the layer containing the light-emitting material comprises a first light-emitting unit, a second light-emitting unit, and an intermediate layer,
wherein the first light-emitting unit comprises a region interposed between the first electrode and the intermediate layer,
wherein the intermediate layer comprises a region interposed between the first light-emitting unit and the second light-emitting unit, and
wherein the intermediate layer has a higher conductivity than the second light-emitting unit.

14. The functional panel according to claim 1,
wherein the second element further comprises a third electrode, the second electrode, and the layer containing the light-emitting material,
wherein the layer containing the light-emitting material comprises a region interposed between the third electrode and the second electrode,
wherein the insulating film is located over a portion of the second reflective film and a portion of the third electrode,
wherein the third electrode has a third thickness,
wherein the third thickness is different from the first thickness, and
wherein the second thickness is greater than the third thickness.

15. A functional panel comprising:
a first element and a second element adjacent to the first element, each of the first element and the second element comprising:
a first reflective film; and
an insulating film,
wherein the first element comprises a first electrode, a second electrode, and a layer containing a light-emitting material,
wherein the first electrode is in contact with an upper surface of the first reflective film,
wherein the insulating film is located over a portion of the first reflective film and a portion of the first electrode,
wherein the layer containing the light-emitting material comprises a region interposed between the first electrode and the second electrode,
wherein the first electrode has a light-transmitting property,
wherein the first electrode has a first thickness,
wherein the first electrode is interposed between a region of the first reflective film and the layer containing the light-emitting material,
wherein the first reflective film has a second thickness,
wherein the insulating film comprises a first opening portion,
wherein the first opening portion overlaps with the first electrode,
wherein the insulating film has a first step-like cross-sectional shape,
wherein the first step-like cross-sectional shape surrounds the first opening portion when seen from above,
wherein the first step-like cross-sectional shape comprises a first step,
wherein the insulating film continuously exists between the first element and the second element,
wherein the second thickness is greater than the first thickness, and
wherein an end portion of the first electrode is tapered shape.

16. The functional panel according to claim 15, wherein the first reflective film comprises a region which extends beyond the end portion of the first electrode.

17. A functional panel comprising:
a first element and a second element adjacent to the first element, each of the first element and the second element comprising:
a first reflective film;
a first electrode having a light-transmitting property;
an insulating film covering an end portion of the first electrode and comprising an opening;
a layer containing a light-emitting material over the insulating film and the first electrode; and
a second electrode over the layer containing the light-emitting material,
wherein the insulating film continuously exists between the first element and the second element,
wherein, in each of the first element and the second element, the insulating film includes a first portion, a second portion and a third portion, the second portion extending over and across the end portion of the first electrode and being located between the first portion and the third portion,
wherein a thickness of the first reflective film is greater than a thickness of the first electrode, and
wherein the first reflective film comprises a region which extends beyond the end portion of the first electrode.

18. The functional panel according to claim 17, wherein, in each of the first element and the second element, a height difference of an upper surface of the insulating film between the first portion and the second portion is larger than or equal to a sum of the thickness of the first electrode and the thickness of the first reflective film.

* * * * *